(12) United States Patent
Galan Garcia et al.

(10) Patent No.: US 11,061,475 B2
(45) Date of Patent: Jul. 13, 2021

(54) VEHICLE INTERIOR COMPONENT

(71) Applicant: Shanghai Yanfeng Jinqiao Automotive Trim Systems Co. Ltd., Novi, MI (US)

(72) Inventors: Jesus Maria Galan Garcia, Dusseldorf (DE); Norbert Truxa, Dusseldorf (DE); Lucas Eyl, Wuppertal (DE); Wei-Lange Mao, Hagan (DE); Ivo Erler, Dusseldorf (DE)

(73) Assignee: SHANGHAI YANFENG JINQIAO AUTOMOTIVE TRIM SYSTEMS CO. LTD., Plymouth, MI (US)

( * ) Notice: Subject to any disclaimer, the term of this patent is extended or adjusted under 35 U.S.C. 154(b) by 322 days.

(21) Appl. No.: 16/236,191

(22) Filed: Dec. 28, 2018

(65) Prior Publication Data

US 2019/0135199 A1      May 9, 2019

Related U.S. Application Data

(63) Continuation of application No. PCT/US2017/041523, filed on Jul. 11, 2017.
(Continued)

(51) Int. Cl.
*G06F 3/01* (2006.01)
*B60R 13/02* (2006.01)
(Continued)

(52) U.S. Cl.
CPC .............. *G06F 3/016* (2013.01); *B60K 35/00* (2013.01); *B60R 13/02* (2013.01); *B60R 16/037* (2013.01);
(Continued)

(58) Field of Classification Search
CPC .......... B60R 16/037; B60R 2013/0281; B60R 13/02; B60R 2013/0287;
(Continued)

(56) References Cited

U.S. PATENT DOCUMENTS 5,095,409 A    3/1992  Dematteo et al.
5,744,210 A    4/1998  Hofmann et al.
(Continued)

FOREIGN PATENT DOCUMENTS

CN    103154862 A    6/2013
CN    102089626 B    9/2013
(Continued)

OTHER PUBLICATIONS

International Search Report and Written Opinion for International Application No. PCT/US2017/041523 dated Dec. 8, 2017, 16 pages.
(Continued)

*Primary Examiner* — Charles V Hicks
(74) *Attorney, Agent, or Firm* — Amin, Turocy & Watson, LLP

(57) ABSTRACT

A vehicle interior component configured to provide a user interface for vehicle systems is disclosed. The component may comprise a composite structure configured to provide the user interface providing a cover with an exterior surface, a sensor, a display, a functional layer and a positioning layer. The cover may comprise a layer configured to facilitate the transmission of light (e.g. light-transmissive material). The sensor may be configured to detect input from a vehicle occupant at or adjacent to the exterior surface of the cover. The display may be configured to provide illumination through the cover. The user interface may be configured for input at the cover detected by the sensor and/or output from the display presented at least partially through the cover. The composite structure may comprise a substrate and/or may be configured in a contoured shape. The functional layer may comprise a diffuser. The positioning layer may comprise a foam material and/or a spacer fabric. The cover may comprise an at least partially translucent cover; illumination
(Continued)

from the display at the exterior surface of the composite structure may comprise visible light transmitted through the functional layer and through the at least partially translucent cover. The composite structure may be coupled to at least one of a trim component, a panel, a door panel, an instrument panel, a surface, a console, a base, etc. A method of operating the user interface provided by the composite structure is also disclosed. The user interface may be coupled to a control system.

34 Claims, 40 Drawing Sheets

Related U.S. Application Data

(60) Provisional application No. 62/360,960, filed on Jul. 11, 2016.

(51) Int. Cl.
| | |
|---|---|
| B60R 16/037 | (2006.01) |
| B60K 35/00 | (2006.01) |
| G06F 3/0488 | (2013.01) |
| H03K 17/975 | (2006.01) |
| H03K 17/96 | (2006.01) |
| G06F 3/041 | (2006.01) |
| G06F 3/044 | (2006.01) |

(52) U.S. Cl.
CPC ............ *G06F 3/041* (2013.01); *G06F 3/0446* (2019.05); *G06F 3/04883* (2013.01); *H03K 17/96* (2013.01); *H03K 17/962* (2013.01); *H03K 17/975* (2013.01); *B60R 2013/0281* (2013.01); *B60R 2013/0287* (2013.01); *G06F 2203/04102* (2013.01); *G06F 2203/04808* (2013.01); *H03K 2217/960755* (2013.01); *H03K 2217/960785* (2013.01); *H03K 2217/960795* (2013.01)

(58) Field of Classification Search
CPC . G06F 2203/04102; G06F 2203/04808; G06F 3/0446; G06F 3/04883; G06F 3/041; G06F 3/016; B60K 35/00; H03K 17/96; H03K 17/962; H03K 2217/960755; H03K 2217/960795; H03K 17/975; H03K 2217/960785
See application file for complete search history.

(56) References Cited

U.S. PATENT DOCUMENTS

| | | |
|---|---|---|
| 6,214,266 B1 | 4/2001 | Millif et al. |
| 6,504,928 B1 | 1/2003 | Toyooka |
| 6,652,128 B2 | 11/2003 | Misaras |
| 6,752,946 B2 | 6/2004 | Toyooka |
| 6,774,505 B1 | 8/2004 | Wnuk |
| 6,842,288 B1 | 1/2005 | Liu et al. |
| 7,201,508 B2 | 4/2007 | Misaras |
| 7,207,686 B2 | 4/2007 | Schmidt et al. |
| 7,350,949 B2 | 4/2008 | Meinke et al. |
| 7,441,913 B2 | 10/2008 | Bayersdorfer |
| 7,447,575 B2 | 11/2008 | Goldbeck et al. |
| 7,637,631 B2 | 12/2009 | McDermott et al. |
| 7,666,497 B2 | 2/2010 | Takatsuki et al. |
| 7,862,220 B2 | 1/2011 | Cannon et al. |
| 8,032,280 B2 | 10/2011 | Shibata et al. |
| 8,236,383 B2 | 8/2012 | Gasworth et al. |
| 8,449,156 B2 | 5/2013 | Salter et al. |
| 8,449,161 B2 | 5/2013 | Igoe et al. |
| 8,775,023 B2 | 7/2014 | Frojdh et al. |
| 9,016,913 B2 | 4/2015 | Englert |
| 9,090,009 B2 | 7/2015 | Deckert et al. |
| 9,143,126 B2 | 9/2015 | Salter et al. |
| 9,354,376 B2 | 5/2016 | Englert |
| 9,440,604 B2 | 9/2016 | Graham |
| 9,459,116 B2 | 10/2016 | Waeller et al. |
| 9,531,379 B2 | 12/2016 | Dassanayake et al. |
| 9,597,825 B2 | 3/2017 | Schmidt et al. |
| 2002/0101738 A1 | 8/2002 | Misaras |
| 2003/0011315 A1 | 1/2003 | Ito et al. |
| 2004/0109096 A1 | 6/2004 | Anderson et al. |
| 2005/0165526 A1 | 7/2005 | Stam et al. |
| 2005/0276874 A1 | 12/2005 | Menaldo et al. |
| 2007/0085423 A1 | 4/2007 | Chin |
| 2008/0062147 A1 | 3/2008 | Hotelling et al. |
| 2009/0174121 A1 | 7/2009 | Hayes et al. |
| 2009/0286072 A1 | 11/2009 | Kuchler et al. |
| 2010/0045624 A1 | 2/2010 | Hisatsugu et al. |
| 2010/0095245 A1 | 4/2010 | Fino et al. |
| 2010/0133866 A1 | 6/2010 | Hipshier |
| 2010/0226539 A1 | 9/2010 | Ishii |
| 2010/0302200 A1 | 12/2010 | Netherton et al. |
| 2011/0001722 A1 | 1/2011 | Newman et al. |
| 2011/0096025 A1* | 4/2011 | Slobodin .............. G06F 3/0446 345/174 |
| 2011/0182081 A1 | 7/2011 | Oeuvrard et al. |
| 2011/0183120 A1 | 7/2011 | Sharygin et al. |
| 2011/0290038 A1 | 12/2011 | Hoshino et al. |
| 2012/0268406 A1* | 10/2012 | Trachte .............. G06F 3/0446 345/173 |
| 2012/0313857 A1 | 12/2012 | Senanayake et al. |
| 2013/0147739 A1 | 6/2013 | Aberg et al. |
| 2013/0200991 A1 | 8/2013 | Ricci et al. |
| 2013/0333922 A1 | 12/2013 | Kai et al. |
| 2014/0063433 A1* | 3/2014 | Benson ............ G02F 1/133308 349/155 |
| 2014/0309871 A1 | 10/2014 | Ricci |
| 2014/0365928 A1 | 12/2014 | Boelter et al. |
| 2015/0000425 A1 | 1/2015 | Miura et al. |
| 2015/0019083 A1 | 1/2015 | Kalliomaki et al. |
| 2015/0116810 A1* | 4/2015 | De Wind ............... B60R 1/088 359/265 |
| 2015/0185843 A1 | 7/2015 | Olien |
| 2015/0185946 A1 | 7/2015 | Fourie |
| 2015/0253966 A1* | 9/2015 | Sizelove .......... B64D 11/00155 297/411.2 |
| 2016/0004362 A1 | 1/2016 | Kring et al. |
| 2016/0075290 A1 | 3/2016 | Catlin |
| 2016/0098120 A1 | 4/2016 | Miyake |
| 2016/0109982 A1 | 4/2016 | Lee et al. |
| 2016/0193976 A1 | 7/2016 | Wild et al. |
| 2016/0329894 A1 | 11/2016 | Buschmann et al. |
| 2016/0373110 A1 | 12/2016 | Koehne et al. |
| 2017/0144344 A1 | 5/2017 | Schmidt et al. |
| 2018/0029264 A1 | 2/2018 | Sharron et al. |
| 2018/0178736 A1 | 6/2018 | Schelter |

FOREIGN PATENT DOCUMENTS

| | | |
|---|---|---|
| CN | 104067098 B | 4/2016 |
| DE | 19702977 C2 | 2/2001 |
| DE | 10118178 C2 | 5/2003 |
| DE | 10123344 B4 | 9/2005 |
| DE | 202006017445 U1 | 8/2007 |
| DE | 202007015946 U1 | 4/2008 |
| DE | 102013003659 A1 | 9/2014 |
| EP | 1314612 B1 | 1/2007 |
| EP | 2305508 B1 | 2/2012 |
| EP | 2099950 B1 | 5/2012 |
| EP | 2269797 B1 | 11/2013 |
| EP | 2793111 A1 | 10/2014 |
| EP | 3053778 A1 | 8/2016 |
| EP | 2816334 B1 | 4/2017 |
| EP | 2684744 B1 | 5/2018 |
| EP | 3100915 B1 | 1/2019 |
| EP | 3303063 B1 | 3/2019 |
| FR | 2540441 A1 | 8/1984 |
| FR | 2803791 B1 | 7/2002 |
| FR | 2931746 B1 | 7/2010 |

(56) References Cited

FOREIGN PATENT DOCUMENTS

| | | |
|---|---|---|
| GB | 2408246 B | 5/2006 |
| JP | 200248658 A | 2/2002 |
| JP | 2013164365 A | 8/2013 |
| JP | WO2012/147948 A1 | 7/2014 |
| WO | 2008/061786 A1 | 5/2008 |
| WO | 2013/088559 A1 | 6/2013 |
| WO | 2013/122038 A1 | 8/2013 |
| WO | 2015/001496 | 1/2015 |
| WO | 2015/001496 A1 | 1/2015 |
| WO | 2015001496 A1 | 1/2015 |
| WO | 2015/023668 | 2/2015 |
| WO | 2015023668 A1 | 2/2015 |
| WO | 2016/120287 A1 | 8/2016 |

OTHER PUBLICATIONS

Extended European Search Report for European Application No. 17828299.2 dated Dec. 19, 2019, 10 pages.
EP Communication Pursuant to Article 94(3) dated Apr. 18, 2021, EP 17828299.2, 6 pages.

\* cited by examiner

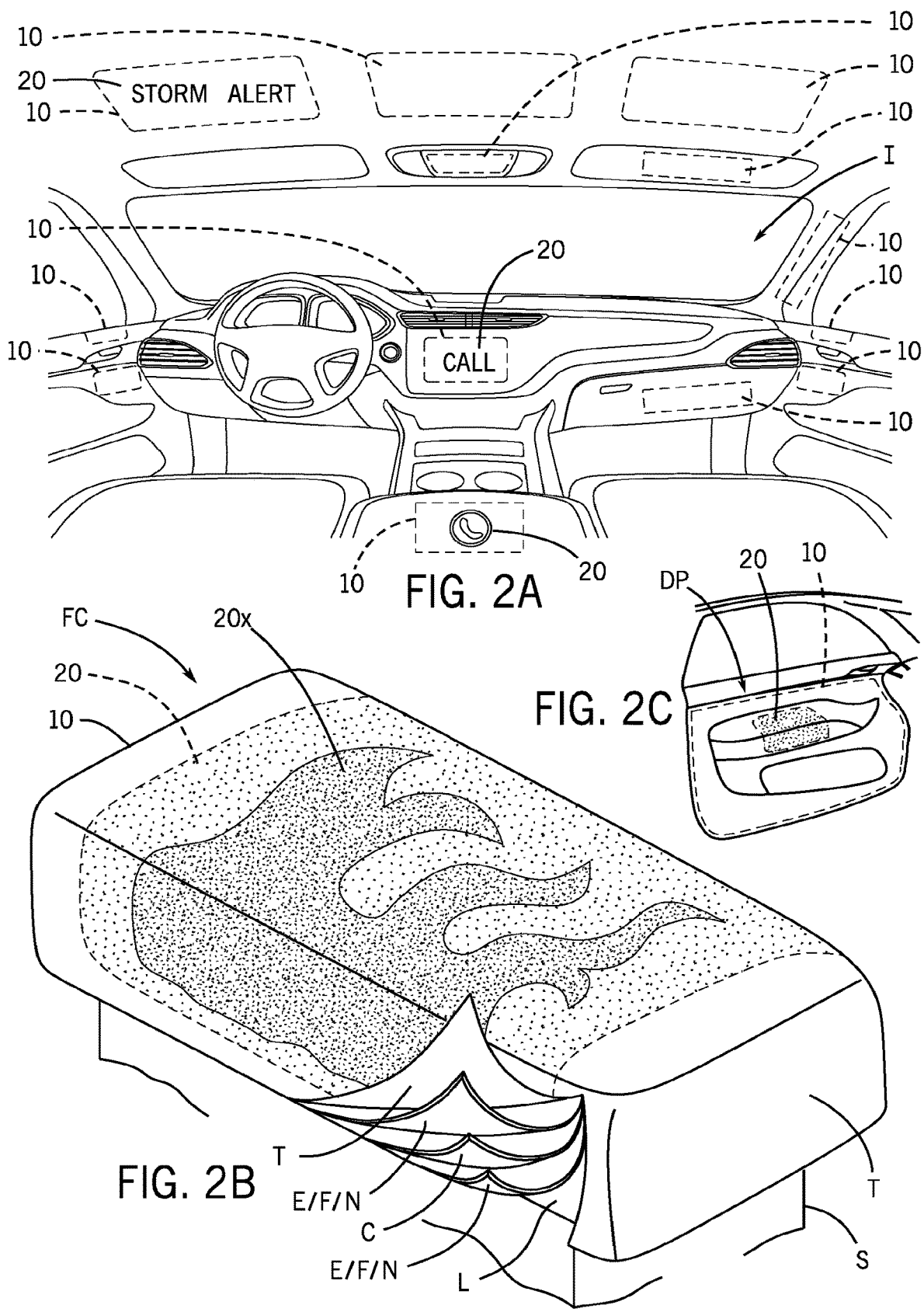

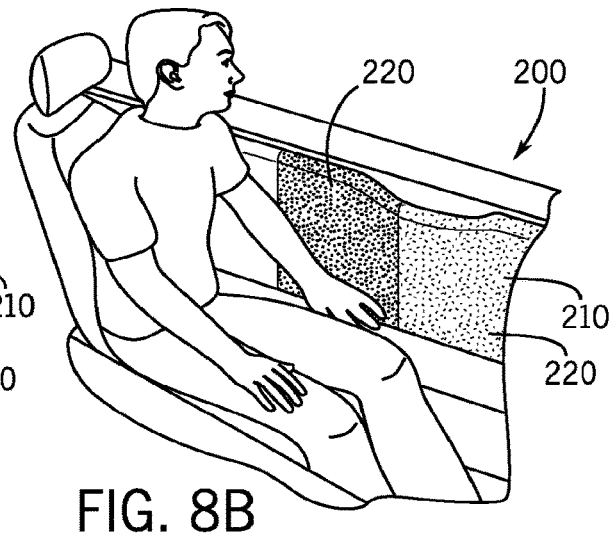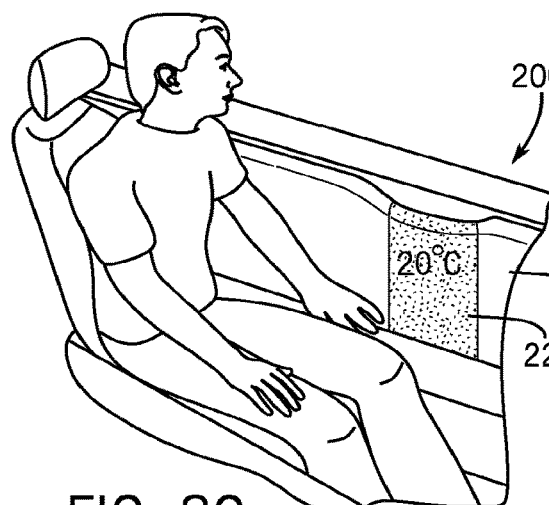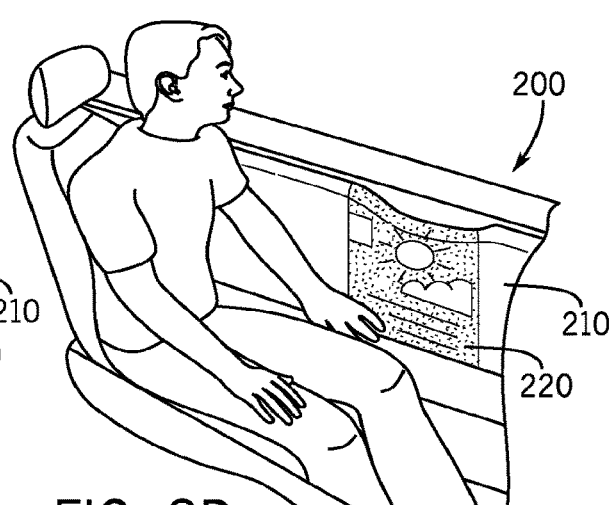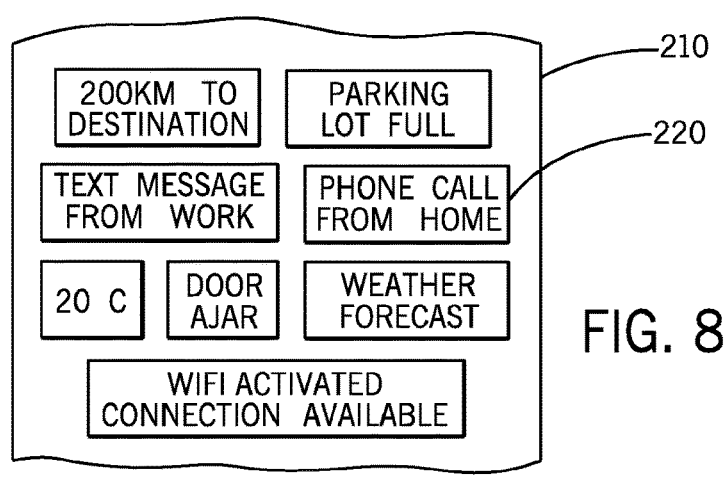

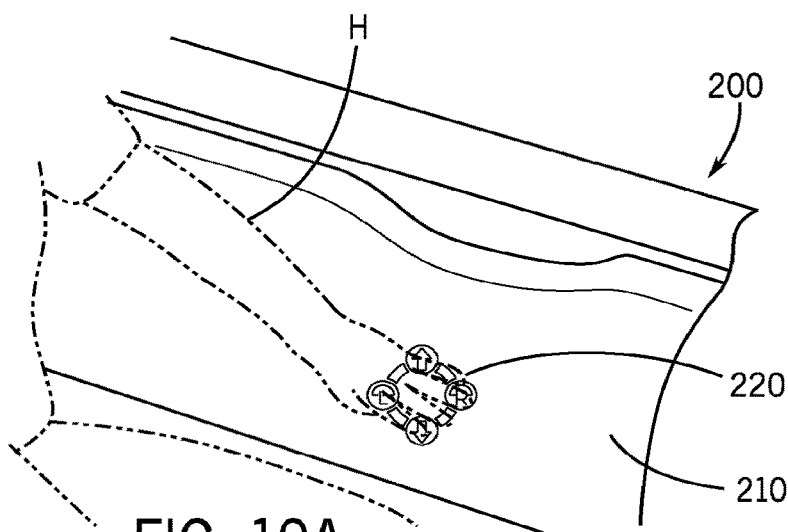
FIG. 10A
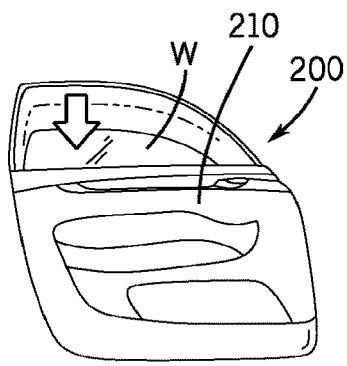
FIG. 10B
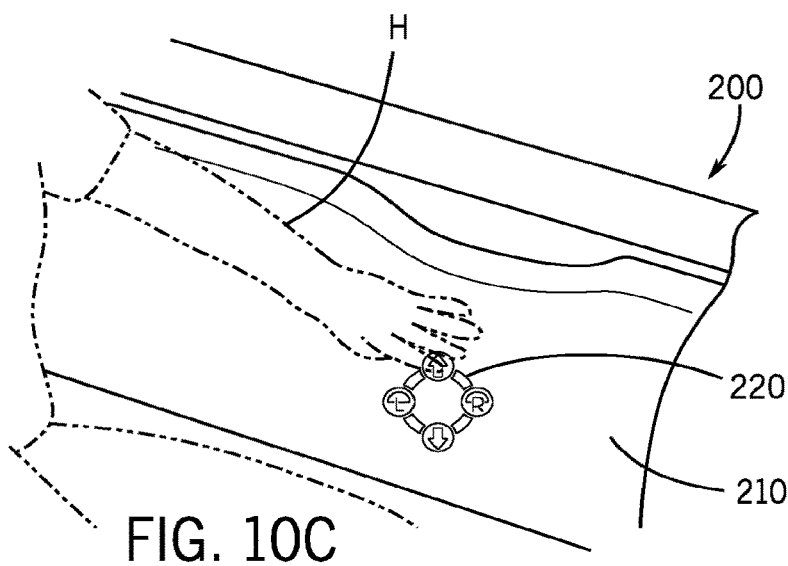
FIG. 10C
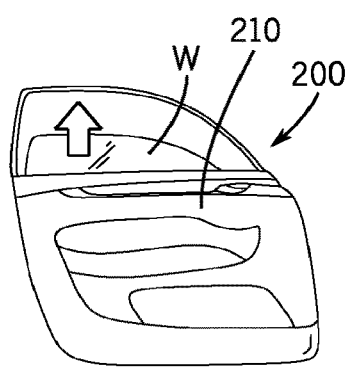
FIG. 10D
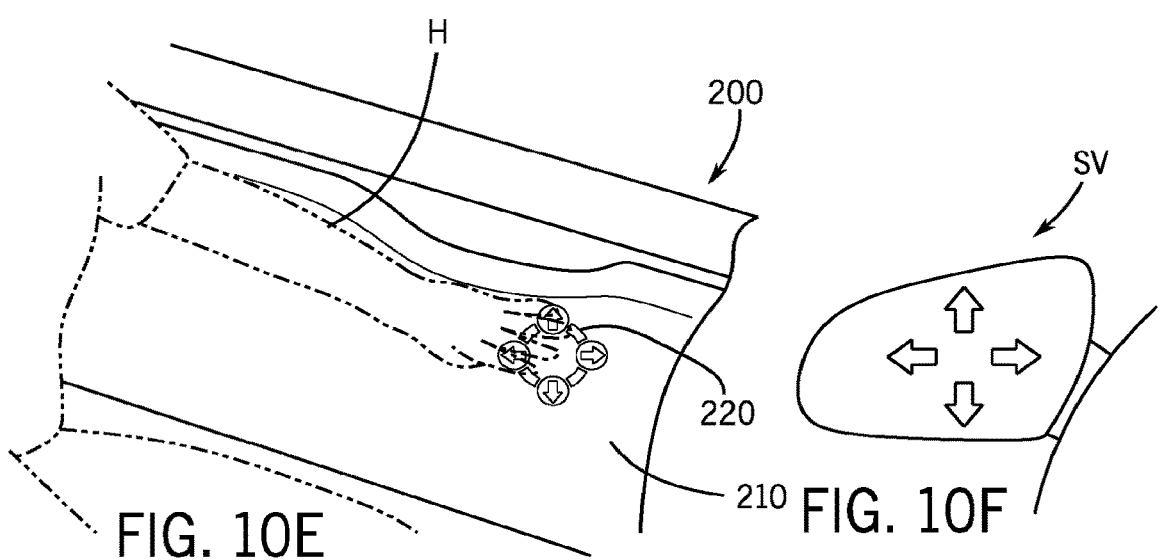
FIG. 10E
FIG. 10F

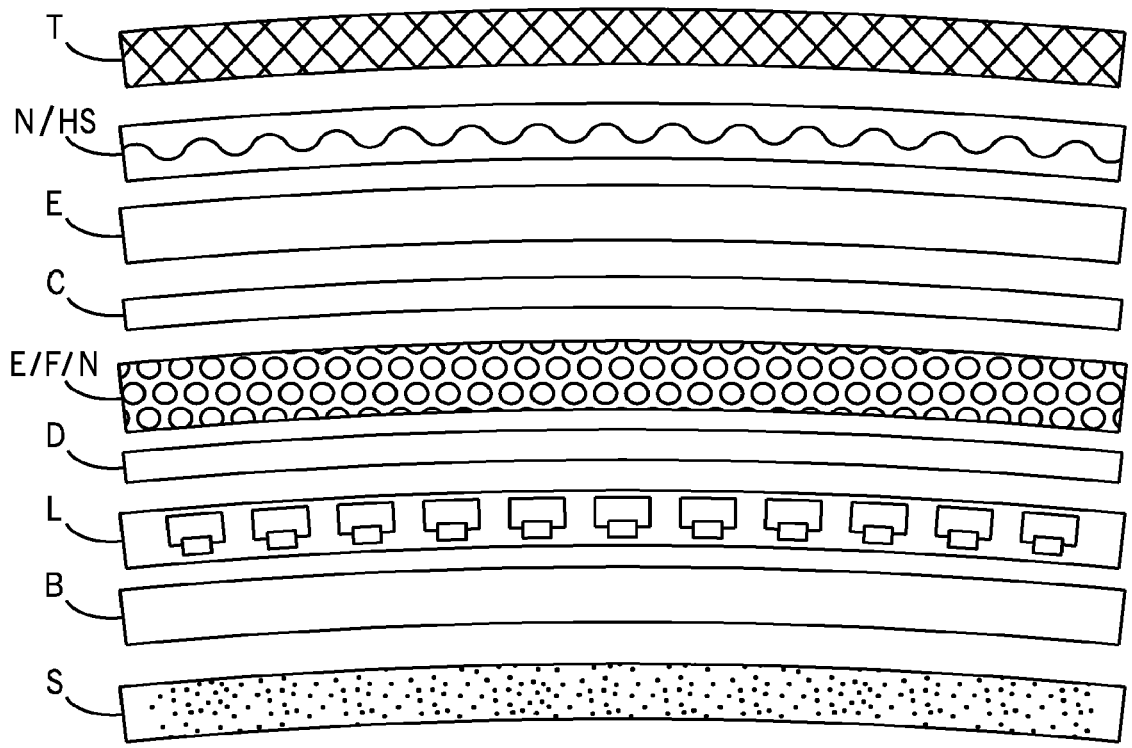
FIG. 12A
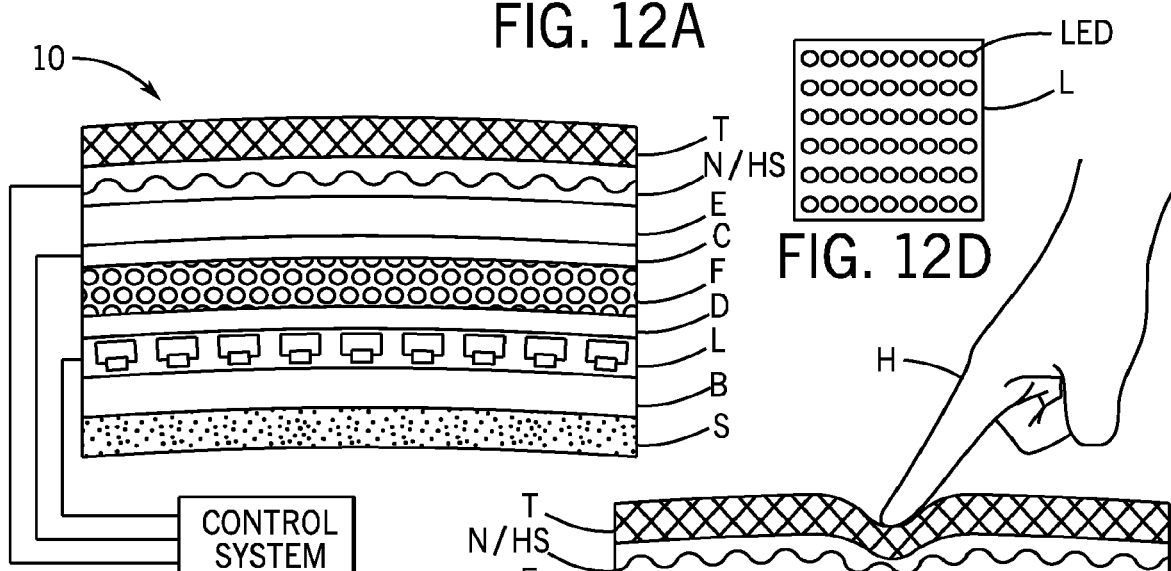
FIG. 12B
FIG. 12D
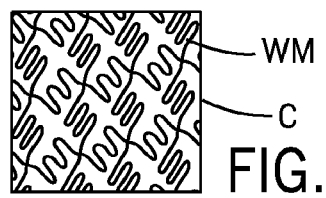
FIG. 12E
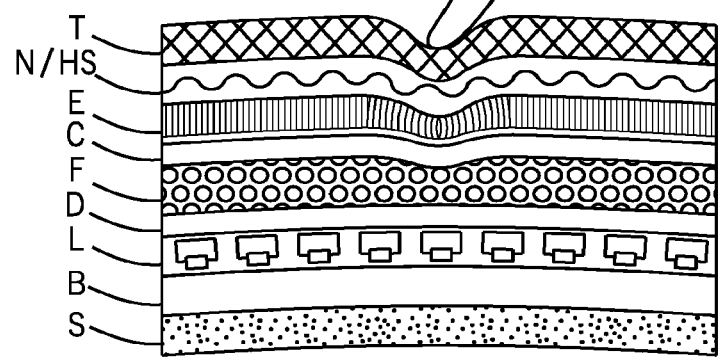
FIG. 12C

VEHICLE INTERIOR COMPONENT

CROSS-REFERENCE TO RELATED APPLICATIONS

The present invention is a continuation of PCT/International Patent Application No. PCT/US2017/041523 titled "Vehicle Interior Component" filed on Jul. 11, 2017 which claims the benefit of U.S. Provisional Patent Application No. 62/360,960 titled "Vehicle Interior Component" filed on Jul. 11, 2016.

The present invention claims priority to and incorporates by reference in full the following patent applications: (1) U.S. Provisional Patent Application No. 62/360,960 titled "Vehicle Interior Component" filed on Jul. 11, 2016; (2) PCT/International Patent Application No. PCT/US2017/041523 titled "Vehicle Interior Component" filed on Jul. 11, 2017.

FIELD

The present invention relates to a vehicle interior component. The present invention also relates to a vehicle interior component providing a composite structure. The present invention further relates to a vehicle interior component providing a composite structure providing a user interface system.

BACKGROUND

Conventional automotive interiors may include numerous switches, buttons, dials, and other physical control elements for receiving inputs from an occupant. Control elements are coupled to corresponding features and systems including entertainment systems, information systems, climate controls, door locks, window regulator/controls, seat position adjusters, cruise control, mirror position adjusters, headlights, steering wheel adjusters, and etc.

It is well-known to provide a touch panel in a vehicle interior having buttons/icons that can be pressed to perform a function such as adjusting a seat or window position. It is known to provide such a panel with buttons/icons that are illuminated at all times, or only when selectively illuminated. It is known to provide such a panel with a hard surface that is separate from the soft (e.g. fabric/leather/etc.) surfaces of vehicle interior components.

It would be advantageous to provide an aesthetically pleasing and integrated composite structure including a cover/exterior surface and configured to provide a user interface with sensor and display for a vehicle interior component. It would also be advantageous to provide an integrated composite structure configured to provide a user interface in or on a vehicle interior component in a manner to provide an appearance and feel provided by the cover/exterior surface and compliant/resilient layers beneath the cover. It would further be advantageous to provide an improved system and method of operating the user interface for the composite structure of the vehicle interior component. It would further be advantageous to provide an improved composite structure including a cover/exterior surface and configured to provide a user interface in or on a vehicle interior component providing features suitable for a vehicle interior such as system integration, decorative appearance, color/texture, softness/firmness, feel/touch/haptic sensation, resistance to dirt/stains, repellence to water/fluids, convenient to maintain/clean, etc.

SUMMARY

The present invention relates to a vehicle interior component configured to provide a user interface for a vehicle occupant in a vehicle comprising vehicle systems comprising a composite structure configured to provide the user interface. The composite structure may a cover providing an exterior surface, a sensor, a display, a functional layer and a positioning layer. The cover may comprise a layer configured to facilitate the transmission of light. The sensor may be configured to detect input from the vehicle occupant at or adjacent to the exterior surface of the cover. The display may be configured to provide illumination at least partially visible through the exterior surface of the cover; operation of the user interface for the vehicle occupant may comprise at least one of (a) output from illumination from the display and (b) input detected by the sensor. The composite structure may comprise: (a) the cover; (b) the functional layer; (c) the sensor; (d) the positioning layer; (e) the display; (f) a substrate. The functional layer may comprise a diffuser and the positioning layer may comprise at least one of (a) a foam material and/or (b) a spacer fabric. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials; (s) a translucent material; (t) a resilient material; (u) a leather material configured to facilitate the transmission of light; (v) a material that may comprise partially transparent and partially opaque; (w) a layer configured to facilitate transmission of visible light; (x) a surface material perforated to improve the visibility of light from the display. The cover may comprise a light-transmissive cover comprising at least one of (a) film; (b) resin; (c) polycarbonate; (d) polyurethane; (e) polyvinyl material; (f) TPO; (g) a poly material; (h) a poly film; (i) a composite of multiple plastic materials; (j) a composite of multiple materials; (k) a composite of fiber material; (l) natural material; (m) metal; (n) a perforated material; (o) a translucent layer. The functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing Peltier effect; (t) diffusion of illumination from the display; (u) monitoring; (v) recording; (w) alerting; (x) messaging; (y) light guiding; (z) flexibility. The positioning layer may be configured to retain positioning within the composite structure for operation of the sensor from input from the vehicle occupant; the positioning layer may comprise at least one of (a) a spacer; (b) a flexible spacer; (c) a spacer fabric; (d) a foam material; (e) a plastic material; (f) fabric; (g) polyurethane; (h) a woven material; (i) a spacer material; (j) a fabric material; (k) a fiber material. The user interface may be configured so that input from the vehicle occupant at the exterior surface of the cover may be detected by the sensor. The user interface may be configured so that output from the display may be presented at least partially through the exterior surface of the cover. The composite structure may be configured in a contoured shape. The composite structure may comprise a substrate. The composite structure may be configured to be coupled to at least one of (a) a trim component; (b) a panel; (c) a door panel; (d) an instrument panel; (e) a surface; (f) a console; (g) a base. A control system may be configured to connect to vehicle systems; the control system may be configured to facilitate operation by the vehicle occupant for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant. The user interface may be configured for interaction with a vehicle occupant by at least one of (a) touch at the exterior surface of the cover detected by the sensor or (b) gesture adjacent to the exterior surface of the cover detected by the sensor. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel. The display may comprise at least one of (a) an array; (b) a grid; (c) a panel; (d) a display screen; (e) a flexible panel; (f) a lighting array; (g) a lighting device array; (h) a light-emitting device array; (i) an LED array; (j) a flexible LED array; (k) an OLED array; (l) a flexible LED matrix; (m) a flexible sheet. The composite structure may comprise a composite surface; and the cover may comprise an at least partially translucent cover; illumination from the display at the exterior surface of the composite structure may comprise visible light transmitted through the functional layer and through the at least partially translucent cover.

The present invention relates to a vehicle interior component configured to provide a user interface for a vehicle occupant in a vehicle comprising vehicle systems. The vehicle interior component may comprise a composite structure configured to provide the user interface comprising a cover providing an exterior surface, a sensor, a display and a functional layer. The cover may comprise a light-transmissive layer. The sensor may be configured to detect input from the vehicle occupant at or adjacent to the exterior surface of the cover. The display may be configured to provide illumination at least partially visible through the exterior surface of the cover. The functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing Peltier effect; (t) diffusion of illumination from the display; (u) monitoring; (v) recording; (w) alerting; (x) messaging; (y) light guiding; (z) flexibility. The sensor may be configured to detect input from the vehicle occupant at or adjacent to the exterior surface of the cover from at least one of (a) touch; (b) pressure; (c) proximity; (d) movement; (e) gesture; (f) positioning. Operation of the user interface for the vehicle occupant may comprise at least one of (a) output from illumination from the display and (b) input detected by the sensor. The functional layer may comprise a first functional layer and a second functional layer; the first functional layer may comprise a functional layer configured for diffusion of illumination from the display and the second functional layer may comprise a positioning layer. The positioning layer may comprise at least one of (a) a spacer; (b) a flexible spacer; (c) a spacer fabric; (d) a fabric material; (e) a foam material; (f) a plastic material; (g) a woven material; (h) a fiber material; (i) fabric; (j) polyurethane; (k) a spacer material. The composite structure may comprise: (a) the cover; (b) the functional layer; (c) the sensor; (d) a positioning layer; (e) the display; (f) a substrate; the functional layer may comprise a diffuser and the positioning layer may comprise at least one of (a) a foam material; (b) a spacer fabric. The composite structure may comprise a foam layer under the cover. The user interface may comprise a display element from illumination from the display that may be configured to be selectively positioned on the exterior surface of the cover; and the display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image; (m) an image element selectively positionable on the exterior surface of the cover by interaction with the vehicle occupant. The display element of the user interface may be configured to be positioned on the exterior surface of the cover (a) contacting of the exterior surface of the cover at a position where the display element may be displayed when the display element may comprise not displayed; (b) contacting the exterior surface of the cover where the display element may be displayed and dragging the display element along the exterior surface of the cover to a position where the display element may be displayed. The user interface may be configured (a) to be activated for operation by compressing the cover toward the sensor and (b) to be operated by contacting the exterior surface within a distance where input can be detected by the sensor and (c) to be operated by movement directed by the vehicle occupant above the exterior surface of the cover within a distance where input can be detected by the sensor. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials; (s) a translucent material; (t) a resilient material; (u) a leather material configured to facilitate the transmission of light; (v) a material that may comprise partially transparent and partially opaque; (w) a layer configured to facilitate transmission of visible light; (x) a surface material perforated to improve the visibility of light from the display; (y) film; (z) resin; (aa) polycarbonate; (bb) polyurethane; (cc) polyvinyl material; (dd) TPO; (ee) a poly material; (ff) a poly film; (gg) a composite of multiple plastic materials; (ii) a composite of multiple materials; (jj) a composite of fiber material; (kk) natural material; (ll) metal; (mm) a perforated material; (nn) a translucent layer.

The present invention relates to a method of operating a vehicle interior component comprising a composite structure comprising a cover with an exterior surface and at least one functional layer and providing a sensor and a display configured to provide a user interface for a vehicle occupant in a vehicle with vehicle systems. The method may comprise the steps of pressing the cover toward the sensor to a distance where input can be detected by the sensor; and contacting the exterior surface within a distance where input can be detected by the sensor. The cover may comprise a light-transmissive layer configured to facilitate the transmission of light. The sensor may be configured to detect input from the vehicle occupant at or adjacent to the exterior surface of the cover from at least one of (a) touch; (b) pressure; (c) proximity; (d) movement; (e) gesture; (f) positioning. The display may be configured to provide illumination at least partially visible through the exterior surface of the cover. Operation of the user interface for the vehicle occupant may comprise at least one of (a) output from illumination from the display and (b) input detected by the sensor. The functional layer may comprise a first functional layer configured for diffusion of illumination from the display and a second functional layer configured as a positioning layer comprising at least one of (a) a foam material and (b) a fabric material. The composite structure may comprise (a) the cover comprising the light-transmissive layer; (b) the first functional layer configured for diffusion of illumination from the display; (c) the sensor; (d) the second functional layer; (e) the display configured to provide illumination at least partially visible through the exterior surface of the cover; (f) a substrate. The step of pressing the cover toward the sensor may comprise compressing the cover toward the sensor to a first threshold distance where input can be detected by the sensor to actuate the user interface; the step of contacting the exterior surface may comprise contact within a second threshold distance where input can be detected by the sensor to operate and/or to position the user interface. The step of contacting the exterior surface within the second threshold distance may not require deformation of the composite structure. The step of pressing the cover toward the sensor may comprise deforming the composite structure at least partially. The method may comprise the step of (c) movement at or adjacent the exterior surface detected as input by the sensor. The display may be configured to display at least one of (a) data; (b) information; (c) vehicle system information; (d) an input panel; (e) a menu system; (f) an output panel; (g) an image; (h) lighting. The positioning layer may comprise at least one of (a) a spacer; (b) a flexible spacer; (c) a spacer fabric; (d) a fabric material; (e) a foam material; (f) a plastic material; (g) a woven material; (h) a fiber material; (i) fabric; (j) polyurethane; (k) a spacer material. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials; (s) a translucent material; (t) a resilient material; (u) a leather material configured to facilitate the transmission of light; (v) a material that may comprise partially transparent and partially opaque; (w) a layer configured to facilitate transmission of visible light; (x) a surface material perforated to improve the visibility of light from the display; (y) film; (z) resin; (aa) polycarbonate; (bb) polyurethane; (cc) polyvinyl material; (dd) TPO; (ee) a poly material; (ff) a poly film; (gg) a composite of multiple plastic materials; (ii) a composite of multiple materials; (jj) a composite of fiber material; (kk) natural material; (ll) metal; (mm) a perforated material; (nn) a translucent layer.

The present invention relates to a vehicle interior component configured to provide a user interface for a vehicle occupant in a vehicle comprising vehicle systems. The component may comprise a composite structure configured to provide the user interface comprising (a) a cover providing an exterior surface; (b) a sensor; (c) a display; (d) a functional layer. The cover may comprise a translucent layer; the sensor may be configured to detect input from the vehicle occupant at or adjacent the exterior surface of the cover; the display may be configured to provide illumination at least partially visible through the exterior surface of the cover. Operation of the user interface for the vehicle occupant may comprise at least one of (a) output from illumination from the display and (b) input detected by the sensor. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials. The cover may comprise at least one of (a) film; (b) resin; (c) polycarbonate; (d) polyurethane; (e) polyvinyl material; (f) a composite of multiple plastic materials; (g) a composite of multiple materials. The functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) Peltier effect; (t) diffusion of illumination from the display; (u) monitoring; (v) recording; (w) alerting; (x) messaging.

The functional layer may comprise a positioning layer configured to retain positioning within the composite structure for operation of the sensor from input from the vehicle occupant. The positioning layer may comprise at least one of (a) a spacer; (b) a flexible spacer; (c) a shield for electromagnetic interference; (d) a foam material; (e) a plastic material. The composite structure may comprise a foam layer under the cover. The functional layer may be at least partially integrated with at least one of (a) the cover; (b) the positioning layer; (c) a substrate of the composite structure. The user interface may be configured so that input from the vehicle occupant at the exterior surface of the cover is detected by the sensor. Input from the vehicle occupant may comprise contact with the exterior surface of the cover. The composite structure may be configured in a contoured shape. The composite structure may comprise a substrate; the composite structure may be coupled to at least one of (a) a trim component; (b) a panel; (c) a door; (d) a surface; (e) a console; (f) a base. A control system for the user interface may be configured to connect to vehicle systems. The control system may be configured to facilitate operation by the vehicle occupant for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant. The user interface may comprise a control panel presented at the exterior surface of the cover. The controller for the composite structure may be connected to the user interface. The vehicle systems comprise at least one vehicle system; a vehicle system may comprise at least one of (a) an indicator, (b) a display, (c) a climate control system, (d) an entertainment system, (e) a security system, (f) an engine control unit, (g) a data storage system, (h) a database, (i) a motor, (j) a vehicle seat, (k) a window regulator/control; (l) a network; (m) a data storage system; (n) a database. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel. The display may comprise at least one of (a) an array; (b) a grid; (c) a panel; (d) a display screen; (e) a flexible panel; (f) a lighting array; (g) a lighting device array; (h) a light-emitting device array; (i) a LED array; (j) a flexible LED array; (k) a flexible sheet.

The present invention further relates to a vehicle interior component configured for interaction with an occupant of a vehicle comprising vehicle systems comprising a composite structure configured to provide a user interface for interaction with the occupant. The composite structure may comprise a cover providing an exterior surface, a sensor, a display and a functional layer; the cover may comprise a translucent layer; the sensor may be configured to detect input from the occupant at or adjacent to the exterior surface of the cover; the display may be configured to provide illumination at least partially visible through the exterior surface of the cover; operation of the user interface for the occupant may comprise at least one of (a) output from illumination from the display and (b) input detected by the sensor; the user interface may comprise a display element from illumination from the display that may be configured to be selectively positioned on the exterior surface of the cover. The display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image. The display element of the user interface may be configured to be positioned on the exterior surface of the cover by at least one of (a) when the display element is not displayed by contacting of the exterior surface of the cover at a position where the display element is to be displayed; (b) when the display element is displayed by contacting the exterior surface of the cover where the display element is displayed and dragging the display element along the exterior surface of the cover to a position where the display element is to be displayed.

The present invention further relates to a vehicle interior component configured to provide a user interface for a vehicle occupant in a vehicle comprising vehicle systems. The component may comprise a composite structure configured to provide the user interface with a cover providing an exterior surface, a sensor; a display; and a functional layer. The cover may comprise a translucent layer; the sensor may be configured to detect input from the vehicle occupant at or adjacent to the exterior surface of the cover; the display may be configured to provide illumination at least partially visible through the exterior surface of the cover; operation of the user interface for the vehicle occupant may comprise at least one of (a) output from illumination from the display and (b) input detected by the sensor; the user interface may be configured (a) to be activated for operation by compressing the cover toward the sensor and (b) to be operated by contacting the exterior surface within a distance where input can be detected by the sensor. The user interface may be configured (c) to be operated by movement directed by the vehicle occupant above the exterior surface of the cover within a distance where input can be detected by the sensor. The user interface may be configured for interaction with a vehicle occupant by at least one of (a) touch at the exterior surface of the cover detected by the sensor or (b) gesture adjacent to the exterior surface of the cover detected by the sensor. The user interface may be configured for (a) a sleep mode and awakening from the sleep mode by compressing the cover toward the sensor by a first threshold distance and (b) for an awake mode providing a control panel and operating the control panel by touching the exterior surface of the cover within a second threshold distance from the sensor. The user interface may comprise the display element on the exterior surface of the cover; a display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image. The design element of the user interface may be configured to be selectively positionable on the exterior surface of the cover by interaction with the vehicle occupant.

The present invention further relates to a vehicle interior component configured to provide a user interface for a vehicle occupant in a vehicle comprising vehicle systems. The component may comprise a composite structure configured to provide the user interface with a cover providing an exterior surface, a sensor, a display and a functional layer. The cover may comprise a translucent layer; the cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials. The sensor may be configured to detect input from the vehicle occupant at or adjacent to the exterior surface of the cover; the display may be configured to provide illumination at least partially visible through the exterior surface of the cover. Operation of the user interface for the vehicle occupant may comprise at least one of (a) output from illumination from the display and (b) input detected by the sensor.

The present invention further relates to a vehicle interior component configured to provide a user interface for a vehicle occupant in a vehicle comprising vehicle systems. The component may comprise a composite structure configured to provide the user interface with a cover providing an exterior surface, a sensor, a display and a functional layer. The cover may comprise a translucent layer; the sensor may be configured to detect input from the vehicle occupant at or adjacent to the exterior surface of the cover; the display may be configured to provide illumination at least partially visible through the exterior surface of the cover. The functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) Peltier effect; (t) diffusion of illumination from the display; (u) monitoring; (v) recording; (w) alerting; (x) messaging. Operation of the user interface for the vehicle occupant may comprise at least one of (a) output from illumination from the display and (b) input detected by the sensor.

The present invention further relates to a method of operating a vehicle interior component comprising a composite structure to provide a cover with an exterior surface and a sensor and a display configured to provide a user interface for a vehicle occupant in a vehicle with vehicle systems. The method may comprise the steps of (a) pressing the cover toward the sensor to a distance where input can be detected by the sensor; and (b) contacting the exterior surface within a distance where input can be detected by the sensor. The cover may comprise a translucent layer; the sensor may be configured to detect input from the vehicle occupant at or adjacent to the exterior surface of the cover from at least one of (a) touch; (b) pressure; (c) proximity; (d) movement; (e) gesture; (f) positioning. The display may be configured to provide illumination at least partially visible through the exterior surface of the cover; operation of the user interface for the vehicle occupant may comprise at least one of (a) output from illumination from the display and (b) input detected by the sensor. The step of pressing the cover toward the sensor may comprise compressing the cover toward the sensor to a first threshold distance where input can be detected by the sensor to actuate the user interface. The step of contacting the exterior surface may comprise contact within a second threshold distance where input can be detected by the sensor to operate and/or to position the user interface. The step of pressing the cover toward the sensor may comprise deforming the composite structure at least partially. The method may further comprise the step of (c) movement at or adjacent the exterior surface detected as input by the sensor. The step of contacting the exterior surface within a second threshold distance may not require deformation of the composite structure.

The present invention further relates to a vehicle interior component configured to provide a user interface for a vehicle occupant in a vehicle comprising vehicle systems. The component may comprise a composite structure configured to provide the user interface with a cover providing an exterior surface and a sensor and a functional layer. The cover may comprise a translucent layer. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials. The sensor may be configured to detect input from the vehicle occupant at or adjacent to the exterior surface of the cover from at least one of (a) touch; (b) pressure; (c) proximity; (d) movement; (e) gesture; (f) positioning; operation of the user interface for the vehicle occupant may comprise input detected by the sensor.

The present invention further relates to a vehicle interior component configured to provide a user interface for a vehicle occupant in a vehicle comprising vehicle systems. The component may comprise a composite structure configured to provide the user interface with a cover providing an exterior surface and a display and a functional layer. The cover may comprise a translucent layer. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials. The display may be configured to provide illumination at least partially visible through the functional layer and through the exterior surface of the cover; interaction with the user interface for the vehicle occupant may comprise visible output from illumination from the display.

The present invention further relates to a user interface system for a vehicle interior. The system may comprise a cover with exterior/contact surface, a sensor such as a capacitive touch panel/foil covered by the cover/contact surface, a spacer coupled to the sensor and a display such as an LED/OLED display panel/foil covered by the spacer and configured to emit light. The spacer, the sensor and the cover/contact surface may be configured to be translucent to allow light emitted by the display to pass through the contact surface. The contact surface may comprise a textile; the spacer may comprise a foam material. The display may comprise at least one light emitting diode; the display may comprise a flexible material comprising an array of light emitting diodes (e.g. LED, OLED, etc.). The display may be configured to selectively emit light in response to a signal from the capacitive touch panel; the capacitive touch panel may be configured to receive a touch input and transmit a signal; the sensor such as a capacitive touch panel may be configured for decreased electrical resistance as pressure is applied to the panel. The system may comprise a controller configured for operation by a vehicle occupant for at least one of (a) sending a signal to a control module, (b) controlling a motor, (c) providing a signal to a vehicle component, (d) providing electrical power to a vehicle component and (e) providing at least one of (1) visible feedback, (2) audible feedback, (3) tactile feedback, (4) haptic feedback to the vehicle occupant. The controller may be configured to send a control signal to at least one of (a) an indicator, (b) a display, (c) a climate control module, (d) an entertainment control module, (e) a security control module, (f) an engine control unit, (g) a data store, (h) a database, (i) a motor, (j) a vehicle seat, (k) a window regulator/control.

FIGURES

FIG. 2A is a schematic perspective cut-away view of the vehicle showing a vehicle interior according to an exemplary embodiment.

FIG. 2B is a schematic perspective view of a vehicle interior component shown as a console with a composite structure of a layer construction in operation to present display elements at the user interface according to an exemplary embodiment.

FIG. 2C is a schematic perspective view of a vehicle interior component shown as a door panel with a composite structure in operation to present design elements at the user interface according to an exemplary embodiment.

FIGS. 8A to 8D are schematic perspective views of the vehicle interior component shown as a door panel with the composite structure presenting a user interface providing control/interaction and output of lighting effects/levels and information display for the vehicle interior according to an exemplary embodiment.

FIG. 8E is a schematic view of display elements providing information at the user interface of the composite structure of the vehicle interior component according to an exemplary embodiment.

FIGS. 10A and 10C are schematic perspective views of a vehicle interior component shown as a door panel with the composite structure presenting a user interface system configured as a control panel for a window of a vehicle door according to an exemplary embodiment.

FIGS. 10B and 10D are schematic side views of a door with window operated by the control panel of the user interface system according to an exemplary embodiment.

FIG. 10E is a schematic perspective view of a vehicle interior component shown as a door panel with the composite structure presenting a user interface system configured as a control panel for a side view mirror of a vehicle according to an exemplary embodiment.

FIG. 10F is a schematic side view of the side view mirror of the vehicle according to an exemplary embodiment.

FIG. 12A is a schematic exploded cross-section view of the composite structure with cover according to an exemplary embodiment.

FIGS. 12B and 12C are schematic cross-section views of the composite structure with cover according to an exemplary embodiment.

FIG. 12D is a schematic top view of a display shown as an LED array layer for the composite structure with cover according to an exemplary embodiment.

FIG. 12E is a schematic top view of a sensor shown as a capacitive sensor array layer for the composite structure with cover according to an exemplary embodiment.

DESCRIPTION

Introduction/Overview

Referring to FIGS. 1A-1B and 2A-2B, according to an exemplary embodiment a set of vehicle interior components shown as comprising a composite structure 10 (e.g. with cover/surface) are shown provided for a vehicle V with an interior I.

Figure 1A:
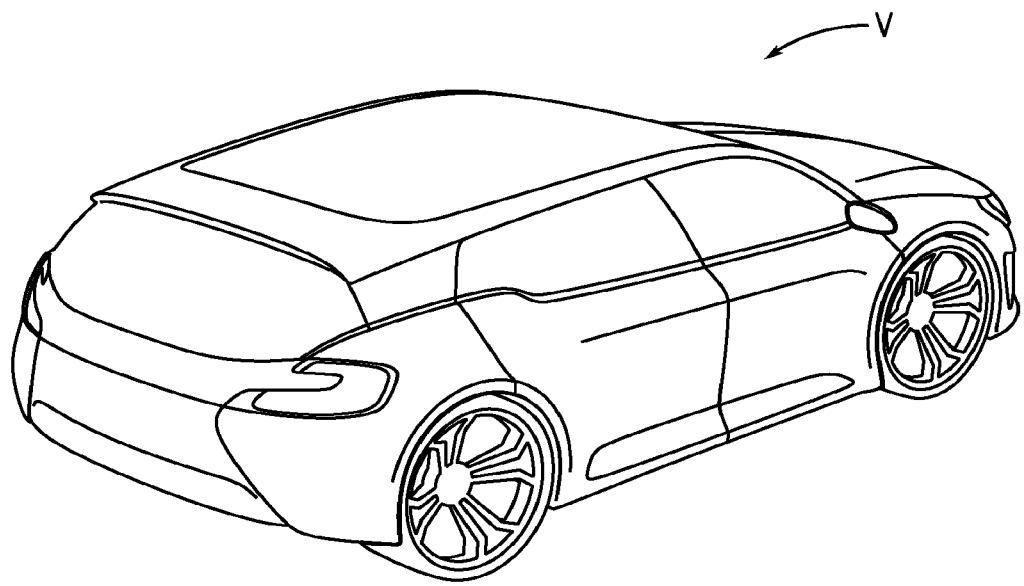
FIG. 1A is a schematic perspective view of a vehicle according to an exemplary embodiment.
Figure 1B:
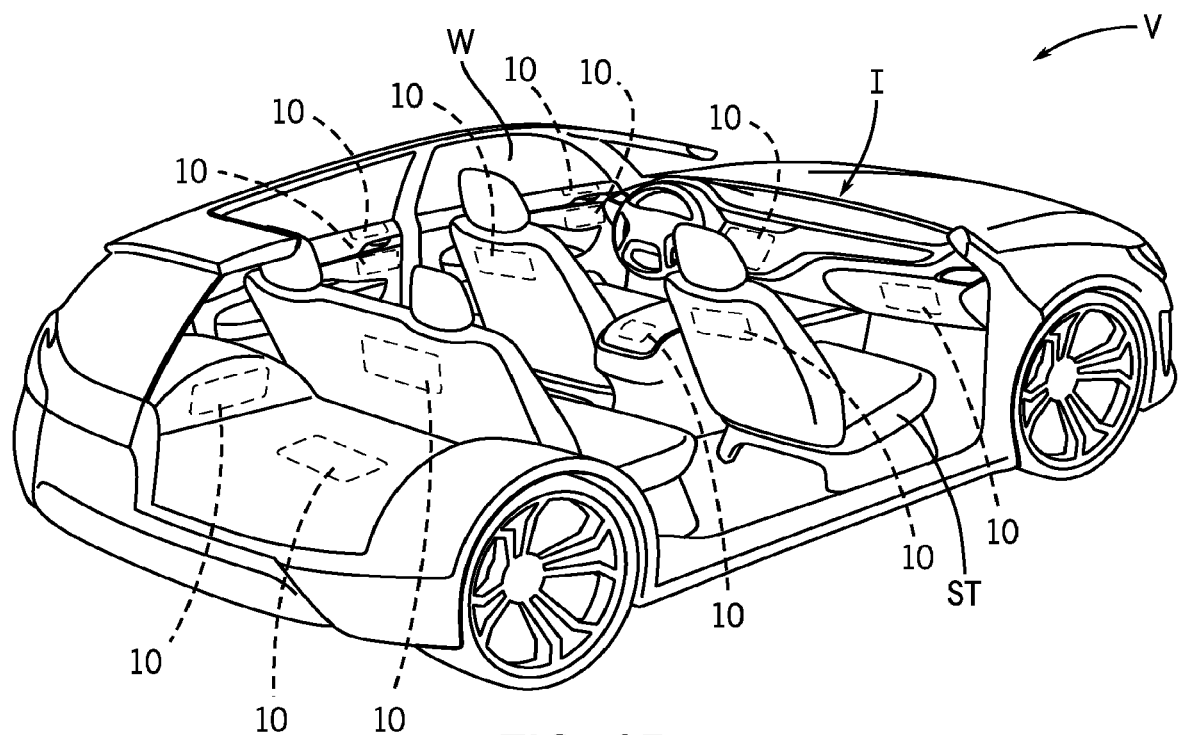
FIG. 1B is a schematic perspective cut-away view of the vehicle showing a vehicle interior according to an exemplary embodiment.
Figure 27:
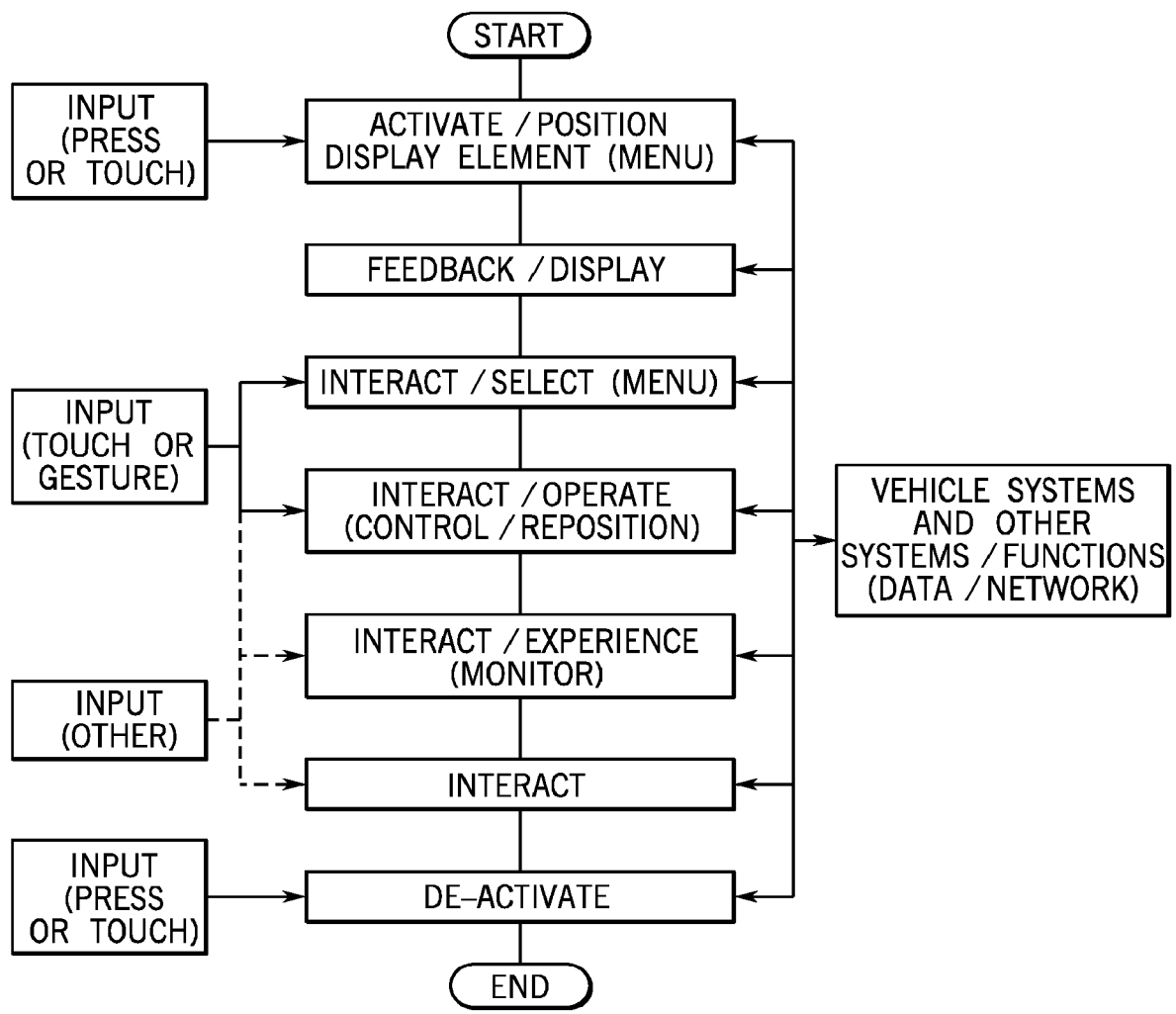
FIG. 27 is a schematic flow diagram of operation of a user interface of a composite structure for a vehicle interior component configured to interoperate with vehicle systems according to an exemplary embodiment.
Figure 28A:
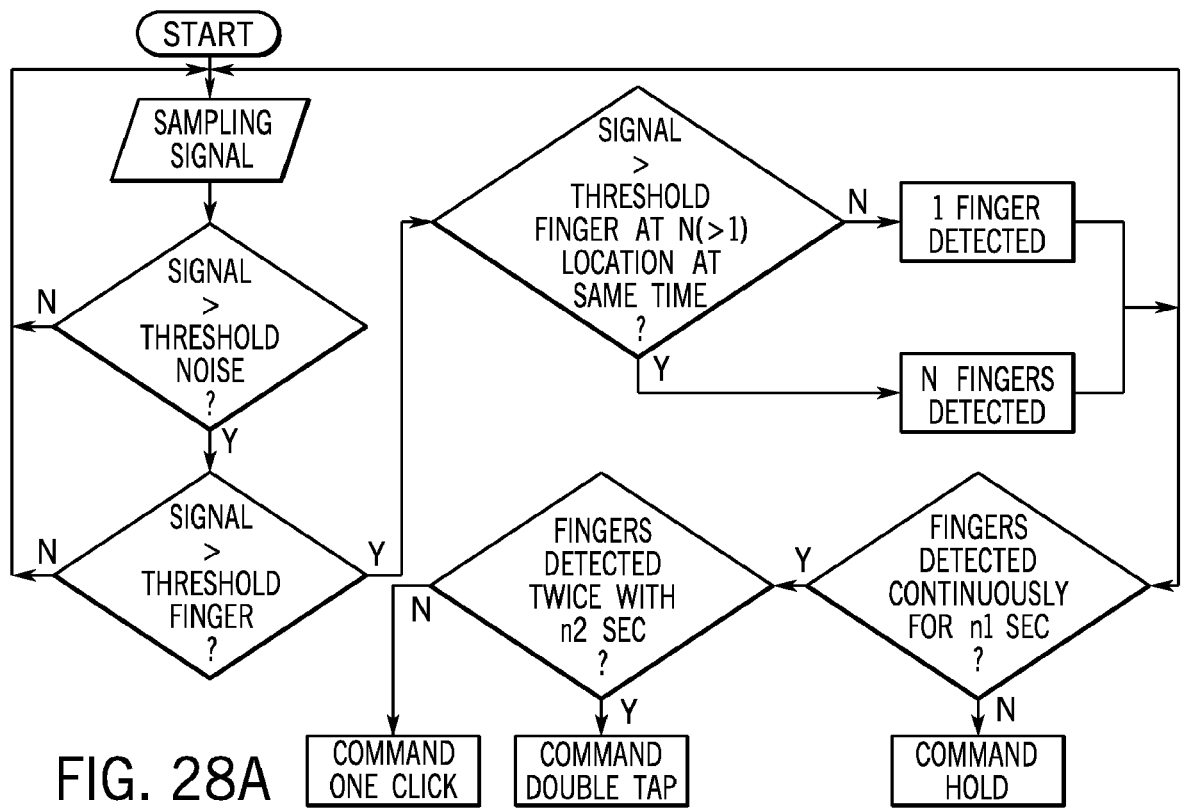
FIGS. 28A to 28E are schematic flow diagrams of operation of a user interface of a composite structure for a vehicle interior component configured to interoperate with vehicle systems according to an exemplary embodiment.
Figure 28B:
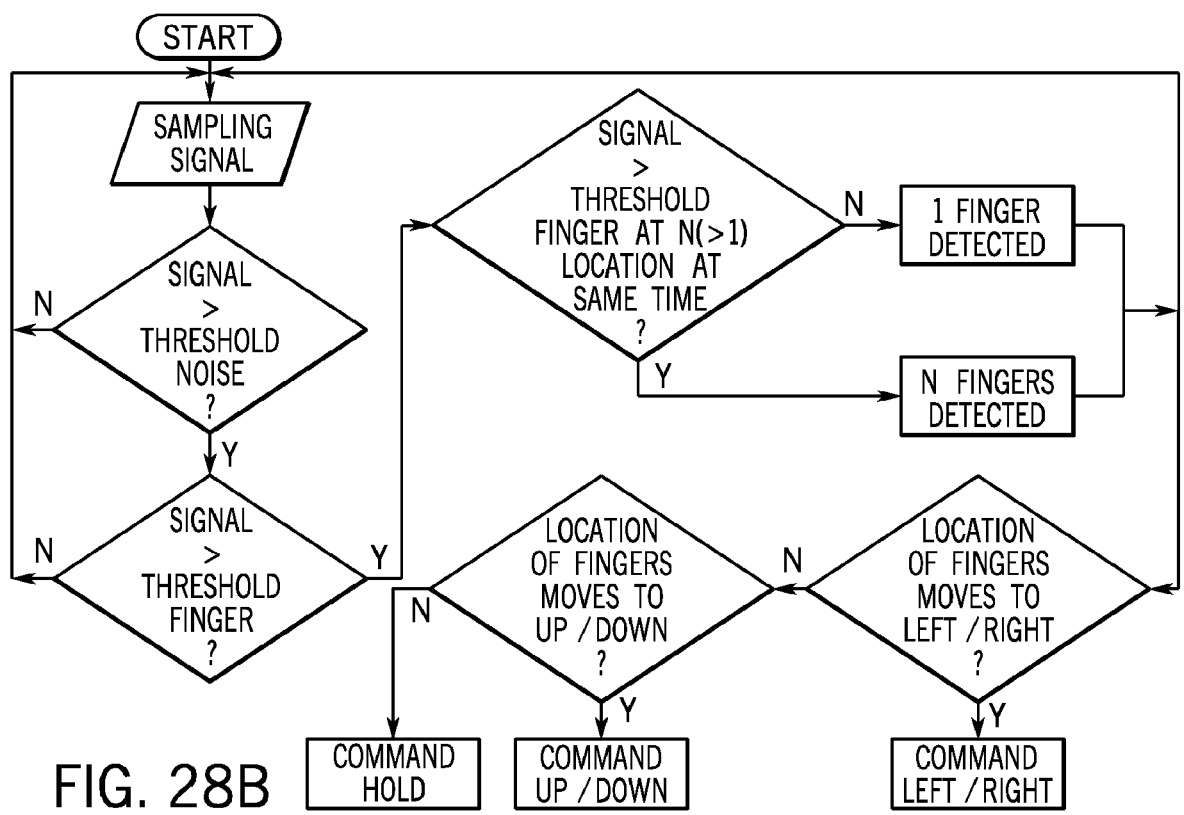
Figure 28C:
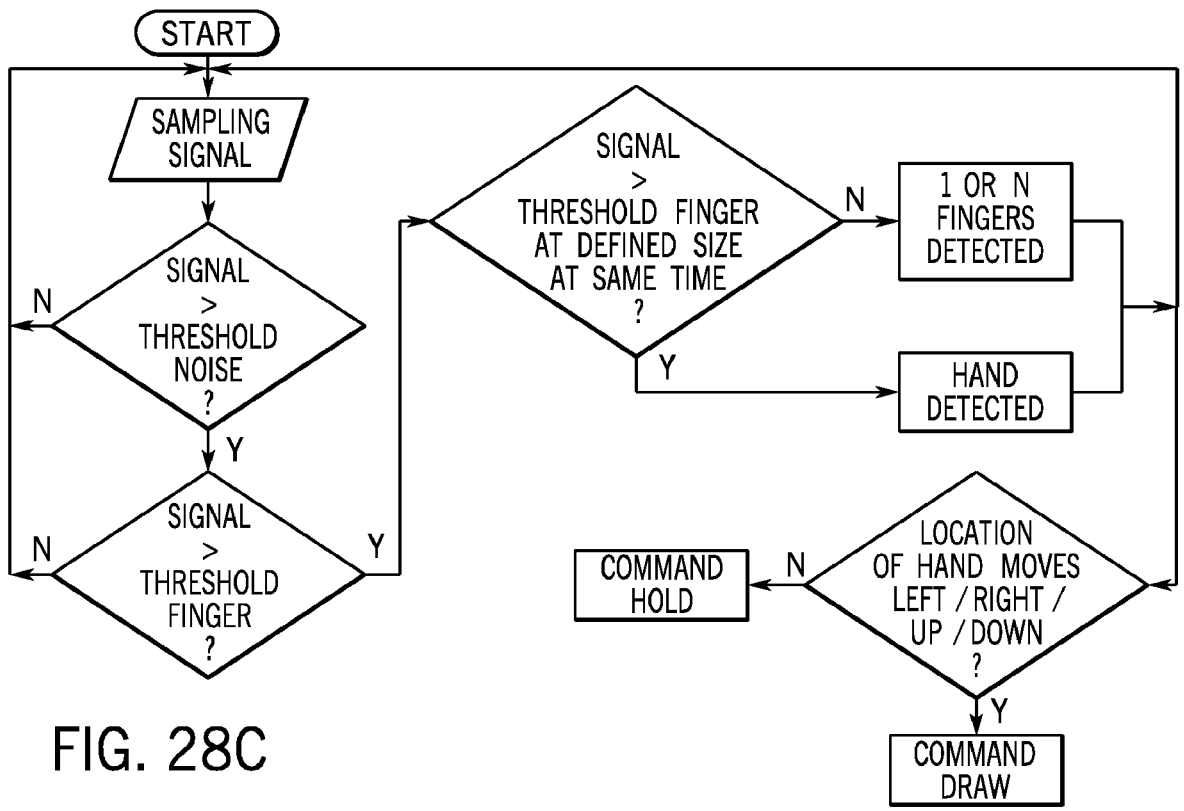
Figure 28D:
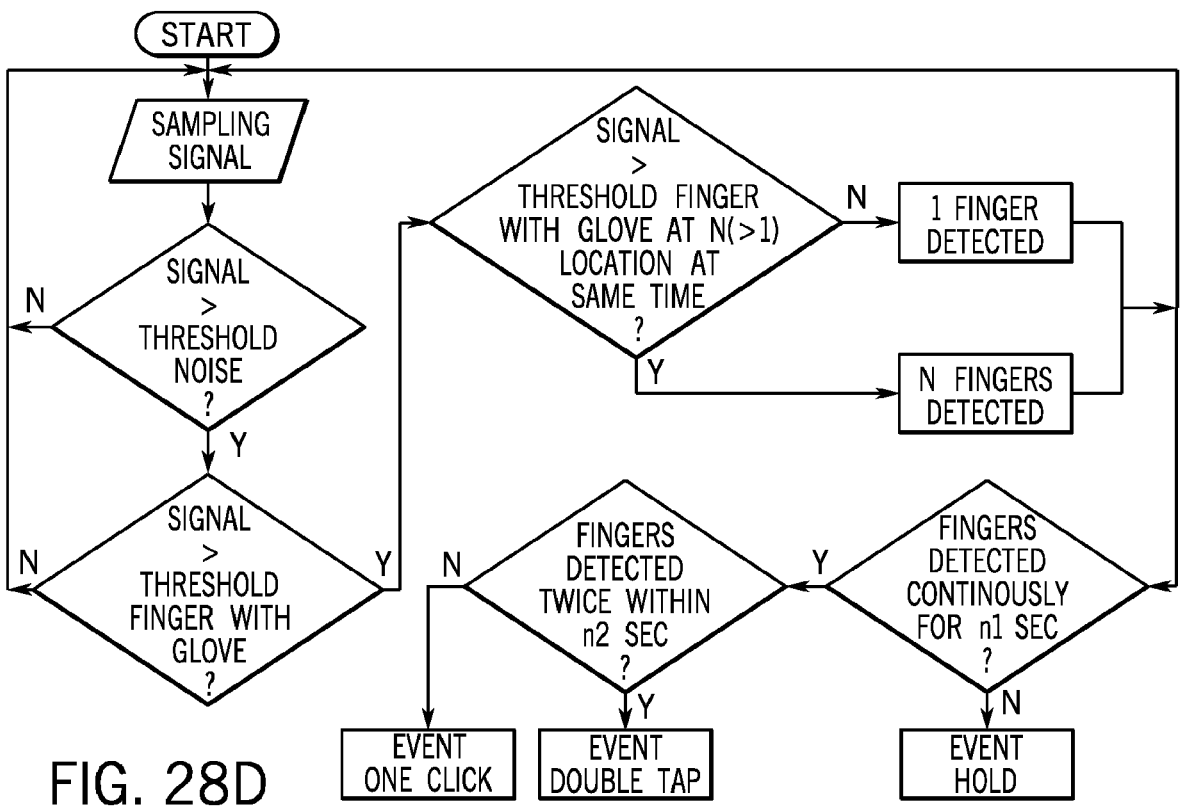
Figure 28E:
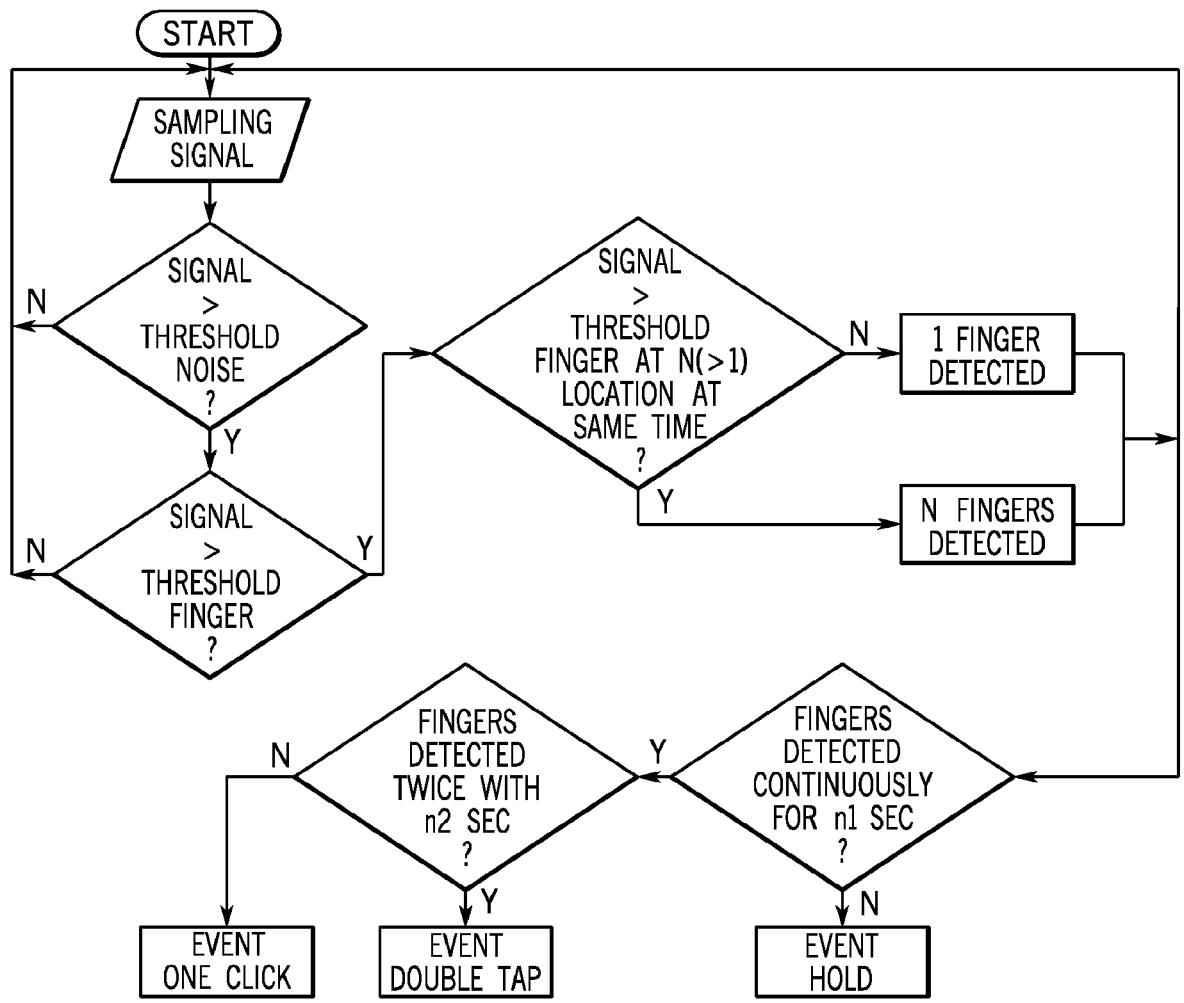
Figure 29A:
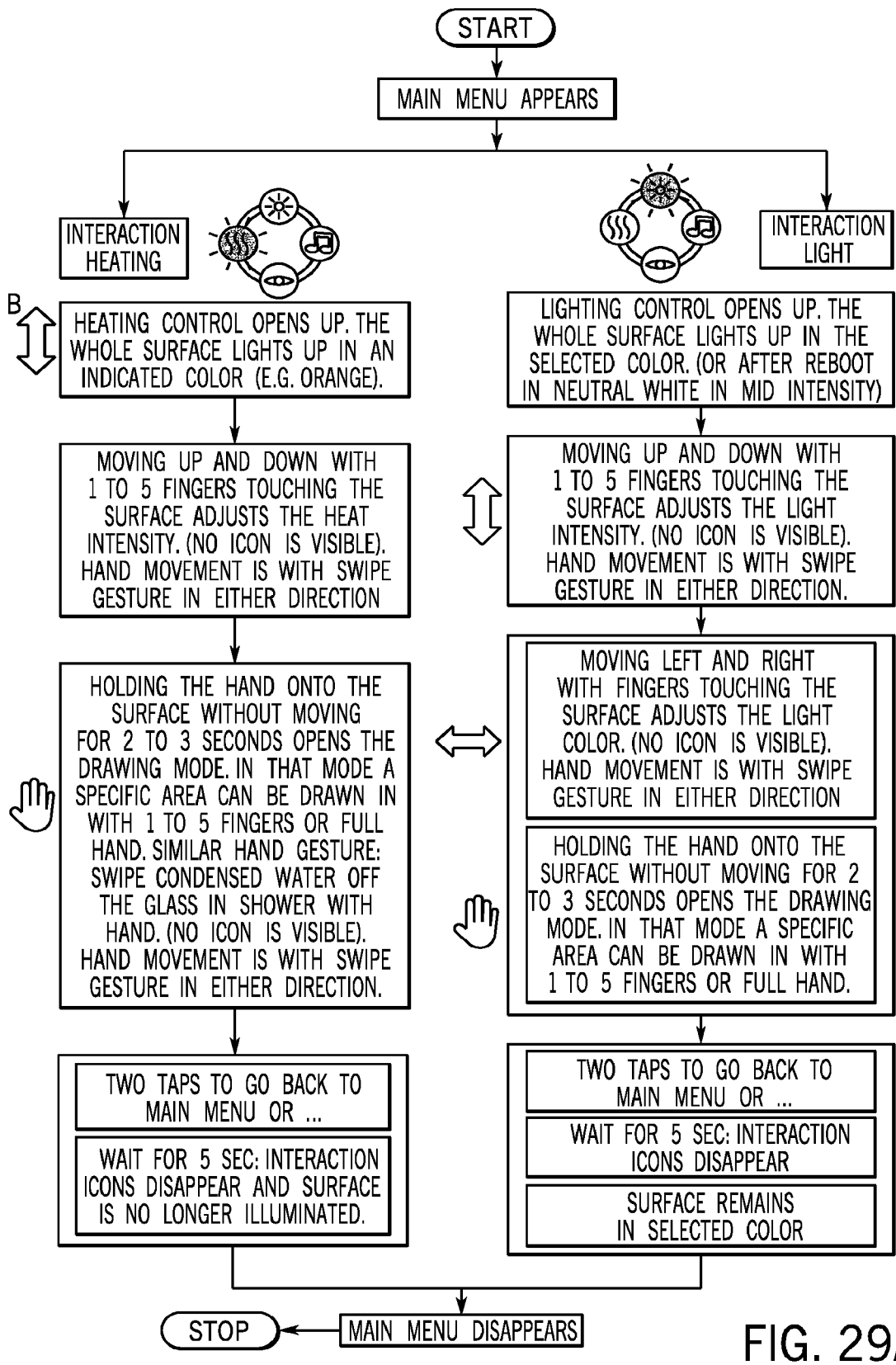
FIGS. 29A to 29B are schematic flow diagrams of operation of a user interface of a composite structure for a vehicle interior component configured to interoperate with vehicle systems according to an exemplary embodiment.
Figure 29B:
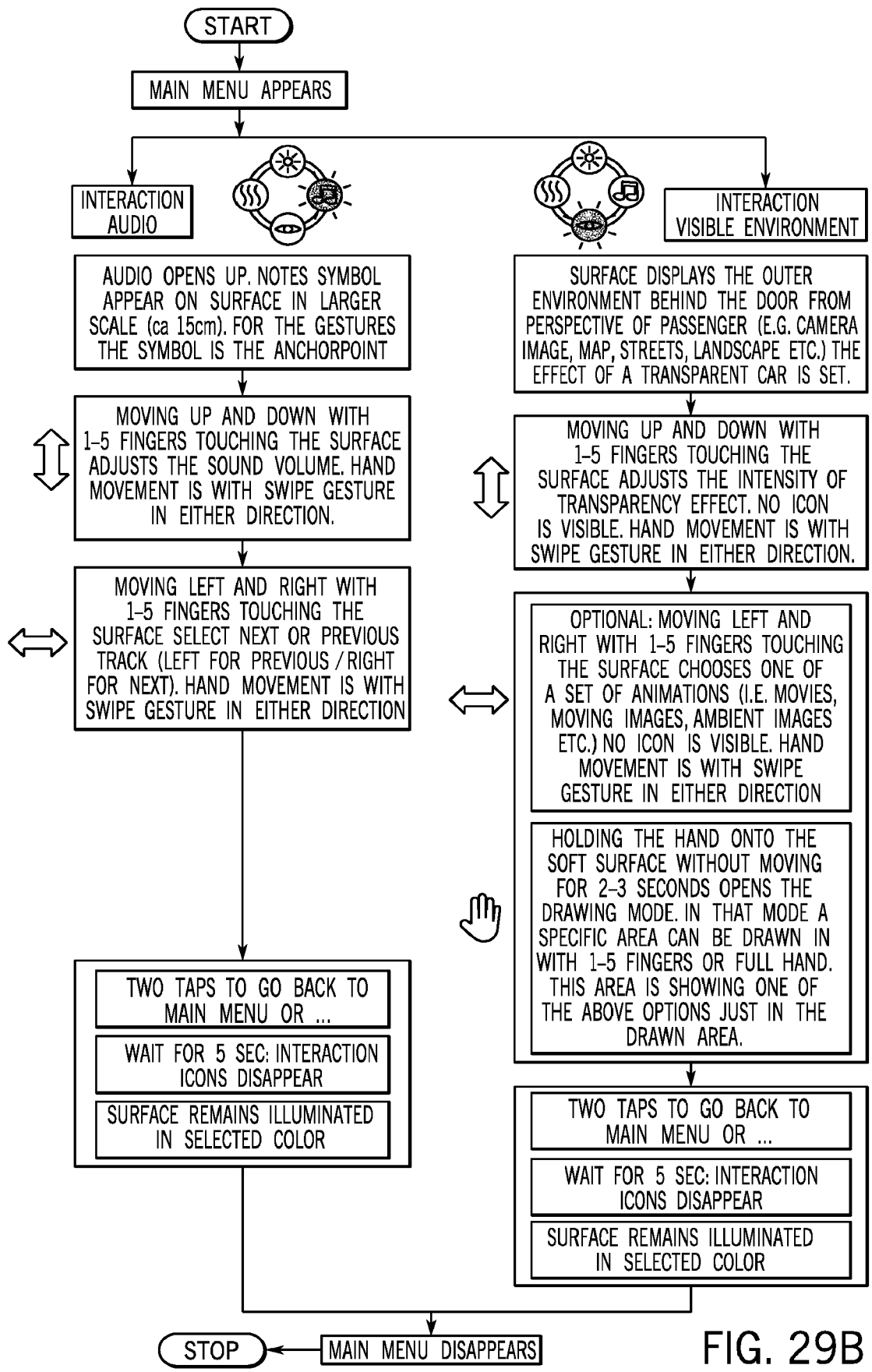

According to an exemplary embodiment as shown schematically in the FIGURES, a composite structure 10 (e.g. with cover/surface) may be provided on or in a vehicle interior component (shown as floor console FC in FIG. 2B and door panel DP in FIG. 2C) in a wide variety of forms with a composite of layers/components of a variety of types/materials and functions/performance attributes (see FIGS. 2C, 12A-12E, 16A-16T, 17A-17O, 18A-18D, 19A-19D) connected to a controller/control system (see FIGS. 12B, 23A-23B and 24) and with a control program (see e.g. FIG. 27) to present a user interface (see e.g. FIGS. 14A-14E and 15C) with an illuminated/display area 20 (e.g. shown as with a display element/image 20x in FIG. 2B and control panel/menu in FIGS. 15C and 25A-25D) on a cover/exterior surface (e.g. surface of a type suitable for a vehicle interior component as shown generally in FIGS. 1B and 2A) accessible by a vehicle occupant. See also FIGS. 3A-3T (e.g. vehicle interior component 100 shown schematically with cover/surface of composite structure 110 providing user interface with menu/display element 120) and FIGS. 4A-4F, 5A-5F, 6A-6F, 7A-7F, 8A-8E, 9A-9E, 10A-10F, 11A-11E (e.g. showing schematically interaction by vehicle occupant with user interface at cover/surface of composite structure of vehicle interior component).

As indicated schematically in the FIGURES, according to an exemplary embodiment the composite structure may be comprised of any of a wide variety of forms and types of layers and subcomponents to provide the form and fit and function for integration with a vehicle interior component and/or interconnectivity through a user interface with vehicle systems and other systems and data/networks. See e.g. FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27 (showing interaction with vehicle occupant by contact/touch/feel and display/lighting/illumination). According to an exemplary embodiment, the composite structure with user interface for interaction may be provided on any of a wide variety of vehicle interior components such as trim, consoles, doors, panels, surfaces, structures, seats, systems, spaces, lighting, etc. See e.g. FIGS. 1B and 2A (showing example integration of the composite structure 10 with display on surface to provide a user interface/display on with seat backs, door panels, pillars, overhead/cockpit, instrument panel, consoles, doors, visors, backrests, walls, etc.). As indicated generally, the user interface for interaction provided by the composite structure for the vehicle interior may be configured to interconnect/integrate for data communication/interchange and control/monitoring with any of a wide variety of vehicle systems (including vehicle data from systems, cameras, data sources, on-board network, etc.) and other systems (e.g. data sources, devices, objects, networks, internet, etc.) in the vehicle or external to the vehicle; according to an exemplary embodiment, the user interface may connect to devices (such as mobile phones, computing devices, etc.), systems (such as entertainment systems, gaming systems, etc.) and objects (e.g. detected/networked objects such as cargo, luggage, tags, etc.). According to an exemplary embodiment, the display of the user interface may be configured to present data/information (e.g. messages, text, images, status, reminders, directions, maps, alerts, etc.) and to present effects (e.g. display/visual effects for ambient lighting, color, tone, etc.) for decorative functions and/or user selected/preferred choice (e.g. for comfort, mood, purpose, convenience, etc.) at or on the vehicle interior component (e.g. individually or in coordination). See FIGS. 1B, 2A-2C, 3A-3T, 4A-4F, 5A-5F, 6A-6F, 7A-7F, 8A-8E, 9A-9E, 10A-10F and 11A-11E. See also FIGS. 8D and 14D (e.g. example display of vehicle camera information on user interface on surface of composite structure of vehicle interior component).

According to an exemplary embodiment, the construction of the composite structure may designed/constructed and assembled to generally integrate with vehicle interior components in fit, form and function. See e.g. FIGS. 1B and 2A-2C. For example, according to an exemplary embodiment as shown schematically in FIG. 2B, the composite structure may comprise a cover layer T (e.g. translucent/semi-transparent in effect composite/surface layer such as textile/fabric layer providing a cover or a leather material, fiber material, etc. or a poly/plastic film cover material, etc.), a functional layer shown as layer E/F/N (e.g. which may provide one function or more of separation/positioning as a positioning layer E, cushioning/compliance such as by a foam material (or fabric material) F, functionality from a functional layer N such as for heat exchanger/heating element/cooling, electrical interference protection/shielding, electronic connectivity, power interconnection for charging devices, etc.), a sensor/detector component C shown as providing a system/array (e.g. matrix, grid, etc.) to detect input such as touch/proximity or movement/gesture from a user/vehicle occupant (e.g. a detection system, touch-sensitive array, capacitive touch surface as used with touch-screen devices or other touch-sensitive material, sensor array to detect proximity/motion above the surface, etc.), a functional layer E/F/N (such as to provide shielding, light direction/diffusion such as may alter the amplitude/magnitude or color of transmitted light), a display shown as light array/display layer L such as comprising a material substrate with an array of lighting devices (e.g. such as light-emitting device/diode elements), a bonding or backing/rigidifying/attachment layer for a base/structure or substrate S (such as a molded or formed plastic base/structure for a vehicle interior component). See also FIGS. 12A-12E, 16A-16T, 17A-17O, 18A-18D, 19A-19D. As indicated in the FIGURES, according to an exemplary embodiment the layers/components of the composite structure will be selected and combined/assembled to facilitate the transmission of illumination/light from the display to and through the cover/exterior surface (e.g. with light-transmissive layer/cover to present the user interface such as with display elements 20 and 20x). See e.g. FIGS. 2B-2C and 17J-17O and 19C.

Figure 13A:
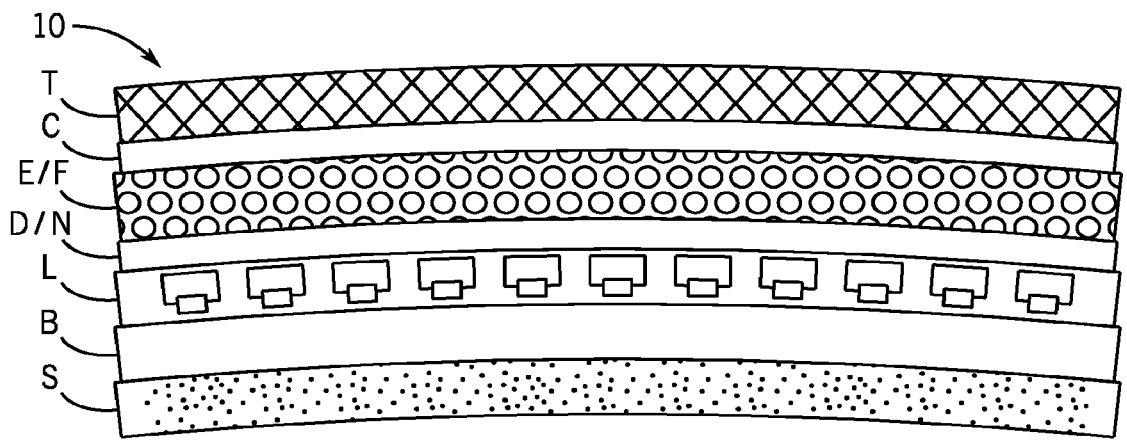
FIGS. 13A to 13D are schematic cross-section/partial views of a composite structure with cover according to an exemplary embodiment.
Figure 13B:
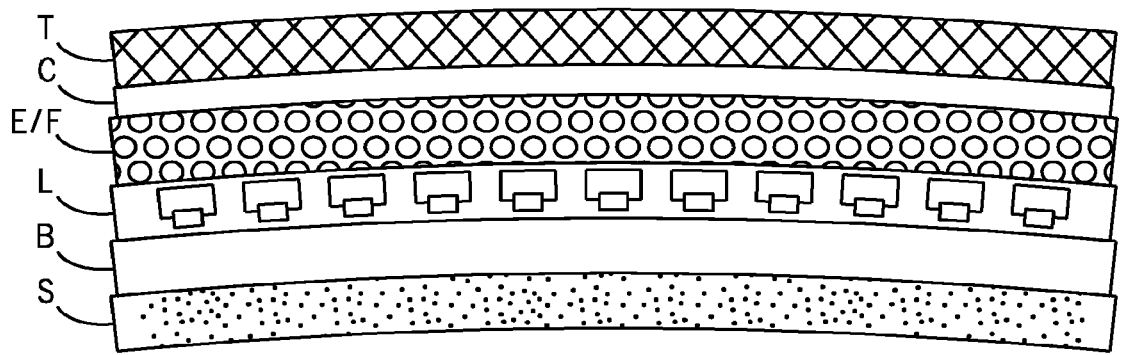
Figure 13C:
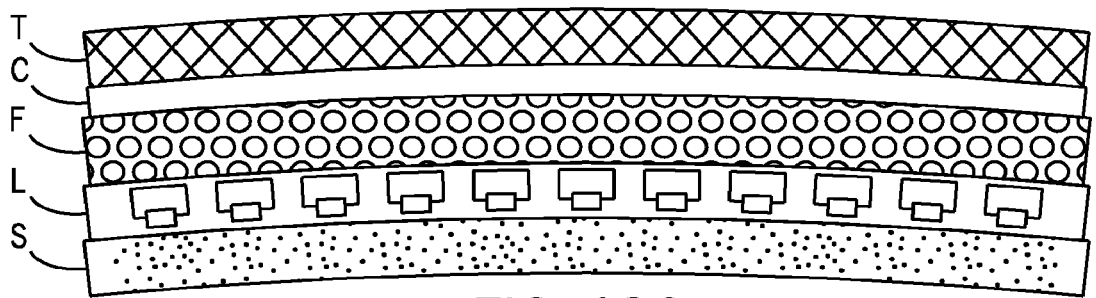
Figure 13D:
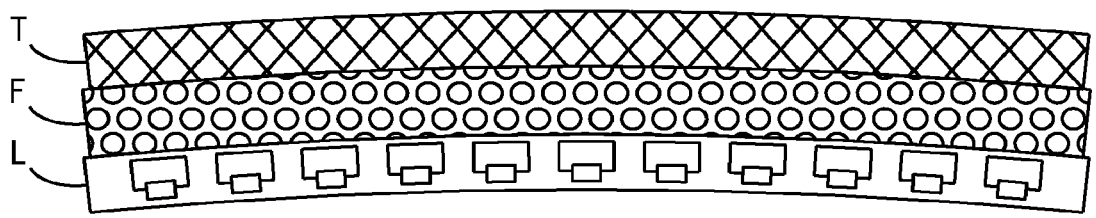
Figure 14A:
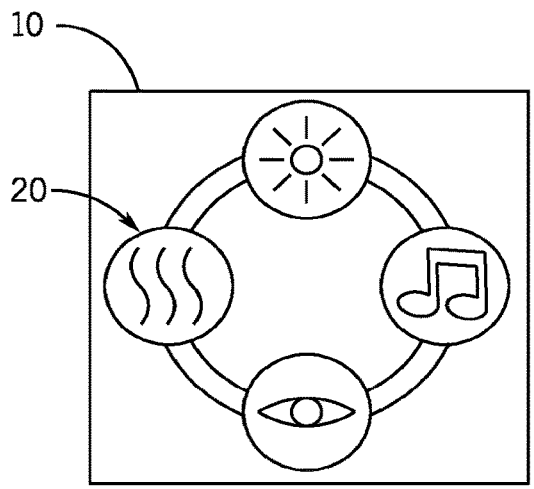
FIG. 14A is a schematic view of a display element shown as a control menu for the user interface of the composite structure for a vehicle interior component according to an exemplary embodiment.
Figure 14B:
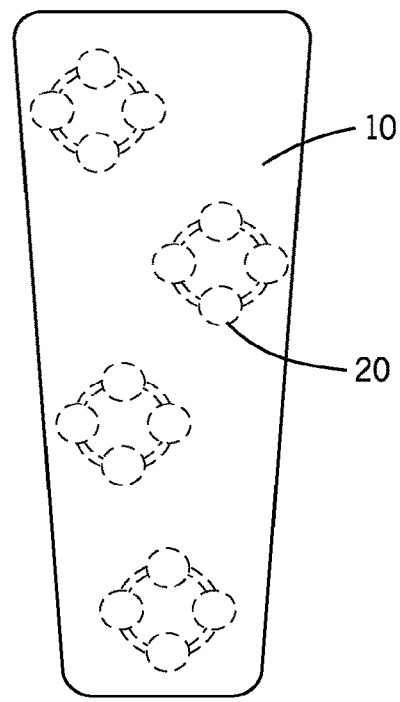
FIGS. 14B through 14E are schematic top plan views of the user interface of the composite structure according to an exemplary embodiment.
Figures 14C, 14D, 14E:
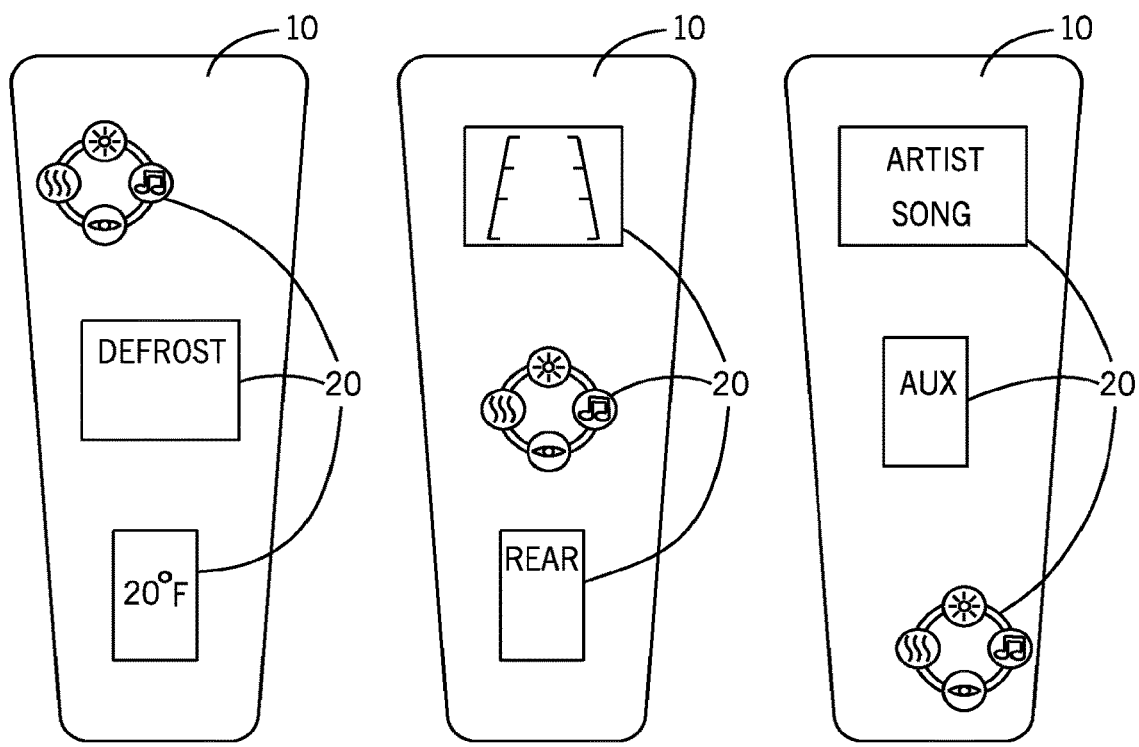
Figure 15A:
FIGS. 15A and 15B are schematic perspective views of a vehicle interior component shown as a door panel with the composite structure presenting a user interface system providing control/interaction and output of lighting levels/decorative effects for the vehicle interior according to an exemplary embodiment.
Figure 15B:
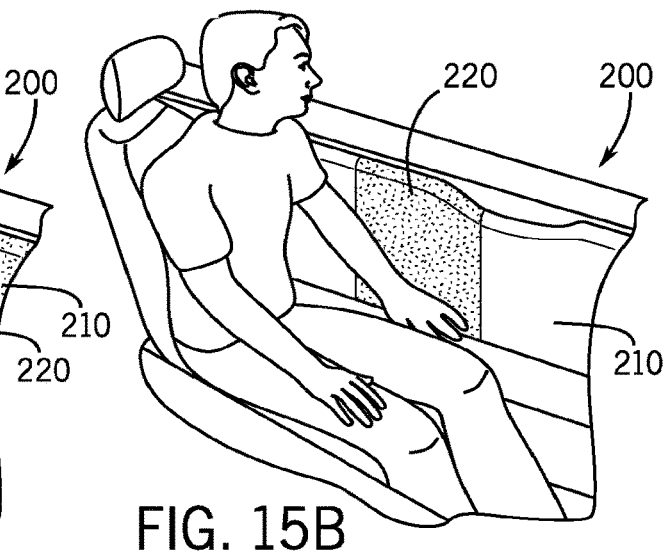
Figure 15C:
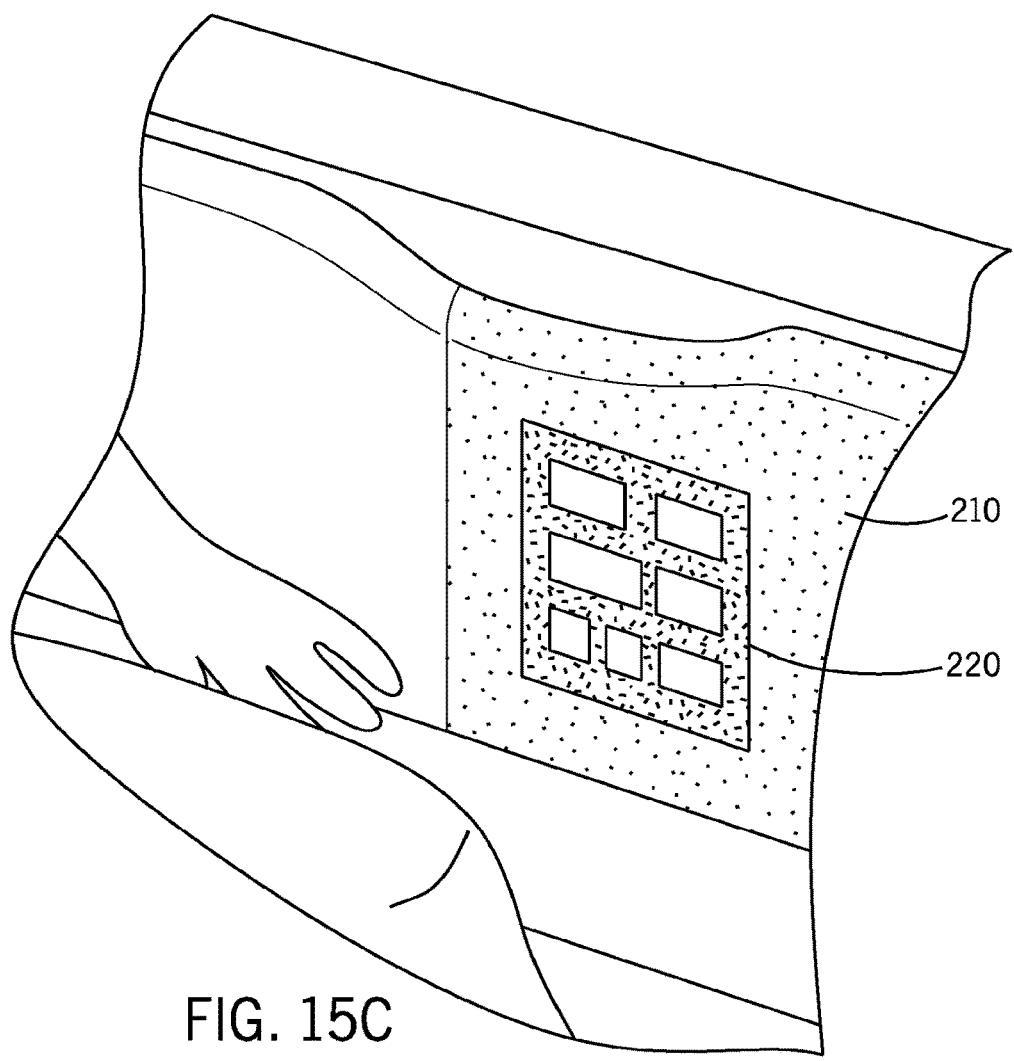
FIG. 15C is a schematic detail perspective view of a vehicle interior component shown as a door panel with the composite structure presenting a user interface system configured as a control panel and information display for the vehicle interior according to an exemplary embodiment.

According to an exemplary embodiment, including but not limited to as indicated in FIGS. 13A-13D, 16A-16T and 19A-19D, the composite structure (e.g. with cover/surface) may provide any of a wide variety of combinations of layers; for example, as indicated in FIG. 13D, the surface may be provided as a composite material with a cover T and light array layer L which may be configured to be attachable to a base layer B or substrate layer S (e.g. for connection to a panel or component in a vehicle interior). According to an exemplary embodiment the composite structure (e.g. with cover/surface) may comprise a layered construction selected for a particular purpose for a vehicle interior component with each layer in a form configured for the purpose (e.g. in construction, thickness, positioning, etc.). See e.g. FIGS. 2B, 13A-13D, 16A-16T and 17A-17O. As indicated schematically, according to an exemplary embodiment the composite structure will be configured to provide intended functionality through the combination of layers arranged and constructed for the purpose (e.g. including translucence/semi-transparence to facilitate illumination from the display layer at the user interface presented on the surface of the composite structure) to present the user interface for vehicle/other systems. See FIGS. 12C, 17J-17O, 24 and 27.

According to an exemplary embodiment as shown in the FIGURES, the composite structure 10 with a cover/exterior surface is configured to present user interface with sensor and display providing display elements 20 (e.g. icons, symbols, texts, images, panels, charging/connectivity for mobile devices, decorative effects, etc.) and connectivity to vehicle/other systems and networks; as indicated schematically, the composite structure 10 with display elements 20 at the user interface provides for integration (e.g. physically, visually, mechanically, electronically, etc.) with a wide variety of interior components and systems of the vehicle. See e.g. FIGS. 1B, 2A-2C, 3A-3T and 8A-8D. As shown schematically in the FIGURES according to an exemplary embodiment, the composite structure with user interface may be integrated in or on a vehicle interior component in a manner to provide an appearance and feel provided by the cover/exterior surface and compliant/resilient layers beneath the cover. See e.g. FIGS. 3A-3T, 12C and 17A-17O (e.g. composite structure provides for compliant pressure/compression, touch/contact at surface and movement/detection at proximity of sensor). According to an exemplary embodiment, the cover/exterior surface of the composite structure may provide tactile feedback (e.g. shear/sliding feel) in response to contact/movement by the vehicle occupant detected by the sensor to facilitate accurate and convenient use/operation by touch/contact in interaction with the interface; according to an exemplary embodiment the sensor may be configured to detect gestures/movement adjacent to the cover/exterior surface of the composite structure in interaction with the user interface. See e.g. FIGS. 3A-3T and 17A-17O. See also FIG. 27.

As shown schematically in FIGS. 3A-3T, 4A-4F, 5A-5F, 6A-6F, 7A-7F, 8A-8E, 9A-9E, 10A-10F, 11A-11E, 14A-14E, 15A-15C, 25A-25D and 27 according to an exemplary embodiment, the composite structure may be configured to provide a system and method of operating the user interface with vehicle systems and other systems/networks from the vehicle interior component. See also FIGS. 25A-25D, 26A-26B, 28A-28E and 29A-29B (functional subsystem operation according to an exemplary embodiment). According to an exemplary embodiment, the composite structure for the vehicle interior component may be constructed to provide a cover/exterior surface to present a user interface and to provide features (e.g. by material design/selection, component design/selection, assembly/layering, etc.) suitable for a vehicle interior such as system integration (user/system compatibility and connectivity), decorative appearance (look, form and shape), color/texture, softness/firmness (including combination of soft/firm by thickness, placement, etc.), feel/touch/haptic sensation (by material/component selection, assembly, thickness, etc.), resistance to dirt/stains (by cover, treatment, etc.), repellence to water/fluids (by cover, treatment, etc.), convenient to maintain/clean (by form, cover, treatment, etc.), etc. See generally FIGS. 3A-3T and 9A-9E.

According to an exemplary embodiment as indicated schematically in the FIGURES, the composite structure may provide a user interface system for vehicle systems and other systems/devices and data/network connectivity. See e.g. FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27. As indicated schematically in FIGS. 12B, 19A-19D, 23A-23B, 24 and 27, the composite structure may be provided with a control system (e.g. a computing or computer-based or microprocessor or data system such as with a computing device configured to monitor and control performance of functional subsystems of the structure/surface sensor C and display L) to provide the interconnectivity and the control/functional interface with vehicle systems and other systems/devices and data/networks (e.g. access to data sources on the vehicle/in the vehicle and external to the vehicle, on-vehicle network/networks, external networks including the internet, etc.). See also FIGS. 25A-25D, 26A-26B, 28A-28E and 29A-29B (functional subsystem operation according to an exemplary embodiment). According to an exemplary embodiment as indicated schematically in FIGS. 23A-23B, 24 and 27, the controller/control system for the user interface of the composite structure may comprise a control program and data connection (e.g. to networks including the internet, devices such as mobile devices, smart phones and tablets, data sources/storage, vehicle systems/subsystems, etc.); the controller/control system for the user interface of the composite structure may be configured with input/output interfaces to provide functionality for the vehicle occupant as indicated (for example) in FIGS. 23A-23B, 24 and 26A-26B, 27, 28A-28E and 29A-29B. See also FIGS. 1B, 2A-2C and 3A-3T.

As indicated schematically in FIGS. 3A to 3T, 24 and 27, according to an exemplary embodiment, the composite structure may be configured to provide a display element and/or control element appearing as a visual image/information content on the exterior/show surface of the cover; the display element/control element may be configured for interaction with an occupant of the vehicle; for example, an image may appear as a display element and present a control element such as a switch to actuate one or more vehicle systems and subsystems (e.g. by interface through or with the control system and vehicle systems/subsystems such as shown for example in FIGS. 4A-4F [HVAC/user comfort/ventilation/power window system, etc.], FIGS. 5A-5F [seating system], FIGS. 6A-6F [seat heating/defrost control, speed control, door/window locks, etc.]). See also FIGS. 11A-11F, 15C, 25A-25D, 26A-26B, 28A-28E and 29A-29B (functional subsystem operation through the user interface according to an exemplary embodiment).

As indicated schematically in FIGS. 2B and 7A-7F, the composite structure with cover/surface 10 may provide a variety of selective appearances (e.g. color/shading, lighting/intensity, decoration/decorative effect, etc.) of a display element 20 (e.g. menu, image, text, etc.); as indicated schematically in FIGS. 8A-8E and 15C, the composite structure may provide as display/control elements 20 a variety of visual images/effects including communications (e.g. indicators, functional displays, information display, data display, visual effect, messaging, notices/notifications, symbols, switches/controls, user interface, graphics, etc.). As indicated schematically in the FIGURES, communications/visual effects that may appear on the composite structure may be provided from any of a variety of systems/subsystems and data sources (e.g. including vehicle systems/subsystems, vehicle data, vehicle operation/instrumentation, network-data, mobile devices, etc.). For example, as indicated according to an exemplary embodiment in FIGS. 8A through 8D, the composite structure may provide data as to a vehicle system (e.g. "DOOR AJAR") or temperature (e.g. "20 C") or weather (e.g. by text and/or image) or a selected visual effect (e.g. two-tone panel) on a vehicle interior component.

As indicated schematically according to an exemplary embodiment in FIGS. 3A-3T, 4A-4F, 5A-5F, 6A-6F, 7A-7F, 8A-8E, 9A-9E, 10A-10F, 11A-11E, 14A-14E and 15A-15C, the occupant of the vehicle may through the user interface of the composite structure interact with and/or operate and control any of a variety of systems/subsystems on the vehicle and/or other devices in or connected to the vehicle (e.g. mobile phone, tablet, data/computing devices, accessories, equipment, etc.). See also 24, 26A-26B, 27, 28A-28E and 29A-29B. For example, as indicated in FIGS. 9A-9E and 10A-10E, the composite structure may provide a control element (e.g. at a designated or selective location on an interior component) for window control or exterior mirror control; as indicated schematically according to an exemplary embodiment in FIGS. 11A-11E the composite structure may provide a control interface for a mobile device PH such as a mobile/smart phone (e.g. providing telephony connection, data/internet connection, music/audio player connection, etc. by near-field communication (NFC), Bluetooth, Wi-Fi, or other data connectivity) for a vehicle occupant. See also FIGS. 3A-3T and 14A-14E.

As indicated schematically in the FIGURES, according to an exemplary embodiment the composite structure may be provided in any of a wide variety of forms to provide any of a wide variety of features and functions for a vehicle interior/component (e.g. with various combinations of layers of various types of materials/layers as indicated schematically). According to an exemplary embodiment the vehicle interior component with composite structure provides a user interface system to provide various functions and features for a vehicle/vehicle occupant as indicated schematically in the FIGURES; the composite structure/user interface system provides a visual display (through display light element array/matrix/grid layer L); the user interface/control (through a functional layer such as with the sensor providing a touch-sensitive layer C) so that information can be presented on the composite structure (such as surface 110/120) through a display of visual image/information for enhanced user interaction in a vehicle interior. See e.g. FIGS. 3A-3T, 4A-4F, 5A-5F, 6A-6F, 8A-8E, 9A-9E, 10A-10F, 11A-11F 14A-14E and 27.

According to an exemplary embodiment, a vehicle interior component may be configured to provide a user interface for a vehicle occupant in a vehicle comprising vehicle systems; the component may comprise a composite structure 10 with display/control elements 20 configured to provide the user interface. See e.g. FIGS. 2A-2C, 14A-14E and 16A-16T. According to an exemplary embodiment shown schematically, the component may comprise (a) a cover providing an exterior surface; (b) a sensor; (c) a display; (d) a functional layer; the cover may comprise a translucent layer. See e.g. FIGS. 2B and 16A-16T. According to an exemplary embodiment as shown schematically in FIGS. 17A-17O and 27, the sensor may be configured to detect input from the vehicle occupant at or adjacent to the exterior surface of the cover; the display may be configured to provide illumination at least partially visible through the exterior surface of the cover; operation of the user interface for the vehicle occupant may comprise at least one of (a) output from illumination from the display and (b) input detected by the sensor. See e.g. FIGS. 3A-3T, 14A-14E, 24 25A-25D and 27.

According to an exemplary embodiment, the cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials; the cover may comprise at least one of (a) film; (b) resin; (c) polycarbonate; (d) polyurethane; (e) polyvinyl material; (f) a composite of multiple plastic materials; (g) a composite of multiple materials. See e.g. FIGS. 13A-13D and 16A-16T.

According to an exemplary embodiment, the functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing the Peltier effect; (t) diffusion of illumination from the display; (u) monitoring; (v) recording; (w) alerting; (x) messaging; (y) light guiding; (z) flexibility. See e.g. FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27. According to an exemplary embodiment, the functional layer may comprise a positioning layer configured to retain positioning within the composite structure for operation of the sensor from input from the vehicle occupant; the positioning layer may comprise at least one of (a) a spacer; (b) a flexible spacer; (c) a shield for electromagnetic interference; (d) a foam material; (e) a plastic material. According to an exemplary embodiment, the functional layer may be at least partially integrated with at least one of (a) the cover; (b) the positioning layer; (c) a substrate of the composite structure. See e.g. FIGS. 2B-2C, 3A-3T, 16A-16T and 17A-17O.

According to an exemplary embodiment, the composite structure further may comprise a foam layer under the cover. See e.g. FIGS. 2B and 16A-16T. According to an exemplary embodiment, the composite structure may comprise a resilient layer/form. See e.g. FIGS. 12C and 17B-17C. According to an exemplary embodiment, the resilient layer may comprise the foam layer; the resilient layer may comprise or be integrated with the cover. See e.g. FIGS. 13A-13D and 16A-16T.

According to an exemplary embodiment, the user interface may be configured so that input from the vehicle occupant at the exterior surface of the cover may be detected by the sensor. According to an exemplary embodiment, input from the vehicle occupant may comprise contact with the exterior surface of the cover. See e.g. FIGS. 12A-12E, 17A-17O and 27. According to an exemplary embodiment, the user interface may be configured so that output from the display may be presented at least partially through the exterior surface of the cover. See e.g. FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, and 17J-17K. According to an exemplary embodiment, the sensor may comprise a capacitive touch panel configured to receive a touch input. See e.g. FIGS. 17D-17E.

According to an exemplary embodiment, the composite structure may comprise one of (a) the cover; (b) a positioning layer such as a spacer; (c) the sensor; (d) a foam layer; (e) the display; (f) a substrate. See e.g. FIGS. 2C and 16A-16T. According to an exemplary embodiment, the composite structure may comprise one of (a) the cover; (b) the positioning layer; (c) the sensor; (d) a diffuser layer; (e) the display; (f) a substrate. See e.g. FIGS. 13A-13D and 16A-16T. According to an exemplary embodiment, the composite structure may comprise one of (a) the cover; (b) the functional layer; (c) the sensor; (d) a positioning layer; (e) the display; (f) a substrate. See e.g. FIGS. 2C and 16A-16T.

According to an exemplary embodiment, the composite structure may be configured in a contoured shape. See e.g. FIGS. 2A-2C, 3A-3T, 18A-18D and 19A-19D. According to an exemplary embodiment, the composite structure may comprise a substrate. See e.g. FIG. 2C. According to an exemplary embodiment, the composite structure may be coupled to at least one of (a) a trim component; (b) a panel; (c) a door; (d) a surface; (e) a console; (f) a base; (g) a structure. See e.g. FIGS. 1B and 2A-2C. According to an exemplary embodiment, the composite structure may comprise one of (a) the cover; (b) a positioning layer; (c) the display; the composite structure may comprise a base or substrate. See e.g. FIGS. 2B and 16A-16T.

According to an exemplary embodiment shown schematically, the vehicle interior component with composite structure to provide a user interface with vehicle systems may comprise a control system configured to connect to vehicle systems and other systems/networks. See e.g. FIGS. 12B, 19A-19D, 24 and 27. According to an exemplary embodiment, the control system may be configured to facilitate operation by the vehicle occupant for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant. See FIGS. 2A-2C, 3A-3T, 4A-4F, 5A-5F, 6A-6F, 7A-7F, 8A-8E, 9A-9E, 10A-10F, and 11A-11E. The vehicle interior component may comprise a controller for the composite structure. See e.g. FIGS. 24 and 27. According to an exemplary embodiment, the user interface may comprise a control panel presented at the exterior surface of the cover. See e.g. FIGS. 3A-3T, 14A-14E and 15C. According to an exemplary embodiment, the controller for the composite structure may be connected to the user interface. See e.g. FIGS. 23A-23B, 24 and 27. According to an exemplary embodiment, the control system may comprise a controller configured to send a control signal to at least one vehicle system. See e.g. FIGS. 26A-26B, 27, 28A-28E and 29A-29B. According to an exemplary embodiment, the vehicle systems comprise at least one vehicle system; a vehicle system may comprise at least one of (a) an indicator, (b) a display, (c) a climate control system, (d) an entertainment system, (e) a security system, (f) an engine control unit, (g) a data storage system, (h) a database, (i) a motor, (j) a vehicle seat, (k) a window regulator/control; (l) a network; (m) a data storage system; (n) a database. See e.g. FIGS. 2A, 3A-3T, 4A-4F, 5A-5F, 6A-6F, 7A-7F, 8A-8E, 9A-9E, 10A-10F, 11A-11E, 23A-23B, 24 and 27.

According to an exemplary embodiment, the user interface may be configured for interaction with a vehicle occupant by at least one of (a) touch at the exterior surface of the cover detected by the sensor or (b) gesture adjacent to the exterior surface of the cover detected by the sensor. See e.g. FIGS. 17A-17O. According to an exemplary embodiment, the sensor may comprise at least one of (a) an array/matrix; (b) a grid; (c) a foil; (d) a panel; (e) a touch panel; (f) a flexible panel; (g) a detector; (h) a proximity detector; (i) a capacitive touch panel; (j) a pressure sensitive panel. See e.g. FIGS. 16A-16T and 21A-21E.

According to an exemplary embodiment, the display may comprise at least one of (a) an array; (b) a grid; (c) a panel; (d) a display screen; (e) a flexible panel; (f) a lighting array; (g) a lighting device array; (h) a light-emitting device array;

(i) a LED array; (j) a flexible LED array; (k) a flexible sheet. See e.g. FIGS. 20A-20H and 22A-22E. According to an exemplary embodiment, the display may be configured to display at least one of (a) data; (b) information; (c) vehicle system information; (d) an input panel; (e) a menu system; (f) an output panel; (g) an image; (h) a control panel. See e.g. FIGS. 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27. According to an exemplary embodiment, the composite structure may comprise a composite surface. See FIGS. 2A-2C and 12A-12E, 16A-16T, 17A-17O, 18A-18D and 19A-19D. According to an exemplary embodiment as shown schematically, the cover comprises an at least partially translucent cover; illumination from the display at the exterior surface of the composite structure comprises visible light at least transmitted through the sensor and through the functional layer and through the at least partially translucent cover (e.g. configured as an decorative layer/exterior surface). See e.g. FIGS. 2B, 3F and 17J-17O.

According to an exemplary embodiment shown schematically, a vehicle interior component may be configured for interaction with an occupant of a vehicle comprising vehicle systems; the component may comprise a composite structure configured to provide a user interface for interaction with the occupant. See FIGS. 12A-12E, 16A-16T, 17A-17O, 18A-18D and 19A-19D. According to an exemplary embodiment the component may comprise a cover providing an exterior surface, a sensor, a display and a functional layer; the cover may comprise a translucent layer; the sensor may be configured to detect input from the occupant at or adjacent to the exterior surface of the cover. According to an exemplary embodiment as shown schematically in FIGS. 2B and 17J-17O, the display may be configured to provide illumination at least partially visible through the exterior surface of the cover; operation of the user interface for the occupant may comprise at least one of (a) output from illumination from the display and (b) input detected by the sensor. According to an exemplary embodiment as shown schematically, the user interface may comprise a display element from illumination from the display that may be configured to be selectively positioned on the exterior surface of the cover; the display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image. See e.g. FIGS. 3A-3T, 4A-4F, 5A-5F, 6A-6F, 7A-7F, 8A-8E, 9A-9E, 10A-10F, 11A-11E, 14A-14E, 15A-15C, 25A-25D and 27. According to an exemplary embodiment, the display element of the user interface may be configured to be positioned on the exterior surface of the cover by at least one of (a) contacting of the exterior surface of the cover at a position where the display element is to be displayed when the display element is not displayed; (b) contacting the exterior surface of the cover where the display element is displayed and dragging the display element along the exterior surface of the cover to a position where the display element is to be displayed. See e.g. FIGS. 3A-3E, 3G and 3H-3I. See also FIGS. 17A-17O, 26A-26B, 27, 28A-28E and 29A-29B.

According to an exemplary embodiment, a vehicle interior component may be configured to provide a user interface for a vehicle occupant in a vehicle comprising vehicle systems. See e.g. FIGS. 1B, 2A, 3A-3T, 4A-4F, 5A-5F, 6A-6F, 7A-7F, 8A-8E, 9A-9E, 10A-10F, 11A-11E, 14A-14E, 15A-15C, 25A-25D and 27. According to an exemplary embodiment shown schematically, the component may comprise a composite structure configured to provide the user interface; the cover may comprise a translucent layer; the sensor may be configured to detect input from the vehicle occupant at or adjacent to the exterior surface of the cover; the display may be configured to provide illumination at least partially visible through the exterior surface of the cover; operation of the user interface for the vehicle occupant may comprise at least one of (a) output from illumination from the display and (b) input detected by the sensor. See FIGS. 3A-3T, 16A-16T and 17A-17O and 27.

Figure 17A:
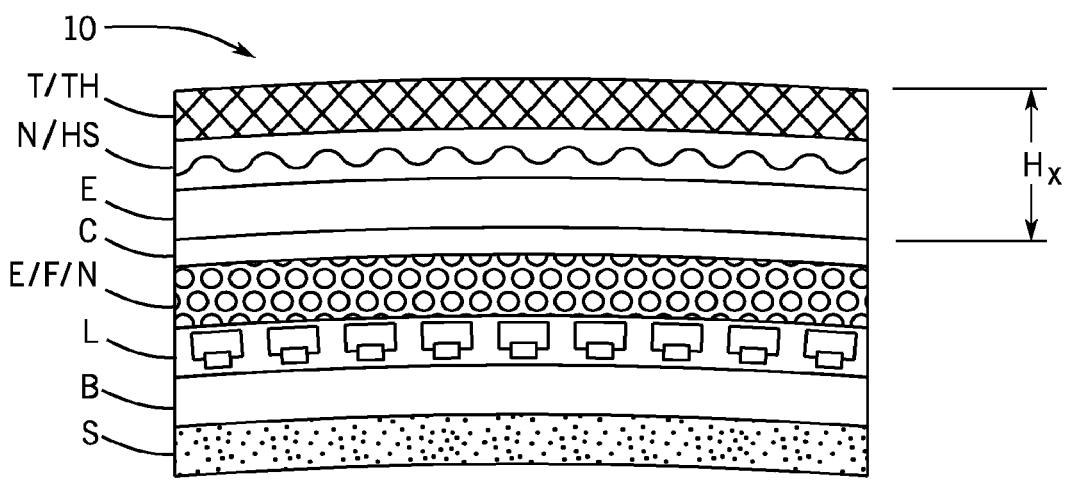
FIG. 17A is a schematic cross-section view of a composite structure with cover according to an exemplary embodiment.
Figures 17B, 17C:
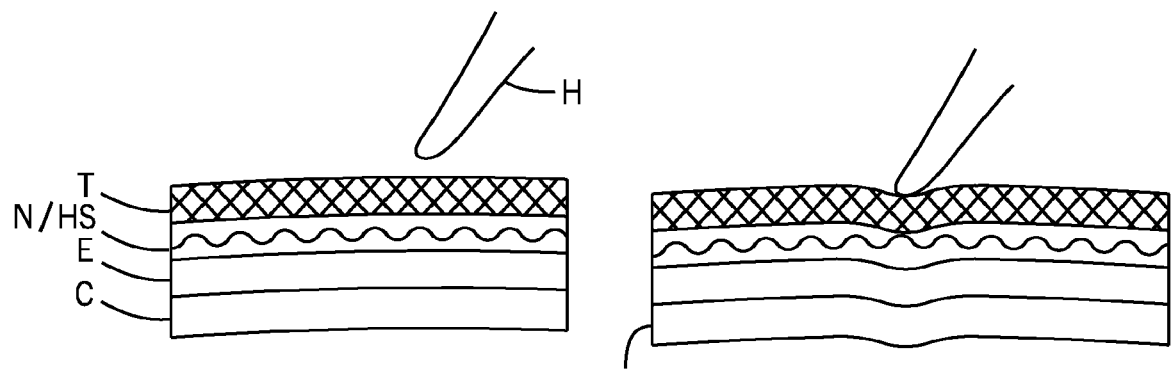
FIGS. 17B to 17O are schematic cross-section views of interaction by a vehicle occupant with a composite structure with cover according to an exemplary embodiment.
Figures 17D, 17E:
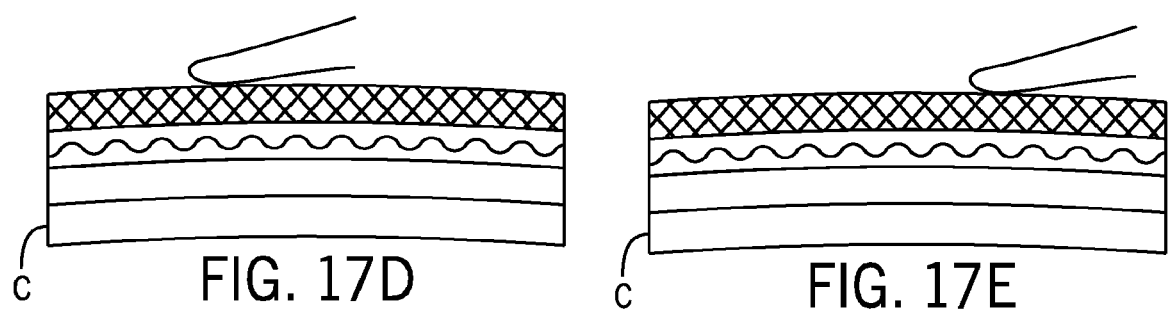
Figures 17F, 17G:
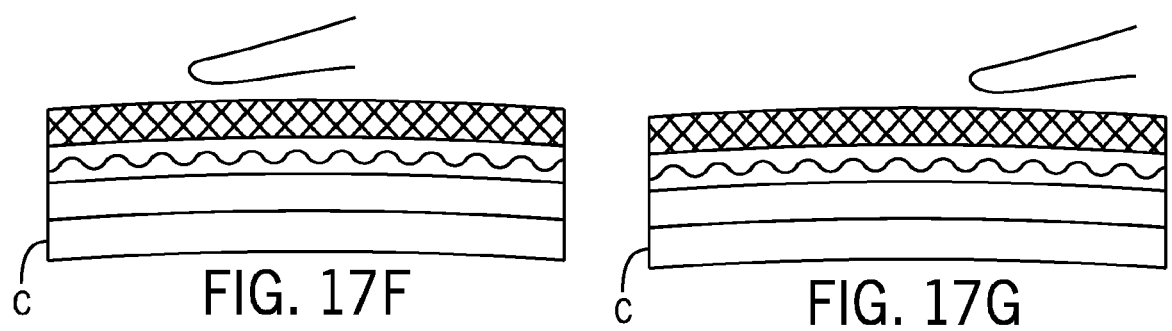
Figure 17H:
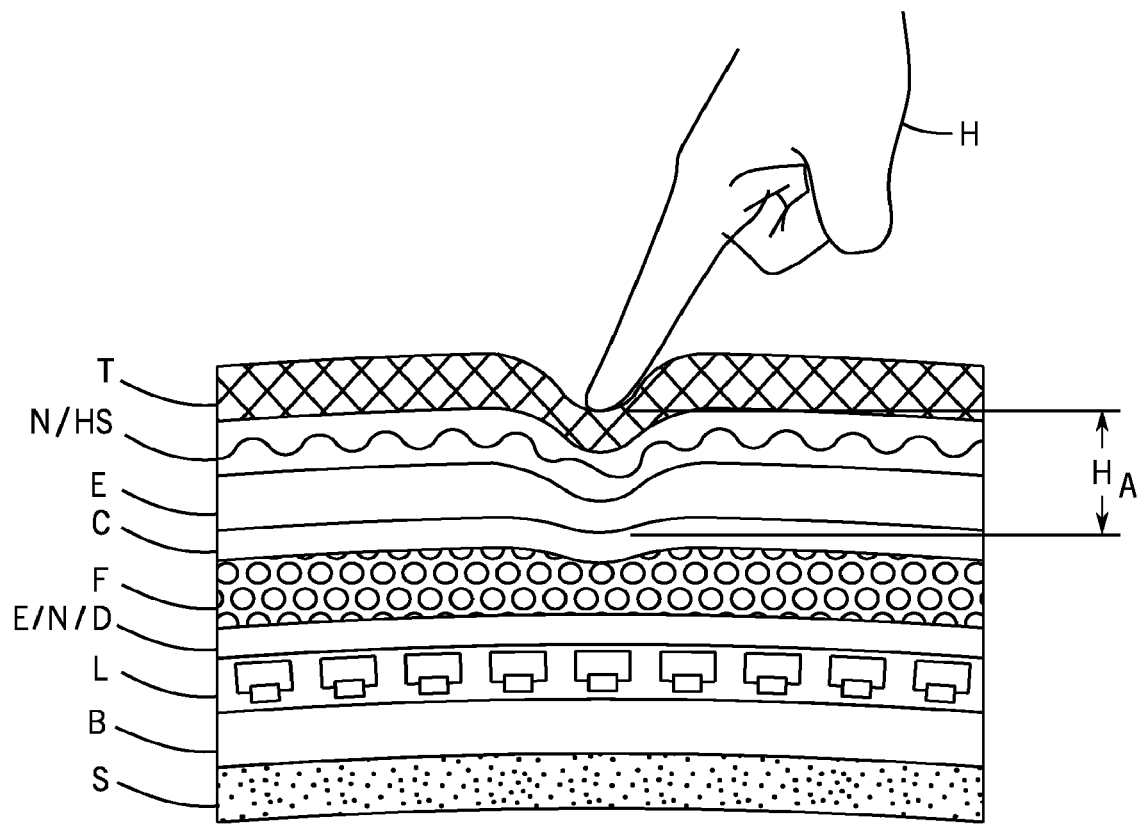
Figure 17I:
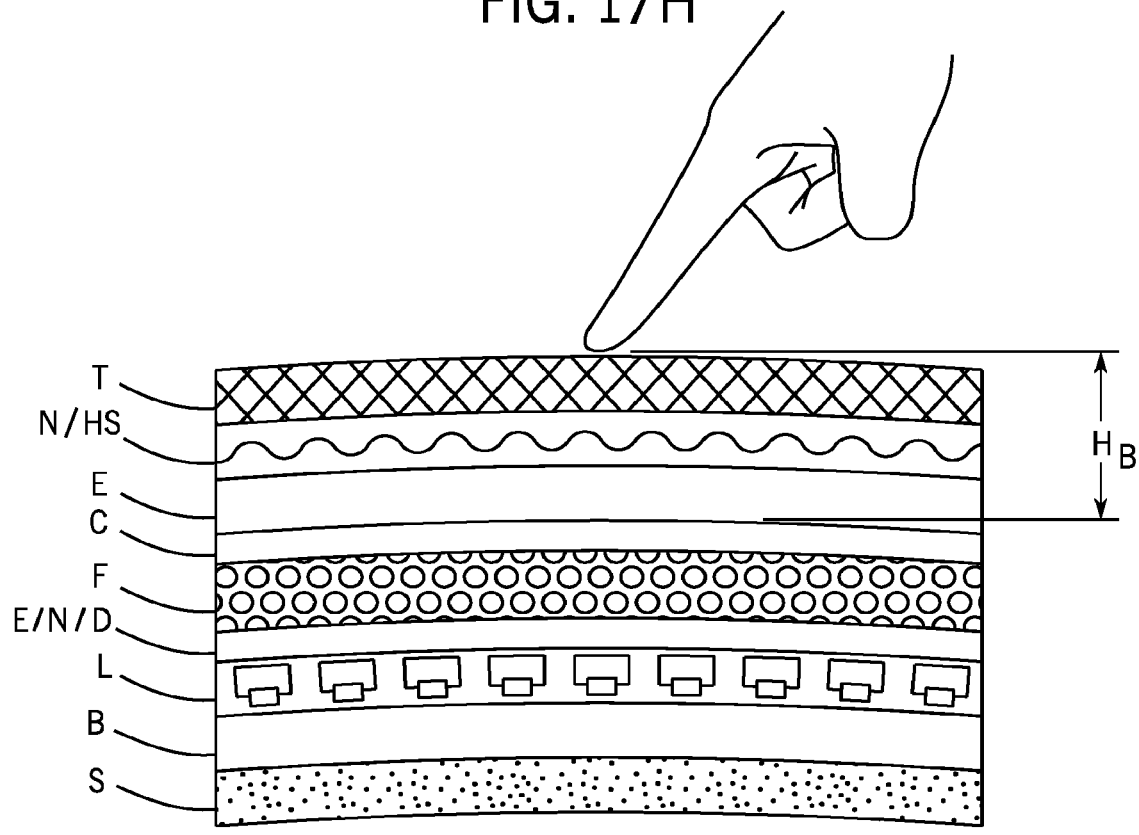
Figure 17J:
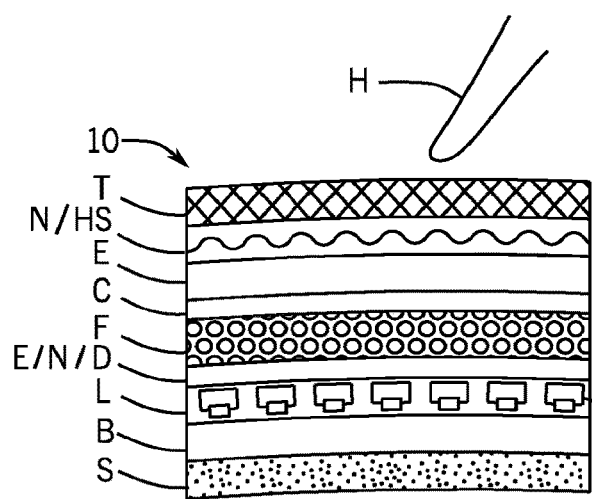
Figure 17K:
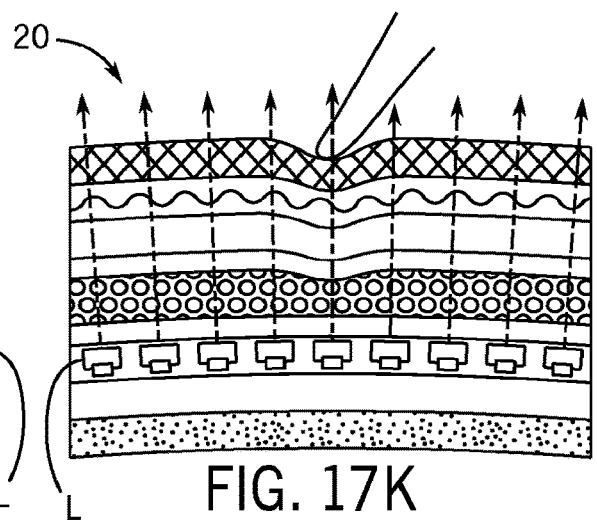
Figure 17L:
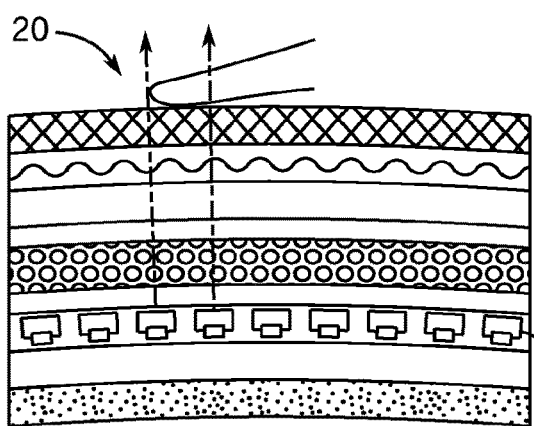
Figure 17M:
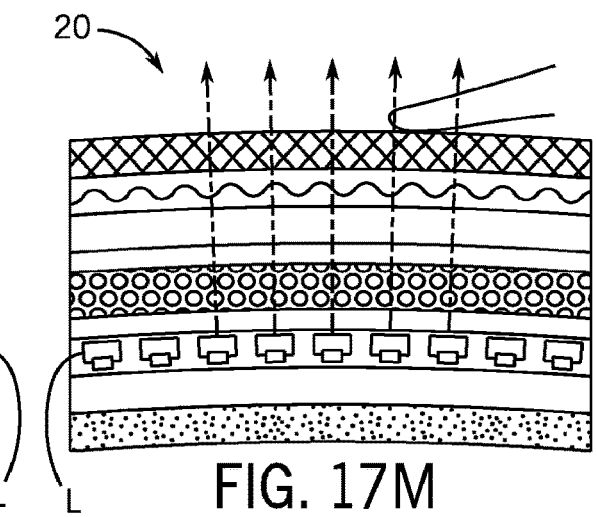
Figure 17N:
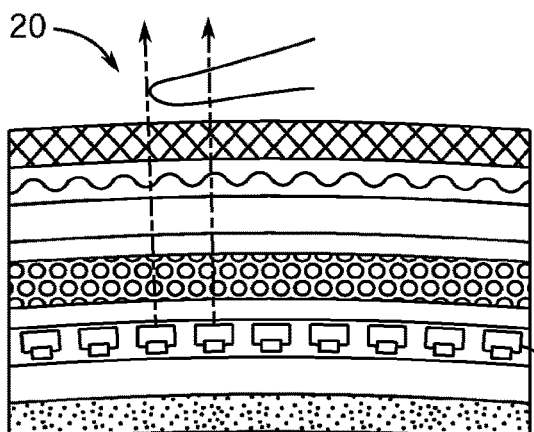
Figure 17O:
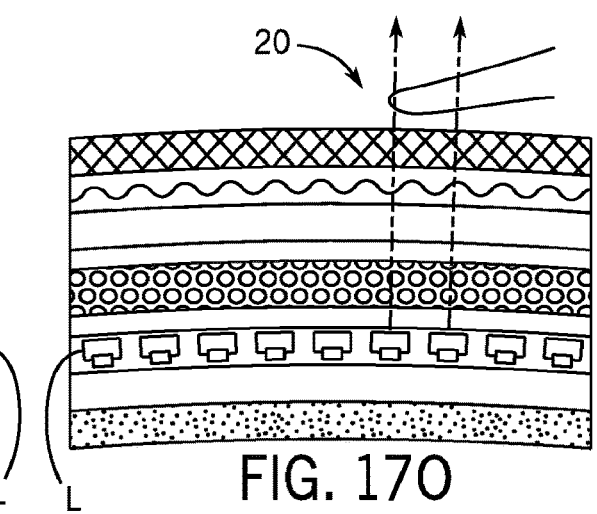
Figure 18A:
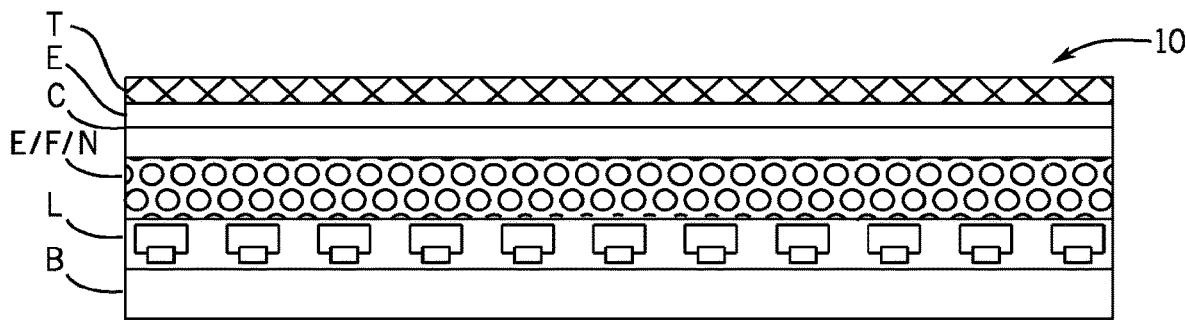
FIGS. 18A to 18D are schematic cross-section views of a composite structure with cover according to an exemplary embodiment.
Figure 18B:
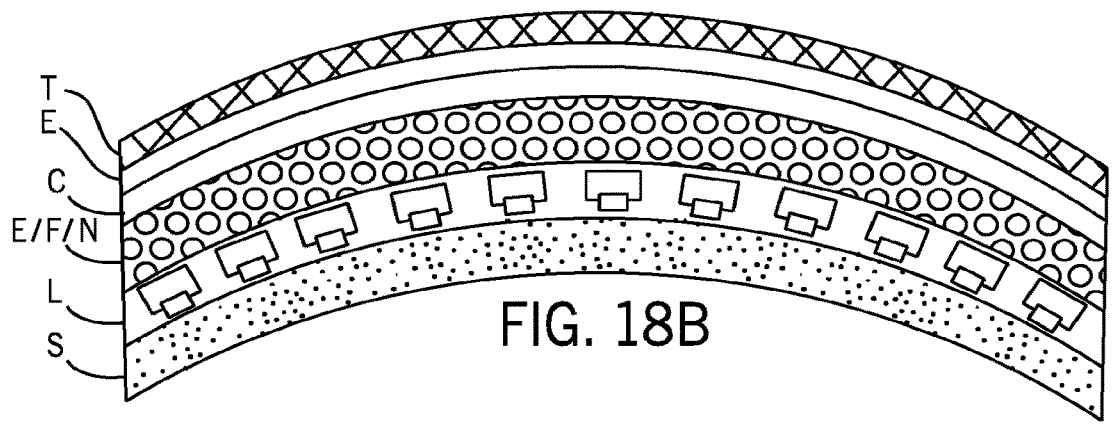
Figure 18C:
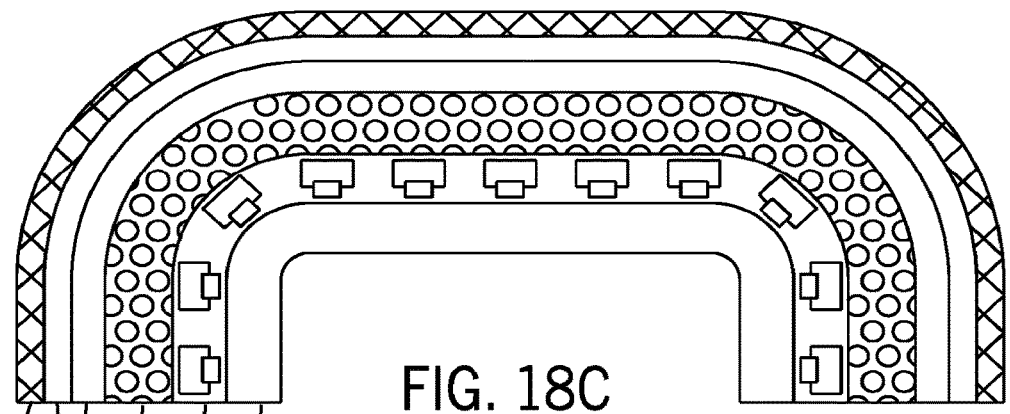
Figure 18D:
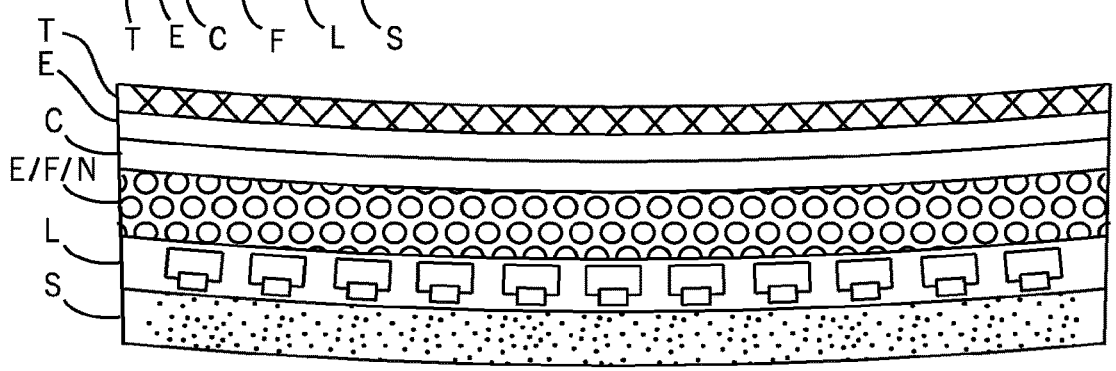
Figure 19A:
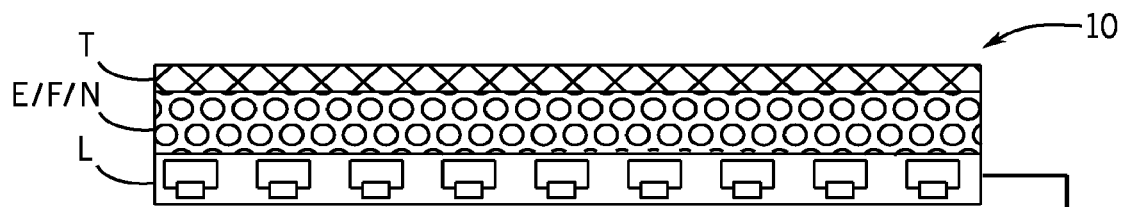
FIGS. 19A to 19D are schematic cross-section views of a composite structure with cover according to an exemplary embodiment.
Figure 19B:
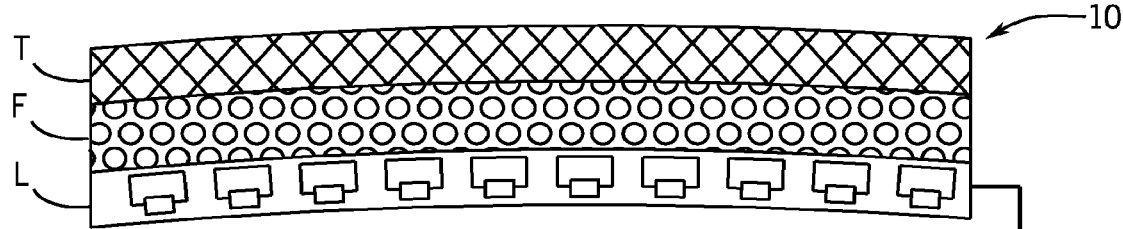
Figure 19C:
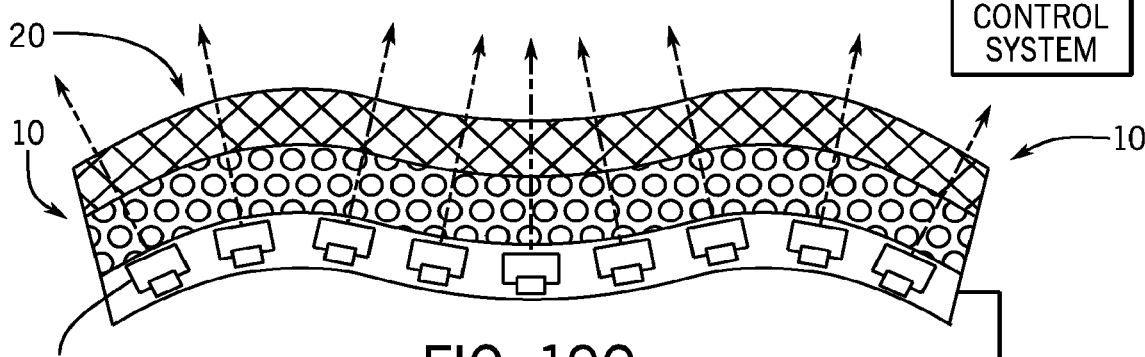
Figure 19D:
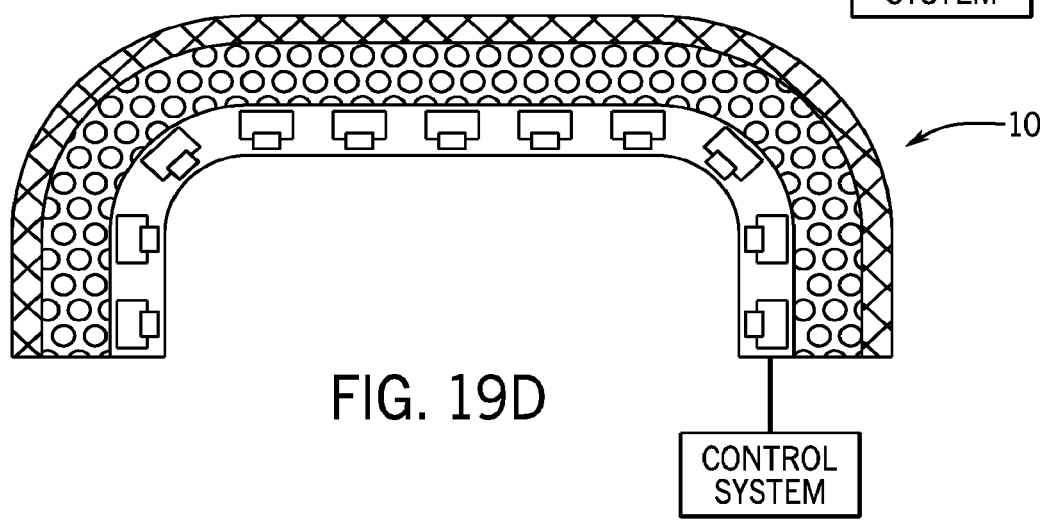
Figure 20A:
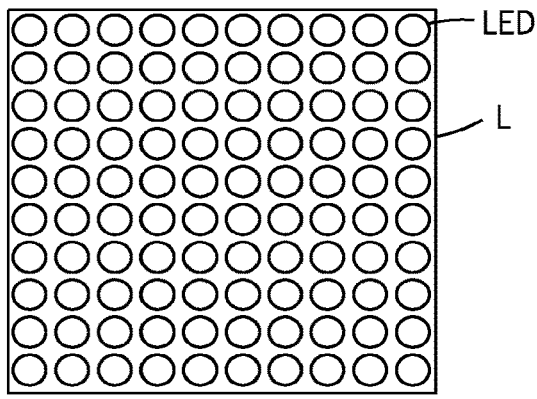
FIGS. 20A and 20B and 20H are schematic top plan views of a display shown as an LED array layer for a composite structure to provide a user interface on a vehicle interior component according to an exemplary embodiment.
Figure 20B:
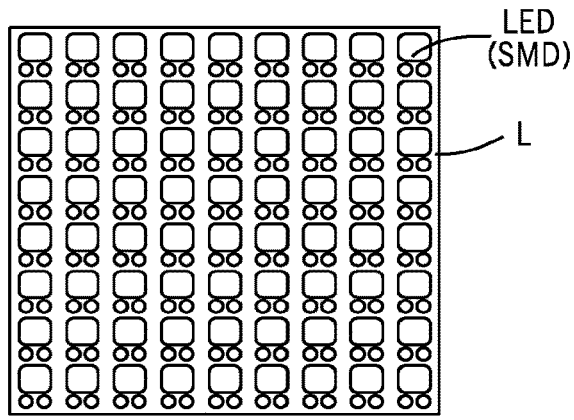
Figure 20C:
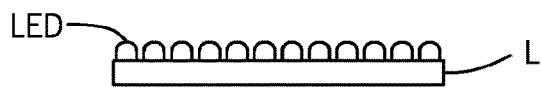
FIGS. 20C and 20D and 20G are schematic side elevation views of a display shown as an LED array layer for a composite structure to provide a user interface on a vehicle interior component according to an exemplary embodiment.
Figure 20D:
Figure 20E:
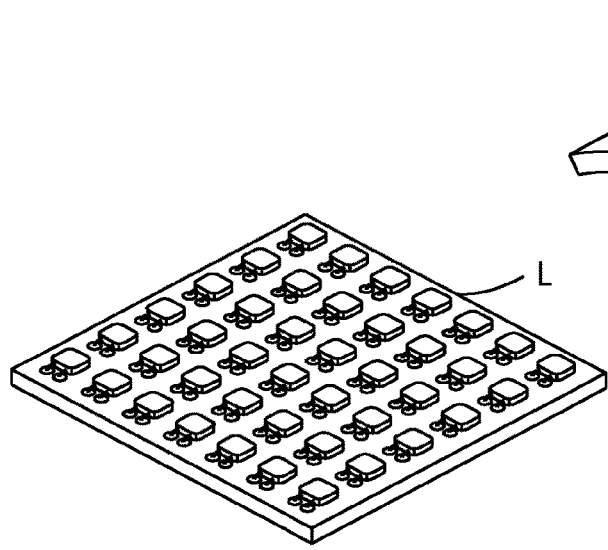
FIGS. 20E and 20F are schematic perspective views of a display shown as an LED array layer for a composite structure to provide a user interface on a vehicle interior component according to an exemplary embodiment.
Figure 20F:
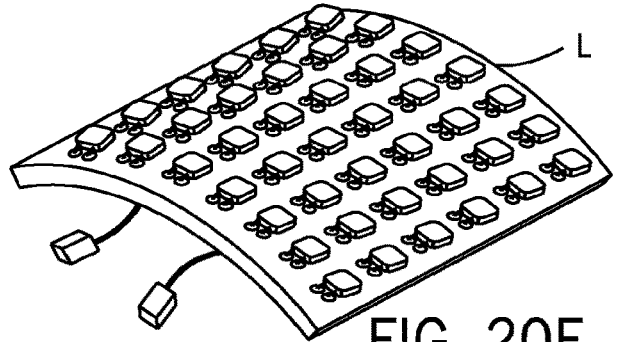
Figure 20G:
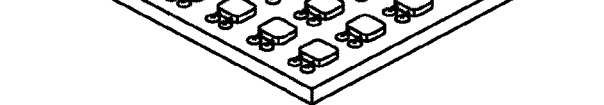
Figure 20H:
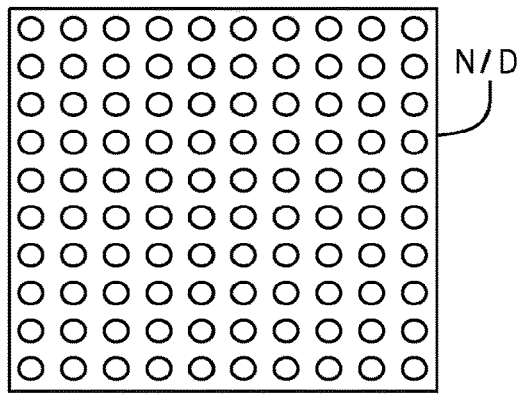
Figure 21A:
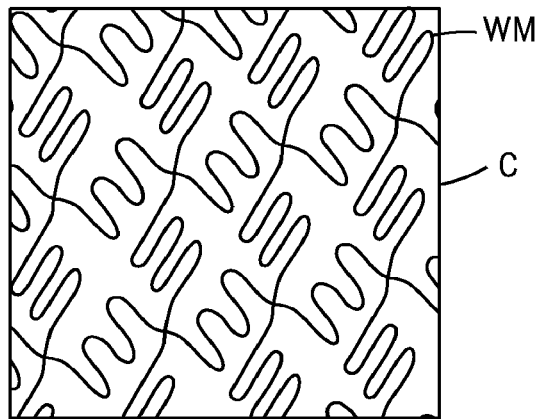
FIGS. 21A and 21B are schematic top plan views of a sensor shown as a capacitive sensor array layer for a composite structure to provide a user interface on a vehicle interior component according to an exemplary embodiment.
Figure 21B:
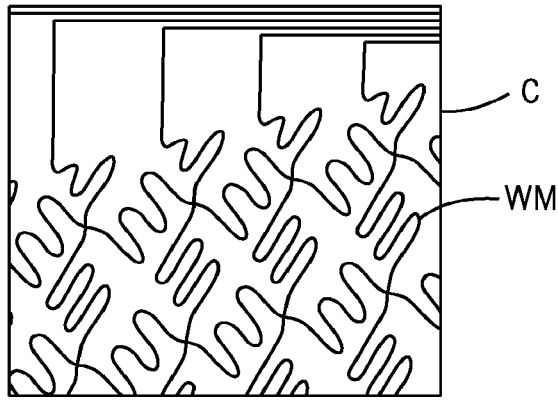
Figure 21C:
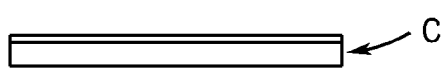
FIGS. 21C and 21D are schematic side elevation views of a sensor shown as a capacitive sensor array layer for a composite structure to provide a user interface on a vehicle interior component according to an exemplary embodiment.
Figure 21D:
Figure 21E:
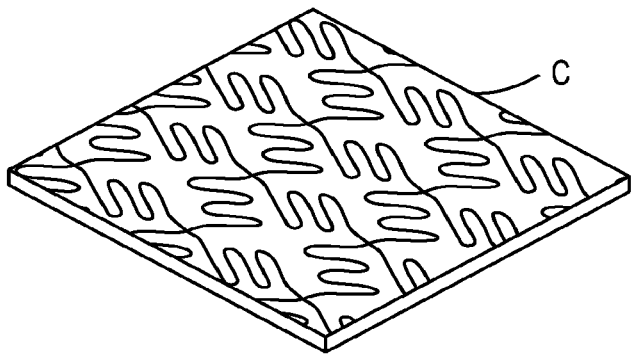
FIGS. 21E and 21F are schematic perspective views of a sensor shown as a capacitive sensor array layer for a composite structure to provide a user interface on a vehicle interior component according to an exemplary embodiment.
Figure 21F:
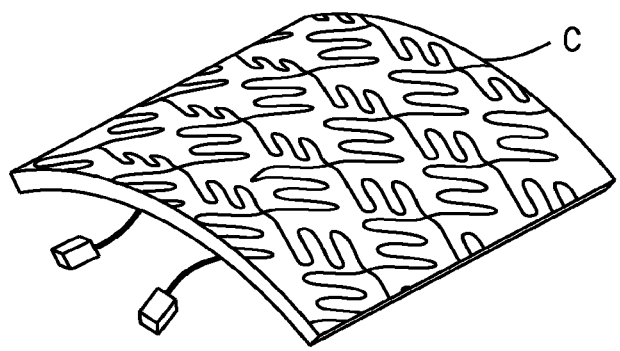
Figure 22A:
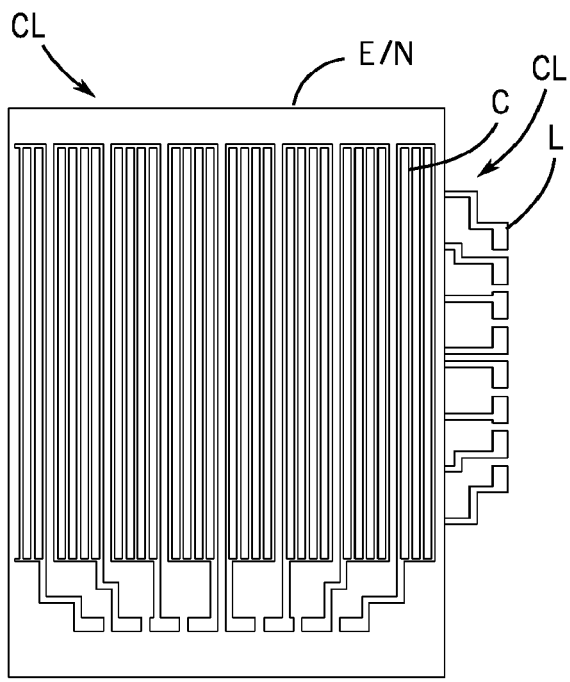
FIG. 22A is a schematic top plan view of a sensor-display module for a composite structure to provide a user interface on a vehicle interior component according to an exemplary embodiment.
Figure 22C:
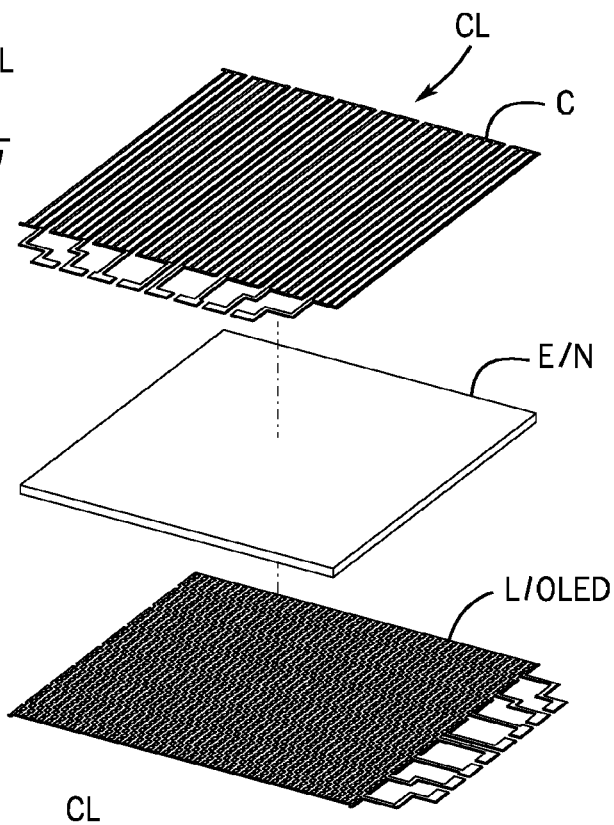
FIGS. 22C and 22E are schematic perspective views of a sensor-display module for a composite structure to provide a user interface on a vehicle interior component according to an exemplary embodiment.
Figure 22B:
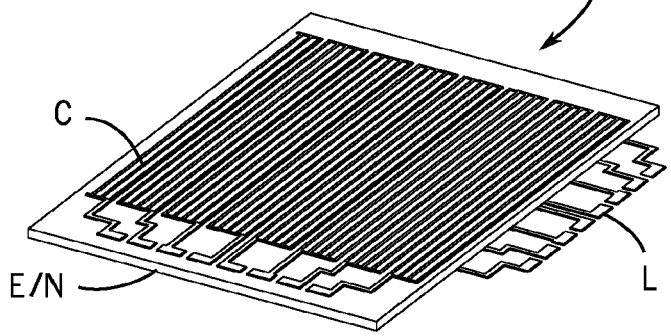
FIG. 22B is a schematic exploded perspective view of a sensor-display module for a composite structure to provide a user interface on a vehicle interior component according to an exemplary embodiment.
Figure 22D:
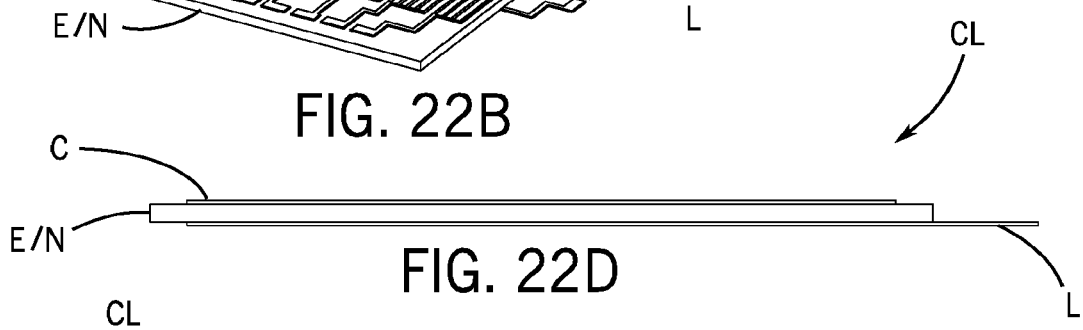
FIG. 22D is a schematic side elevation view of a sensor-display module for a composite structure to provide a user interface on a vehicle interior component according to an exemplary embodiment.
Figure 22E:
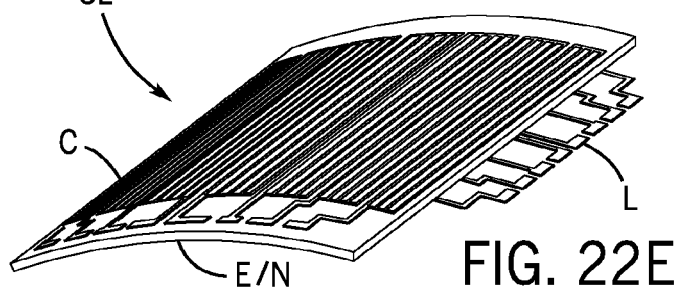

According to an exemplary embodiment as shown schematically in FIGS. 17A-17O, the user interface may be configured (a) to be activated for operation by compressing the cover toward the sensor (see distance HA in FIG. 17H); (b) to be operated by contacting the exterior surface within a distance where input can be detected by the sensor (see distance HB in FIG. 17I); (c) to be operated by movement directed by the vehicle occupant above the exterior surface of the cover within a distance where input can be detected by the sensor (see FIGS. 17F-17G). According to an exemplary embodiment, the user interface may be configured for interaction with a vehicle occupant by at least one of (a) touch at the exterior surface of the cover detected by the sensor or (b) movement/gesture adjacent to the exterior surface of the cover detected by the sensor. See e.g. FIGS. 17B-17G. According to an exemplary embodiment, the user interface may be configured for (a) a sleep mode (e.g. low power consumption, display off, etc.) and awakening from the sleep mode by compressing the cover toward the sensor by a first threshold distance and (b) for an awake mode (e.g. ready for operation/interface with vehicle occupant) providing a control panel and operating the control panel by touching the exterior surface of the cover within a second threshold distance from the sensor. See e.g. FIGS. 17A and 17H-17I. See also FIGS. 26A-26B, 27, 28A-28E and 29A-29B (flow diagrams of operation according to an exemplary embodiment).

According to an exemplary embodiment, the user interface may comprise a display element on the exterior surface of the cover. According to an exemplary embodiment as shown schematically for example in FIGS. 2A-2C, 3A-3T, 8A-8E, 10A-10E, 11A-11F and 14A-14E, the display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image. According to an exemplary embodiment, the display/design element (e.g. icon, symbol, image, message, button, etc.) of the user interface may be configured to be selectively positionable on the exterior surface of the cover by interaction with the vehicle occupant. See e.g. FIGS. 2A-2B, 3A-3E, 3G, 3H-3I, 3K-3T and 27.

According to an exemplary embodiment, a vehicle interior component may be configured to provide a user interface for a vehicle occupant in a vehicle comprising vehicle systems. See e.g. FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27. According to an exemplary embodiment shown schematically, the component may comprise a composite structure configured to provide the user interface; the cover may comprise a translucent layer; the cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material;

(m) a fleece material; (n) a woven material; (o) a non-woven material; (p) a sheet material; (q) a perforated material; (r) a composite of multiple fiber materials. See FIGS. 2B and 16A-16T. According to an exemplary embodiment as shown schematically in FIGS. 2A-2C, 3A-3T, 8A-8E, 17J-17O and 27, the sensor may be configured to detect input from the vehicle occupant at or adjacent to the exterior surface of the cover; the display may be configured to provide illumination at least partially visible through the exterior surface of the cover; operation of the user interface for the vehicle occupant may comprise at least one of (a) output from illumination from the display and (b) input detected by the sensor. See also FIGS. 26A-26B, 28A-28E and 29A-29B.

According to an exemplary embodiment, a vehicle interior component may be configured to provide a user interface for a vehicle occupant in a vehicle comprising vehicle systems; the component may comprise a composite structure configured to provide the user interface. See FIGS. 2A-2B, 24 and 27. According to an exemplary embodiment as shown schematically, the cover may comprise a translucent layer; the sensor may be configured to detect input from the vehicle occupant at or adjacent to the exterior surface of the cover; the display may be configured to provide illumination at least partially visible through the exterior surface of the cover. According to an exemplary embodiment as shown schematically, the functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing the Peltier effect; (t) diffusion of illumination from the display; (u) monitoring; (v) recording; (w) alerting; (x) messaging. See e.g. FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27. According to an exemplary embodiment, operation of the user interface for the vehicle occupant may comprise at least one of (a) output from illumination from the display and (b) input detected by the sensor. See e.g. FIGS. 3A-3T and 17A-17O and 27.

According to an exemplary embodiment, a method of operating a vehicle interior component comprising a composite structure to provide a cover with an exterior surface and a sensor and a display configured to provide a user interface for a vehicle occupant in a vehicle comprising vehicle systems may comprise the steps of: (a) to activate the user interface for operation compressing the cover toward the sensor to a distance where input can be detected by the sensor; and (b) to operate and/or to position the user interface contacting the exterior surface within a distance where input can be detected by the sensor. According to an exemplary embodiment, the cover may comprise a translucent layer/material. See FIGS. 12C, 17A-17O and 27. See also FIGS. 26A-26B, 28A-28E and 29A-29B. According to an exemplary embodiment, the sensor may be configured to detect input from the vehicle occupant at or adjacent to the exterior surface of the cover from at least one of (a) touch or (b) pressure or (c) proximity or (d) movement or (e) gesture. See FIGS. 17A-17O and 27. According to an exemplary embodiment, the display may be configured to provide illumination at least partially visible through the exterior surface of the cover. See FIGS. 2B and 17J-17K. According to an exemplary embodiment, the cover may comprise a translucent layer. See FIGS. 16A-16T and 17A-17O. According to an exemplary embodiment, the sensor may be configured to detect input from the vehicle occupant at or adjacent to the exterior surface of the cover; as shown schematically, the sensor C may comprise a mesh/grid of a commercially available configuration with elements shown as conductors WM configured into an array/matrix that can be connected to a controller/control system. See e.g. FIGS. 21A-21D, 23A, 24 and 27.

According to an exemplary embodiment, a method of operating a vehicle interior component comprising a composite structure to provide a cover with an exterior surface and a sensor and a display configured to provide a user interface for a vehicle occupant in a vehicle comprising vehicle systems may comprise the steps of: (a) pressing the cover toward the sensor to a distance where input can be detected by the sensor; and (b) contacting the exterior surface within a distance where input can be detected by the sensor. See FIGS. 17A-17O and 27. See also FIGS. 26A-26B, 28A-28E and 29A-29B. The cover may comprise a translucent layer; the sensor may be configured to detect input from the vehicle occupant at or adjacent to the exterior surface of the cover from at least one of (a) touch; (b) pressure; (c) proximity; (d) movement; (e) gesture; (f) positioning. The display may be configured to provide illumination at least partially visible through the exterior surface of the cover; operation of the user interface for the vehicle occupant may comprise at least one of (a) output from illumination from the display and (b) input detected by the sensor. See FIGS. 17A-17O and 27. The step of pressing the cover toward the sensor may comprise compressing the cover toward the sensor to a first threshold distance where input can be detected by the sensor to actuate the user interface. The step of contacting the exterior surface may comprise contact within a second threshold distance where input can be detected by the sensor to operate and/or to position the user interface. See FIGS. 17H and 17I (distance HA and distance HB). The step of pressing the cover toward the sensor may comprise deforming the composite structure at least partially. See e.g. FIG. 12C. The method may further comprise the step of movement at or adjacent the exterior surface detected as input by the sensor; the step of contacting the exterior surface within a second threshold distance may not require deformation of the composite structure. See FIGS. 17A-17O and 27.

According to an exemplary embodiment, a vehicle interior component may be configured to provide a user interface for a vehicle occupant in a vehicle comprising vehicle systems. The component may comprise a composite structure configured to provide the user interface with a cover providing an exterior surface and a sensor and a functional layer. See e.g. FIGS. 2B and 16A-16T. The cover may comprise a translucent layer. The cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials. The sensor may be configured to detect input from the vehicle occupant at or adjacent to the exterior surface of the cover from at least one of (a) touch; (b) pressure; (c) proximity; (d) movement; (e) gesture; (f) positioning; operation of the user interface for the vehicle occupant may comprise input detected by the sensor. See FIGS. 17A-17O and 27. See also FIGS. 26A-26B, 28A-28E and 29A-29B.

According to an exemplary embodiment, a vehicle interior component may be configured to provide a user interface for a vehicle occupant in a vehicle comprising vehicle systems. See e.g. FIGS. 3A-3T, 24 and 27. The component may comprise a composite structure configured to provide the user interface with a cover providing an exterior surface and a display and a functional layer. See FIGS. 2B, 13A-13D and 16A-16T. The display may be configured to provide illumination at least partially visible through the functional layer and through the exterior surface of the cover; interaction with the user interface for the vehicle occupant may comprise visible output from illumination from the display. See e.g. FIGS. 3A-3T and 17J-17O.

According to an exemplary embodiment, a vehicle interior component may comprise one of (a) a surface layer positioned on top of other layers at least partly translucent and at least partly accessible by hand for a user, (b) a layer with a capacitive touch panel, (c) a layer with a flexible spacer (e.g. spacer fabric, fabric spacer, foam material, etc.), and (d) a display covered by the surface. See FIGS. 2A-2C and 16A-16T. According to an exemplary embodiment, the surface layer/cover, sensor shown as capacitive touch panel, positioning/spacer layer and display may be combined (e.g. in a stack) to create a configuration for a user interface area characterized by a soft and at least partly translucent surface; as indicated, sufficient areas of the layers between the display and the surface are translucent for the light emitted from the display; the sensor such as a capacitive touch panel may be provided with a trigger position on or below the surface from the view of the user (e.g. to operate as a switch to activate the user interface); the area of the cover/surface of the composite structure presenting the user interface may be used as an integrated control/touch panel (e.g. for input) and display panel (e.g. for output). See e.g. FIGS. 3A-3T and 17J-17O.

According to an exemplary embodiment as shown schematically in FIGS. 2A-2C, the composite structure may comprise a translucent exterior/cover surface (e.g. "A-surface" or "show surface" in the vehicle) and provide a contoured/formed surface or three-dimensional shape (e.g. holding a shape of regular geometrical bodies/structures for vehicle interior components). According to an exemplary embodiment as shown schematically in FIGS. 12A-12E, 13A-13D, 16A-16B, and 17A-17O, the functional/foam/positioning layer of the composite structure may comprise a flexible material/spacer configured to be deformed by the vehicle occupant in use/operation of the user interface; according to an exemplary embodiment shown schematically in FIGS. 12C and 17J-17K, deformation of the surface of the composite structure at the user interface operates as a switch to activate the user interface for operation (and deactivate according to an exemplary embodiment) (e.g. when the sensor detects a "trigger"/threshold proximity the user interface is switched on/activated to be operational). See also FIGS. 26A-26B, 27, 28A-28E and 29A-29B.

According to an exemplary embodiment as shown schematically in FIGS. 12A-12C and 16A-16T, the translucent surface may comprise a textile/fabric/sheet and/or a fleece and/or a plastic (such as like polycarbonate PC, polyurethane PUR, polyvinyl chloride PVC, etc. in a layer/cover or film) and/or leather and/or natural fiber; the surface material may be perforated to improve the visibility of the illumination/light from the display. See e.g. FIG. 20H. According to an exemplary embodiment as shown schematically, the positioning/functional/foam layer that may provide the spacer E may comprise a fabric and/or a foam material that is deformable (e.g. fabric, spacer fabric, foam, polyurethane, fiber material, woven material, etc.); and the spacer may be configured to perform electromagnetic (e.g. EMV) shielding and may be configured to shield/direct light from the display/LED array for the user interface (e.g. directing light from display/LED elements to the surface). See e.g. FIGS. 2B, 13A-13D, 16A-16T and 20G-20H.

According to an exemplary embodiment as shown schematically in FIGS. 20A-20H and 22A-22E, the display may comprise at least one light emitting diode system; the display system may comprise an array of light emitting diodes (e.g. such as surface mount LED elements on a flexible material); according to an exemplary embodiment the display system may comprise an light array such as a conventional flexible LED array/panel system or a high resolution OLED array/panel system. See FIGS. 16A-16T (showing light array such as LED/OLED array). See also FIGS. 22A-22E (display/sensor module shown schematically with high resolution LED/OLED array). As indicated schematically in FIG. 12D, the light array/display layer L may comprise an array of light-emitting diode (LED) elements operable as a display to present various images, text, messages, etc. See e.g. FIGS. 2A-2C, 3A-3T, 4A-4F, 5A-5F, 6A-6F, 7A-7F, 8A-8E, 9A-9E, 10A-10F, 11A-11E and 14A-14E. As shown schematically in FIGS. 20A-20H and 22A-22E, the array may be sized and configured with a resolution suitable for the application/use (e.g. with smaller LED elements, with closer-positioned LED elements, with surface-mount LED elements [e.g. sized 20 to 50 mm or other size] with varied brightness/color or optical performance, with power consumption/efficiency, etc.) as intended or selected for the purpose/need in the vehicle interior. See e.g. FIGS. 1B, 2A-2C, 3A-3T and 15A-15C. According to an exemplary embodiment, the display L of the composite structure 10 presenting the user interface with display elements 20 may comprise a commercially available configuration (e.g. panel, array, etc.) that can be connected to a controller/control system for operation/functionality and interaction with vehicle systems and other systems (e.g. data/network connectivity). See e.g. FIGS. 2A-2B, 20A-20H, 23B, 24 and 27.

According to an exemplary embodiment as shown schematically in FIGS. 3A-3T and 8A-8E, in operation of the user interface, the display may be configured to selectively emit light in response to a signal from the sensor; the sensor may be configured to receive an input and transmit a signal (e.g. the sensor such as a capacitive touch panel may be configured for decreased electrical resistance as pressure may be applied to the panel). See also FIGS. 23A-23B, 24 and 27. According to an exemplary embodiment as shown schematically in FIGS. 2B, 12A-12E, 13A-13D, 16A-16T, 17A-17O, 18A-18D and 21A-21F, the sensor (and other layers) of the composite structure may be flexible and may be formed into various different shapes. According to an exemplary embodiment, the composite structure may comprise a functional layer which has at least partly a pattern of electrical conductors which are heated by current; thermal textile (e.g. positive temperature coefficient yarn/PTC yarn) may be used to control the heating; the composite structure/system may comprise at least partly a layer with Peltier elements (e.g. textile Peltier elements) cooled by current; thermal management may be implemented according to an exemplary embodiment at a functional layer (shown schematically as layer N and/or layer N/HS); the functional layer for thermal management may comprise an electrically conductive textile/yarn; a controller may be used to control the heating/cooling at a layer such as shown by thermal management layer HS. See e.g. FIGS. 2A-2C, 13A-13D and 16A-16T. See also FIGS. 24, 26A-26B, 27, 28A-28E and 29A-29B.

According to an exemplary embodiment as shown schematically in FIGS. 2B and 12A-12C, the composite structure may comprise a stack of layers configured to be mounted on a structure/frame or body for a vehicle interior component where the user interface is to be provided for a vehicle occupant to interact with vehicle systems and other systems/networks. See also FIGS. 14A-14E, 24 and 27.

Figure 23A:
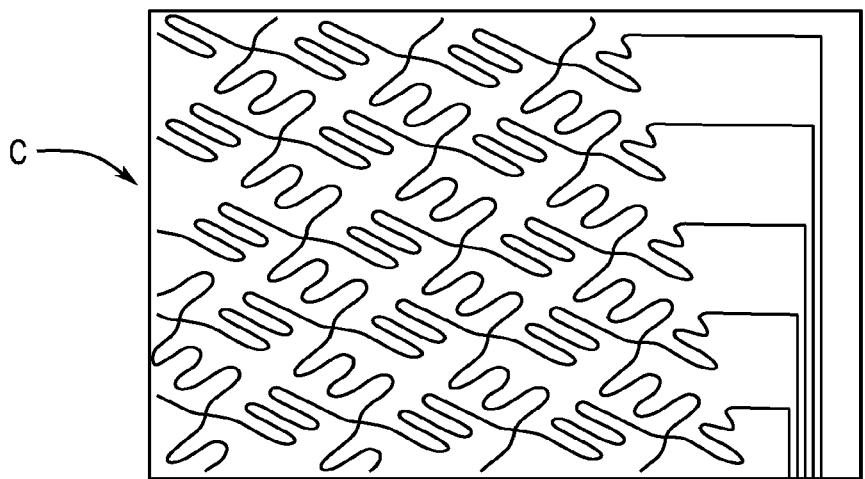
FIG. 23A is a top plan view of a sensor shown as a capacitive sensor array layer for a composite structure to provide a user interface on a vehicle interior component according to an exemplary embodiment.
Figure 23B:
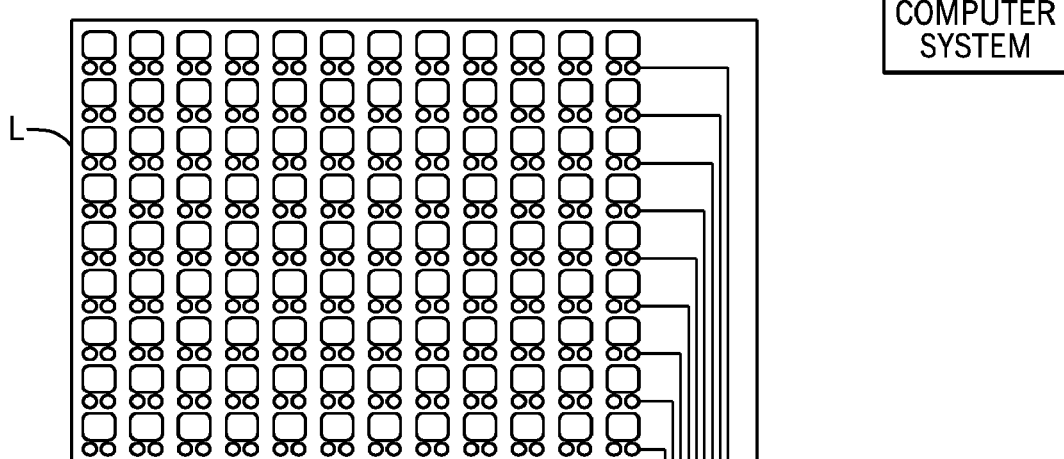
FIG. 23B is a top plan view of a display shown as an LED array layer for a composite structure to provide a user interface on a vehicle interior component according to an exemplary embodiment.
Figure 24:
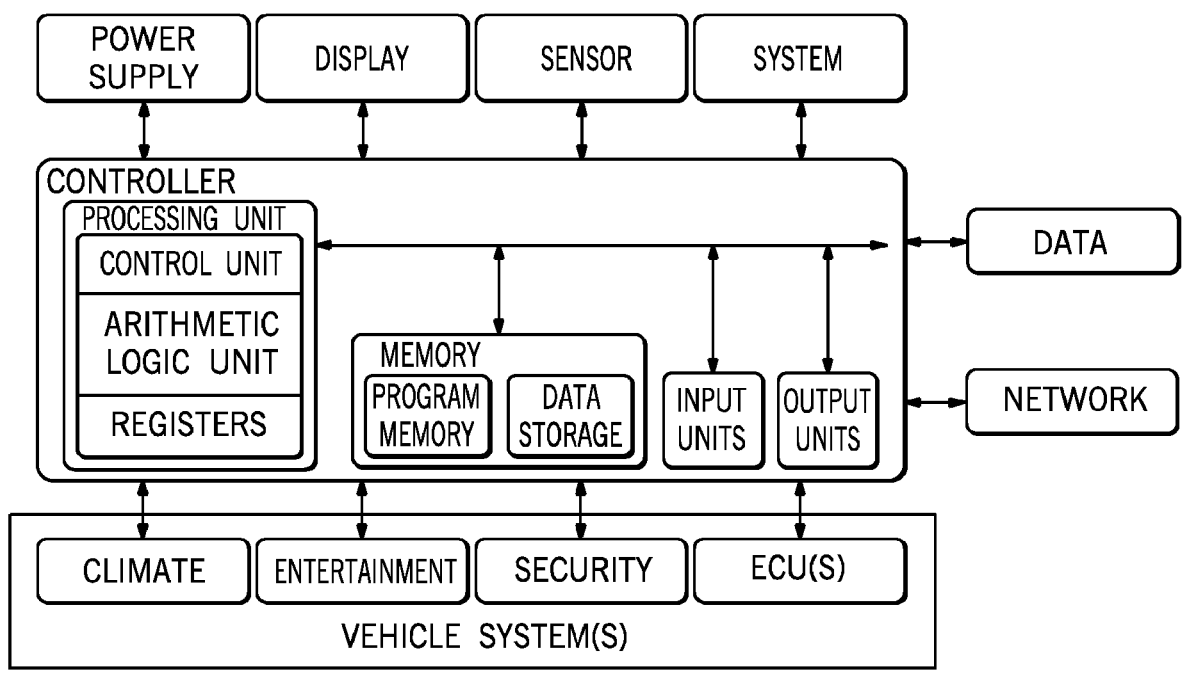
FIG. 24 is a schematic diagram of a controller/control system for a composite structure to provide a user interface to interoperate with vehicle systems and other systems/networks for a vehicle interior component according to an exemplary embodiment.
Figure 25A:
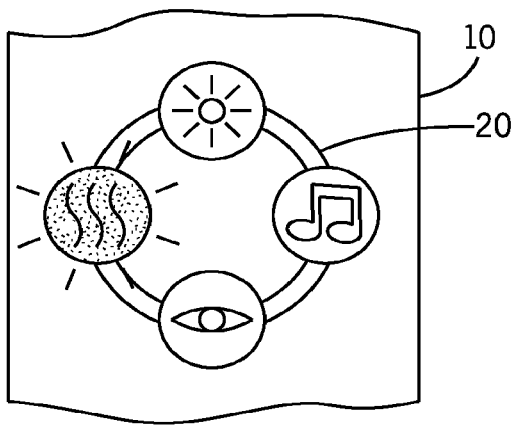
FIGS. 25A to 25D are schematic views of a display element shown as a control menu for the user interface of the composite structure for a vehicle interior component configured to interoperate with vehicle systems according to an exemplary embodiment.
Figure 25B:
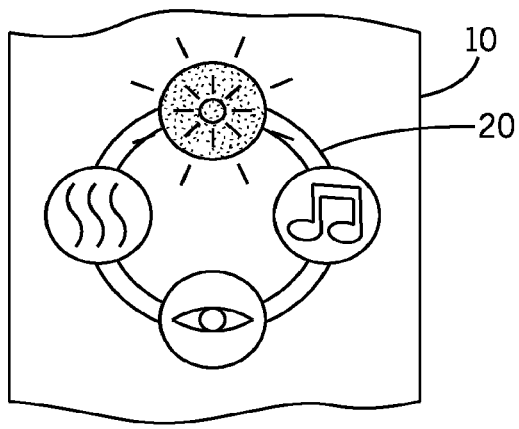
Figure 25C:
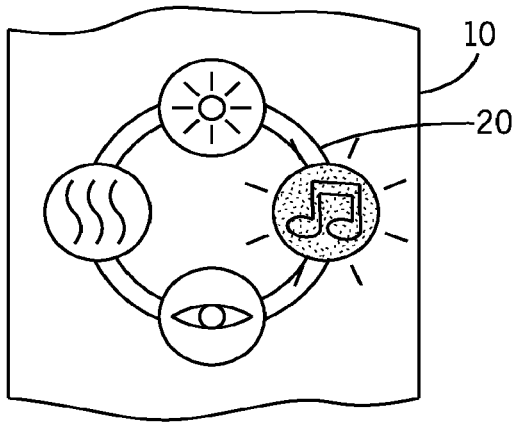
Figure 25D:
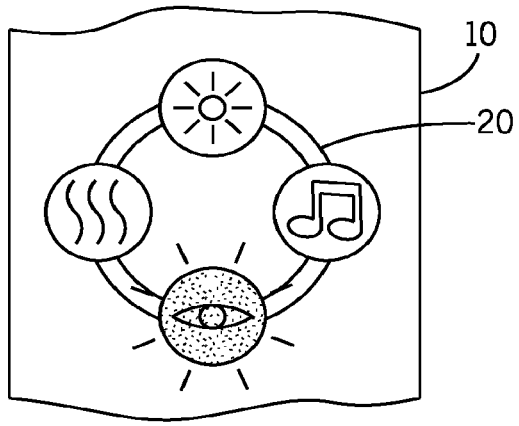
Figure 26A:
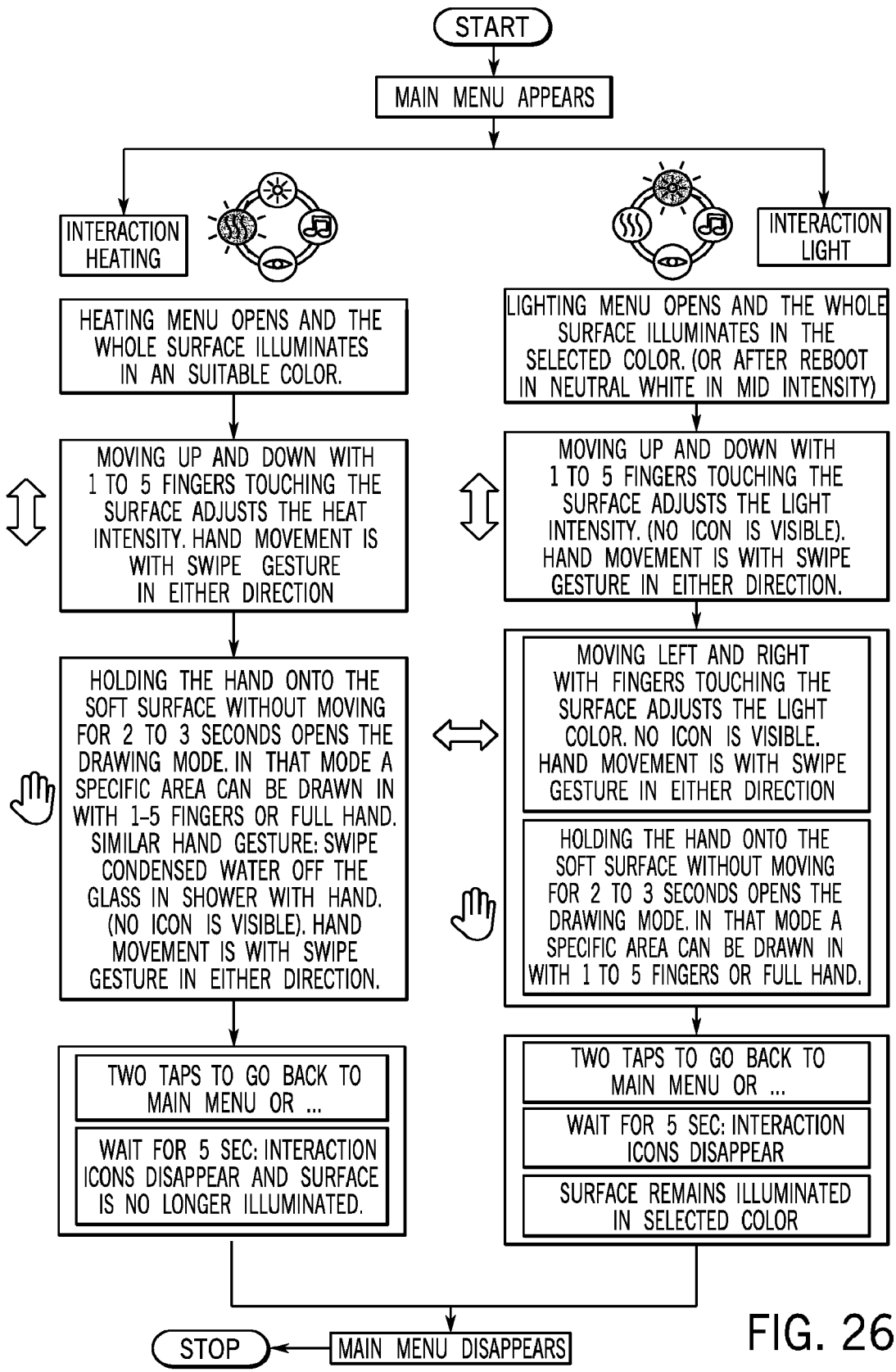
FIGS. 26A to 26B are schematic flow diagrams of operation of a user interface of a composite structure for a vehicle interior component configured to interoperate with vehicle systems according to an exemplary embodiment.
Figure 26B:
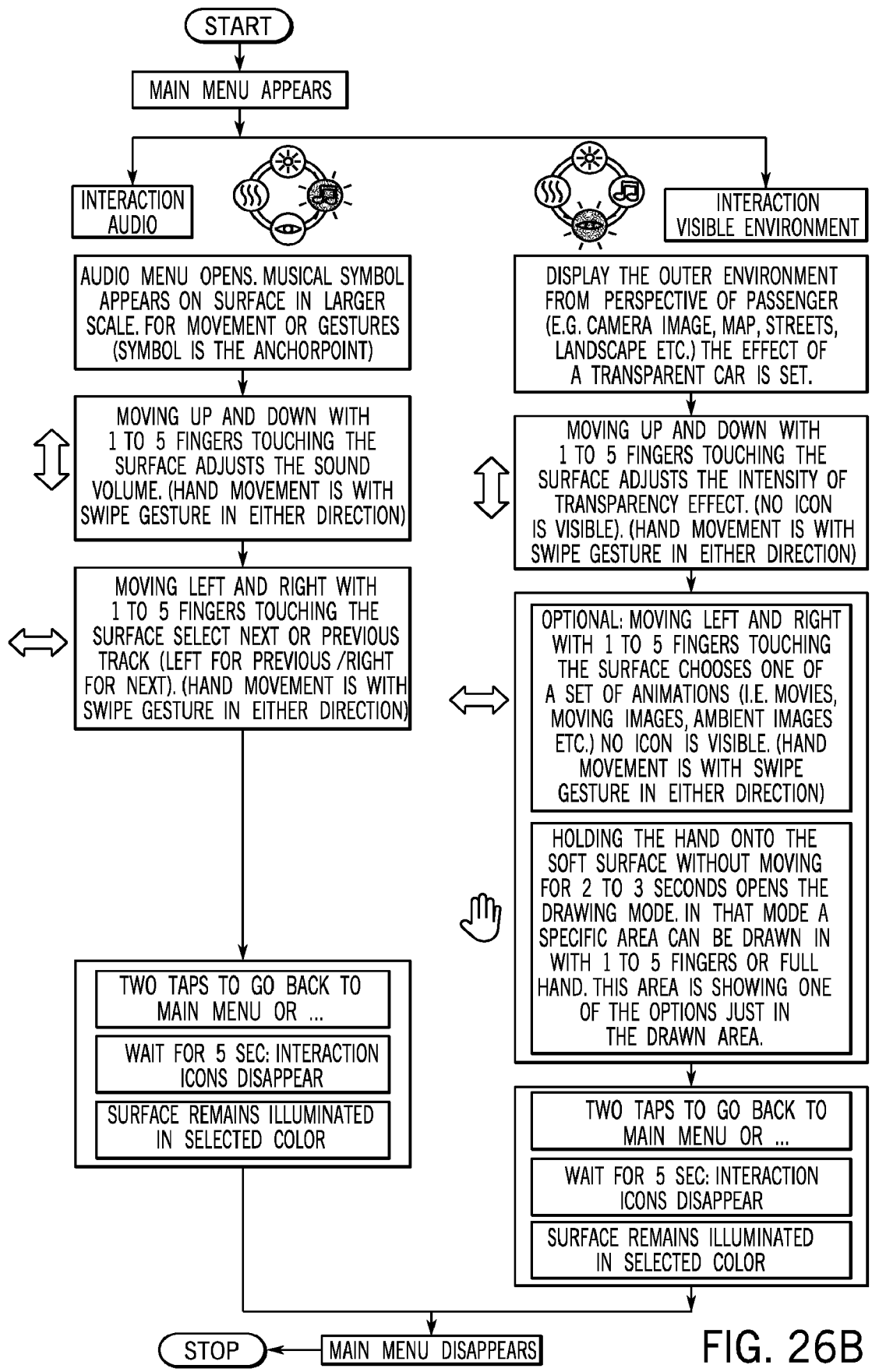

According to an exemplary embodiment, the composite structure may comprise a sensor C configured as a component/system to provide the user interface system; as indicated schematically, the sensor C may comprise a sensor/layer in the form of a capacitive touch panel, which may be calibrated to detect proximity and motion at or adjacent to the surface of the cover (e.g. to recognize contact/touch and movements/gestures of the user as input); the component/system may comprise a layer with a pattern (e.g. shown schematically as a formed/printed conductive pattern WM on sensor array C in FIG. 23A) configured to detect/sense and located pressure on the surface of the component/system. See e.g. FIGS. 17A-17O, 21A-21F, 23A, 24 and 27. According to an exemplary embodiment, the component/system may comprise and integrate as a functional layer an actuator which vibrates the surface (e.g. providing haptic feedback for a vehicle occupant interacting with the surface). See e.g. FIGS. 13A-13D and 16A-16T. As shown schematically according to an exemplary embodiment, a controller may be further configured to send a control signal to at least one of (a) an indicator, (b) a display, (c) a climate control module, (d) an entertainment control module, (e) a security control module, (f) an engine control unit, (g) a data store, (h) a database, (i) a motor, (j) a vehicle seat, (k) a window regulator/control. See e.g. FIGS. 23A-23B and 24 (showing schematically a controller or a connection to a computer system to manage control of the user interface interactions such as display/lighting, etc. using a control program). According to an exemplary embodiment, a method of using a vehicle interior component may be characterized by the detection by the sensor of (a) a pattern of finger tips and/or hand movements on the surface; (b) and/or gestures of the user or a combination of movements and gestures and touches. See FIGS. 17A-17O and 27. See also FIGS. 26A-26B, 28A-28E and 29A-29B. According to an exemplary embodiment as shown schematically, the pattern, movements or gestures detected at the sensor may change the displayed control element or visual appearance (displayed features) and/or make the displayed features moveable by touch or wipe (repositionable) and/or move the sensitivity of the touch panel fixed to the displayed features. See e.g. FIGS. 3A-3T and 17A-17O. According to an exemplary embodiment, a method of using a vehicle interior component may comprise a set of calibrated hand/finger movements by a vehicle occupant to operate the user interface at the composite structure (e.g. a double finger-tip of two fingers, activates a set of functions, e.g. window-lift operation, and repeat of that double finger-tip of two fingers activates a next set of functions such as climate control). See FIGS. 26A-26B, 28A-28E and 29A-29B. See also FIGS. 3A-3T, 4A-4F, 5A-5F, 6A-6F, 7A-7F, 8A-8E, 9A-9E, 10A-10F, 11A-11E and 27. According to an exemplary embodiment, a method of using a vehicle interior component presenting a user interface on the surface/cover of a composite structure may comprise a vehicle occupant having the capability to "paint" (e.g. by using parts/palm of the hand) with light on the surface/cover (e.g. an option to illuminate selectively the surface of the composite structure with illumination or displayed light from the display). See FIGS. 3G and 17L-17M. See also FIGS. 26A-26B and 29A-29B.

According to an exemplary embodiment, a method of using a vehicle interior component may comprise that the user interface at the composite structure will vibrate (e.g. haptic feedback from an actuator in a functional layer N) to provide a feedback a vehicle occupant (e.g. feel/haptic sense at the fingers of the vehicle occupant to confirm the activation). See e.g. FIGS. 2B and 16A-16T. According to an exemplary embodiment, a method of using a vehicle interior component may comprise that a drag/drop (e.g. slide/throw) gesture of the hand of a vehicle occupant may reposition a display element (such as an image, icon, menu, feature, etc.) displayed on the cover/surface of the composite structure. See FIGS. 3H-3I and 17. According to an exemplary embodiment, a method of using a vehicle interior component may comprise that a gesture or movement (e.g. moving hand) activates the user interface to awake and display information/views on the cover/surface. See e.g. FIGS. 17D-17E and 26A-26B. See also FIGS. 3A-3T.

According to an exemplary embodiment, a method of using a vehicle interior component comprising a composite structure with a layer that may be heated and/or cooled may characterized by (a) that the heating and/or cooling may be used to provide comfort to the vehicle occupant (including any passenger) and/or (b) that at least one cooled area of the surface provides feedback information to the passenger and/or (c) that at least one heated area of the surface provides feedback information to the passenger. See FIGS. 23A-23B, 24, 26A and 27.

According to an exemplary embodiment, a method of using a vehicle interior component may comprise that the composite structure with cover/surface in the area of the air conditioning outlet/symbol may be configured to provide feedback to confirm the activation of the air conditioning system; the composite structure in the area of the heating outlet/symbol may be configured to provide a feedback to confirm the activation of the heating system (e.g. a thermal management/functional layer may comprise and integrate a thermocouple, thermometer, etc. to monitor and control thermal response/status in the vehicle interior). See FIGS. 16A-16B and 24. See also FIG. 26A.

According to an exemplary embodiment, a method of using a vehicle interior component may include a sensor such as pressure sensitive layer and/or an optical device which could detect the position of an object lying on a surface may be characterized by the steps of marking the position of the object with light from the display layer (e.g. outline or fill with color); marking proposed fixation points; display instructions near to the detected object; and display symbols near to the detected object; in a compartment/trunk at least one object may be marked for fixation and/or proposed fixation points are illuminated and/or instructions for fixation are given with regards to size and weight. See e.g. FIGS. 1B and 24.

According to an exemplary embodiment, a user interface system for a vehicle interior may comprise a contact surface at the cover layer T; a sensor shown as a capacitive touch panel may be covered by the contact surface; a positioning layer shown as a spacer may be coupled to the touch panel; and a display may covered by the spacer and configured to emit light/illumination through the cover layer. See e.g. FIGS. 2A-2C and 14A-14E. According to an exemplary embodiment as shown schematically in FIGS. 17J-17O, the spacer, the sensor (e.g. a projected capacitive touch panel or other component/technology) and the cover/contact surface are configured to be translucent to allow light emitted by the display to pass through the contact surface. See also FIGS. 13A-13D and 16A-16T. According to an exemplary embodiment as shown schematically, the cover/exterior contact surface may comprise a textile; the positioning layer/spacer may comprise a foam material (e.g. foam, polyurethane, etc.). See FIGS. 2B, 12A-12E, 13A-13D, 16A-16T, 17A-17O and 18A-18D. According to an exemplary embodiment, the display may comprise at least one light emitting diode; the display may comprise a flexible material comprising an array of light emitting diodes; the display may be configured to selectively emit light in response to a signal from the sensor. See FIGS. 20A-20H and 23B. See also FIGS. 17A-17O and 27. According to an exemplary embodiment, the composite structure of the vehicle interior component may comprise a controller configured for operation by a vehicle occupant for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant; the controller may be further configured to send a control signal to at least one of (a) an indicator, (b) a display, (c) a climate control module, (d) an entertainment control module, (e) a security control module, (f) an engine control unit, (g) a data store, (h) a database, (i) a motor, (j) a vehicle seat, (k) a window regulator/control. See FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27. See also FIGS. 26A-26B, 28A-28E and 29A-29B.

According to an exemplary embodiment, a user interface system for a vehicle interior may be provided by a composite structure with a cover or contact surface; a sensor such as a capacitive touch panel covered by the cover or contact surface; a positioning layer such as a spacer coupled to the touch panel; and a display covered by the spacer configured to emit light. See FIGS. 2B, 13A-13D, 16A-16T, 19A-19D, 20A-20H. According to an exemplary embodiment as shown schematically, the positioning layer (e.g. spacer), the sensor (e.g. capacitive touch panel) and the cover/contact surface are configured to be translucent to allow illumination from (light emitted by) the display to pass through the cover/contact surface; the contact surface may comprise a textile; the display may comprise a flexible material comprising an array of light emitting diodes. See 12A-12E, 16A-16T, 17A-17O, 18A-18D, 19A-19D and 20A-20H. According to an exemplary embodiment as shown schematically in FIGS. 20A-20H, the display may be configured to selectively emit light in response to a signal from the capacitive touch panel. According to an exemplary embodiment as shown schematically in FIGS. 21A-21F, the sensor shown as capacitive touch panel may be configured to receive a touch input and transmit a signal at a user interface provided at the composite structure. See also FIG. 23A. (According to an exemplary embodiment as shown schematically, a sensor such as a capacitive touch panel may be configured for calibration of detected signals corresponding to movement and location of the hand of a vehicle occupant and/or touch and the application of pressure, see FIGS. 17J-17O, 21A-21F and 23A.)

According to an exemplary embodiment, the composite structure/system may comprise a controller provided through a user interface and configured for operation of vehicle systems and interconnection with other systems/networks by a vehicle occupant. See FIGS. 12B, 23A-23B, 24 and 27.

According to an exemplary embodiment, the composite structure or component may be configured and comprised to provide a user interface to facilitate interactions by a vehicle occupant with vehicle systems and subsystems including but not limited to vehicle systems as shown in the FIGURES.

Construction of Composite Structure

According to an exemplary embodiment shown schematically in the FIGURES, a composite structure for the vehicle interior may comprise a combination of multiple layers of a form/material and with a type arranged and constructed to form various components providing form and fit and function according to design intent and/or requirements (e.g. for automotive use in a vehicle interior). See e.g. FIGS. 1B, 2A-2C, 13A-13D and 16A-16T. According to an exemplary embodiment shown schematically, the composite structure comprises a set of layers of materials/components configured to present a user interface system for a vehicle occupant to interact with vehicle systems/other systems (e.g. cover layers such as layer T/TH/PC/PVC/PUR/TPO, integrated layers such as with layer E/F/N, functional layers such as layer N/HS/D, base/bond/substrate layers such as layer B/S, sensor layer C, display layer L, positioning layer E, foam layer F, etc.). See FIGS. 1B, 2A-2C, 12A-12H, 13A-13D, 15A-15C, 16A-16T, 17A-17O, and 18A-18D (configuration of component/layer construction of composite structure according to an exemplary embodiment). See also FIGS. 23A-23B, 24 and 27 (controller/control system and operation).

According to an exemplary embodiment, the composite structure for a vehicle interior component shown as multi-layer structure 10 may be configured with a user interface comprising a sensor/detector C (e.g. for input) and a display/light system L (e.g. for output) to facilitate interaction by a vehicle occupant (e.g. at a display element such as a panel/area 20 for input and/or output) with vehicle systems and other systems/devices and networks/data. See generally FIGS. 1B, 2A-2C, 3A-3T, 8A-8E, 11A-11F, 12A-12H, 13A-13D, 14A-14E, 15A-15C, 16A-16T, 17A-17O, 18A-18D, 20A-20H, 21A-21F, 22A-22E, 24 and 27. According to an exemplary embodiment, the composite structure configured to provide a user interface to vehicle systems/other systems may comprise a display/light array with no sensor/sensor array. See FIGS. 19A-19D and 23B. According to an exemplary embodiment, the composite structure may comprise a sensor array with no light array. See e.g. FIGS. 17B-17F and 23A.

According to an exemplary embodiment, the composite structure with cover may comprise multiple physical/structural and/or functional layers in a variety of various combinations to provide a user interface for a vehicle occupant to facilitate interaction with vehicle systems and other systems/networks from the vehicle at the user interface. See e.g. FIGS. 1B, 2A-2C, 3A-3T, 8A-8E, 23A-23B, 24 and 27. See also FIGS. 26A-26B, 28A-28E and 29A-29B.

According to an exemplary embodiment, the composite structure may comprise a substrate; the composite structure may be coupled to at least one or more components in a vehicle interior such as (a) a trim component; (b) a panel; (c) a door; (d) a surface; (e) a console; (f) a base. See e.g. FIGS. 1B and 2A-2C. According to an exemplary embodiment as shown schematically and representationally in the FIGURES (and in other forms/arrangements), various layers and components may be combined and/or arranged and integrated and/or omitted in construction of the functional system of the composite structure to provide a user interface for a vehicle interior component with vehicle systems and other systems/networks. See e.g. FIGS. 12A-12E, 13A-13D, 16A-16T, 17A-17O, 18A-18D, 19A-19D, 23A-23B, 24 and 27.

Cover/Exterior Surface Layer (T/TH/PC/PUR/PVC/TPO/Film/Etc.)

According to an exemplary embodiment, the surface of the exterior layer or cover may comprise or be constructed/formed/treated to provide any of a variety of effects to facilitate any of a wide variety of visual and/or physical and/or virtual interactions with and through the composite structure of the vehicle interior component.

According to an exemplary embodiment, the cover or exterior surface/layer of the composite structure may be provided and configured to provide certain properties or combinations of properties intended to fulfill design intent and/or requirements. According to an exemplary embodiment, the exterior layer may be configured to provide the visual/decorative appearance of the composite structure of the vehicle interior component (e.g. provided in a color/tone and etc.); the exterior layer may exhibit properties of texture/haptic sensation (e.g. proper softness of feel) for a vehicle occupant; the exterior layer may function as a barrier/membrane for the composite structure of the vehicle interior component and provide for water/liquid repellence and ease of cleaning (e.g. stain resistance, dirt repellence, impregnation with anti-stain compound, etc.); the exterior layer may be selected or constructed to transmit light (e.g. provide translucence for light from a light source such as a display shown as an LED array in the composite structure of the vehicle interior component); the exterior layer may be selected and constructed to present a display element or information panel for a user interface; the exterior layer may be selected and constructed to function as a control panel for a user interface. See generally FIGS. 1B, 2A-2C, 3A-3T, 8A-8E, 11A-11F, 12A-12E, 13A-13D, 14A-14E, 15A-15C, 16A-16T, 17A-17O, 18A-18D, 19A-19D. See also FIGS. 24 and 27.

According to an exemplary embodiment, the exterior layer may be configured for form and fit and function of the composite structure of the vehicle interior component. For example, the layer may comprise or be provided as a fabric/textile sheet. According to an exemplary embodiment, the fabric layer may be comprised of one or more materials in a range of thickness between 0.2 and 0.5 mm (or any other suitable thickness). According to an exemplary embodiment, the layer may comprise or be provided from a leather material (e.g. of a type which incorporates translucence of visible light or is selected and treated to provide for translucence of visible light) in a thickness of a range of 0.2 to 1.2 mm (or any other suitable thickness); the cover or outer surface/exterior surface may comprise any of a wide variety of materials provided in any of a wide variety of thickness suitable for the purpose. See e.g. FIGS. 13A-13D, 16A-16T and 17A-17O. According to an exemplary embodiment, the layer may comprise or be provided as a plastic/poly material such as polycarbonate (e.g. in a film, layer, etc. with a thickness in a range or polyurethane/vinyl (e.g. in a film, layer, etc.). According to an exemplary embodiment, the exterior layer may comprise or be constructed from any of a variety of other woven or non-woven materials (e.g. fabric, textile, fiber, skin, film, etc.). According to an exemplary embodiment, the cover layer may comprise or be constructed of materials that facilitate heat transfer and/or other heating or cooling effects (e.g. conductivity, ventilation, Peltier effect, etc.).

According to an exemplary embodiment, the cover may comprise or be constructed of a variety of other types of materials and in a variety of other thicknesses configured to provide the form and fit and function for the composite structure of the vehicle interior component. According to an exemplary embodiment, the cover may comprise or be constructed separately or as a composite of multiple materials and/or of treated materials (e.g. coated, painted, backed, treated, multi-layer etc.) for use in a vehicle interior. According to an exemplary embodiment, the cover may comprise or be constructed/formed to incorporate one or more other functional layers of the composite (e.g. positioning/spacer layer, diffuser layer, heating layer, cooling layer, etc.).

According to an exemplary embodiment, the exterior layer/surface or cover provides the visual/tactile physical user interface (e.g. for the human machine interface (HMI)) and facilitates the interaction between the vehicle occupant and the vehicle through the composite structure of the vehicle interior component (e.g. as cover for other layers of the composite structure of the vehicle interior component). See e.g. FIGS. 3A-3T and 17A-17O and 27.

According to an exemplary embodiment, the exterior layer or cover may comprise or be constructed/formed/treated to provide one or more of a variety of features and/or properties such as decorative appearance, color (e.g. tone and shade), visual texture (e.g. gloss, matte, grain, uniformity, smoothness, gripping, adhesion, etc.), feel (tactile sensation, haptic sensation/functionality, firmness, softness, etc.), resilience (e.g. to wear, abrasion, touching, etc.), durability (e.g. to environmental conditions such as heat/cold and humidity, repellence (e.g. to spills/liquids, dirt, etc.), flexibility (e.g. stiffness, etc.), translucence, convenience (e.g. easy to maintain, ease to clean, etc.), recyclability (e.g. material selection for reuse at end of life), uniformity (e.g. visual/physical consistency with other interior components of the vehicle, etc.), thermodynamic performance (e.g. heating and/or cooling), interconnectivity (e.g. integrated with electronic/electrical/data interfaces for other devices and components such as charging and data connection), etc. According to an exemplary embodiment, the exterior or cover layer may comprise or be constructed/formed in a generally uniform (e.g. monolithic) form or to provide multiple segments (e.g. with varying characteristics such as varying uniformity, translucence, inserts such as of other types/materials, etc.).

According to an exemplary embodiment, as shown schematically in FIGS. 2A-2C, the exterior layer may comprise a cover or skin of a form and material construction provides a haptic effect (e.g. including for interaction with the sensor array) and translucent effect (including for function/interaction with the light array/display) to facilitate operation of the user interface for the composite structure of the vehicle interior component (e.g. construction of cover in a manner to allow transmission of light, for example with construction of opaque materials with voids/perforations/mesh effect, construction from translucent/semi-transparent material, material that transmits light and absorbs relatively less light from the display/light-transmissive layer/cover, etc.). See also FIGS. 13A-13D and 16A-16T.

According to an exemplary embodiment, the exterior layer shows schematically in the FIGURES as a cover T (see e.g. FIG. 2B) may comprise a fabric/textile/fiber material; according to an exemplary embodiment, the exterior layer may comprise a leather material shown as cover TH, synthetic material, plastic/poly material such as a film, etc. (e.g. polycarbonate PC, polyvinyl chloride PVC, polyurethane PUR, TPO/film, etc.). See e.g. FIGS. 13A-13D and 16A-16T. As shown schematically according to an exemplary embodiment, the material for the cover/exterior surface layer may facilitate touching/compression for interaction with the user interface (e.g. sensor detection of touch/movement and display illumination of surface/visibility). See e.g. FIGS. 12C and 17A-17O and 27. See also FIGS. 26A-26B, 28A-28E and 29A-29B.

According to an exemplary embodiment as shown schematically and representationally in the FIGURES, the cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic fibers; (k) fabric sheet; (l) upholstered material; (m) a fleece material; (n) a woven material; (o) a non-woven material; (p) a sheet material; (q) a perforated material; (r) a composite of multiple fiber materials; the cover may comprise at least one of (a) film; (b) resin; (c) polycarbonate; (d) polyurethane; (e) polyvinyl material; (f) a composite of multiple plastic materials; (g) a composite of multiple materials.

Positioning (Spacer) Layer (E)

According to an exemplary embodiment, the composite structure may comprise at least one positioning/spacer layer according to an exemplary embodiment as shown in FIGS. 2B, 12A-12E, 13A-13D and 16A-16T (e.g. foam material, fabric material, spacer fabric, fiber material, woven material, etc.). According to an exemplary embodiment, a positioning/spacer layer E may be configured to provide certain properties or combinations of properties intended to fulfill design intent and/or requirements, including but not limited to touch/feel, translucence, softness/resilience, etc. See e.g. FIGS. 3A-3T, 12C and 17A-17O (showing interaction at cover/surface by contact, touch, press, hover).

According to an exemplary embodiment, the positioning/spacer layer may be configured to provide positioning/spacing for the layers or sub-layers of the composite structure; the positioning/spacer layer may function as a barrier/shield for the composite structure of the vehicle interior component (e.g. electromagnetic interference/EMI, EMV, etc.); the positioning/spacer layer may also provide for uniform separation of other layers to facilitate the function/operation of the composite structure/component. According to an exemplary embodiment, the positioning/spacer layer may be selected or constructed to transmit light (e.g. provide translucence for light from a light source such as the display or lighting/LED array in the composite structure).

According to an exemplary embodiment, the positioning/spacer layer may be configured for form and fit and function of the composite structure of the vehicle interior component. For example, the positioning layer may comprise or be provided as a fabric material (e.g. spacer fabric, etc.) or foam or polyurethane material (e.g. providing softness) or from a fiber/yarn material (e.g. woven from single yarn/fiber). According to an exemplary embodiment, the positioning/spacer layer may comprise or be constructed/formed to incorporate one or more other functional layers of the composite structure; the positioning/spacer layer (or material) may comprise a functional layer; the positioning/spacer layer (or material) may perform a diffuser function and/or a shield function for interference (e.g. electrical, magnetic, etc.) or shield function for light from the display/LED array as well as to maintain uniformity in transmission of light/illumination from the display (e.g. LED array/panel). See FIGS. 2B, 12A-12E and 16A-16T. See also FIG. 20H (diffuser layer for the display).

According to an exemplary embodiment, the positioning/spacer layer may be configured to provide separation between the cover/external surface and the sensor of the composite structure to facilitate the operation of the user interface (e.g. for the human machine interface (HMI)). As shown schematically in FIGS. 12C, 16A-16B, 17A-17O, the positioning layer may comprise a material that is provided in a segment configured to compress under pressure (e.g. in a form with compliant elements that compress or buckle under a threshold pressure and then return to form when pressure is removed); the positioning layer may be formed of a foam material or may provide the properties of a foam material. According to an exemplary embodiment, the positioning/spacer layer may provide uniform spacing and flexibility/softness for compression/touch effects at the user interface (e.g. to facilitate uniform operation of the user interface) and shear resistance between layers of the composite structure (e.g. at an interface with the cover, at an interface with the sensor array/foil, at other interfaces of the positioning/spacer layer) to facilitate proper performance of the composite structure in use. See e.g. FIGS. 12C, 13A-13D, 16A-16T, 17A-17O and 27. ¬See also FIGS. 26A-26B, 28A-28E and 29A-29B. According to an exemplary embodiment, a positioning/spacer layer may be provided at multiple positions within the composite structure. See e.g. FIG. 2B. At each position where the positioning/spacer layer is provided, positioning/spacing (e.g. for uniform operation) and other functions (e.g. diffusion of light, shielding of EMI, etc.) may be performed (or other layers may provide the function of the positioning layer). See generally FIGS. 13A-13D, 16A-16T and 17A-17O.

According to an exemplary embodiment, the positioning layer may comprise at least one of (a) a spacer; (b) a flexible spacer; (c) a shield for electromagnetic interference; (c) a foam material; (e) a plastic material.

Diffuser Layer (D)

According to an exemplary embodiment, a diffuser layer may be provided according to an exemplary embodiment as shown schematically in FIGS. 16A-16F and 20G-20H. According to an exemplary embodiment, the diffuser layer may be configured to provide certain properties or combinations of properties intended to fulfill design intent and/or requirements, including but not limited to providing for uniformity of the illumination from the display as presented at the exterior surface of the cover of the composite structure. According to an exemplary embodiment, the diffuser layer may be integrated with other layers of the composite structure (e.g. within the positioning/spacer layer).

According to an exemplary embodiment, the diffuser layer may comprise any materials/construction known to provide diffusion of illumination (e.g. arrangement of materials such as poly methyl methacrylate, Plexiglas, etc. with optical constituent components such as uniform spheres, etc.); the diffuser layer may be omitted and/or used with or according to the resolution of the display (e.g. used with a low resolution display, omitted with a high resolution display, etc.).

Base (Carrier)/Substrate Layer (B/S)

According to an exemplary embodiment, a base/substrate may be provided for the composite structure; the base/substrate may be provided as a layer arrangement for the composite structure (e.g. to mount or facilitate mounting on/assembly into a vehicle interior component). See e.g. FIGS. 1B and 2A-2C. According to an exemplary embodiment, base/substrate layer arrangement may be configured to provide certain properties or combinations of properties intended to fulfill design intent and/or requirements, including for and fit and function. According to an exemplary embodiment, the base/substrate layer arrangement may comprise materials used for vehicle interior component structures and/or construction such as plastics/resins, fiber/ plastic/resin composites (e.g. polypropylene, etc.), hybrid materials (e.g. fiber/molded plastic/resin), metal, wood, etc.; the base/substrate layer arrangement may be configured to provide a mechanical structure or frame for support and stiffness and integrity for the composite structure. See FIGS. 1B, 2A-2C, 16A-16T and 17A-17O.

According to an exemplary embodiment, the composite structure with base/frame may be mounted on or assembled into a component or structure in the vehicle interior (e.g. to form a vehicle interior component). See e.g. FIGS. 1B and 2A-2C. According to an exemplary embodiment the composite structure may be provided as generally flexible composite surface (e.g. a soft/cushioned surface having a flexible form) for installation in a structure for a vehicle interior component or structure (e.g. to provide rigidity/rigidification generally for the soft/flexible composite surface/structure). See e.g. FIG. 2B.

Adhesive Material/Bond/Glue (Securing of Layers/Components)

According to an exemplary embodiment, adhesive materials such as glue (e.g. silicon glue) may be used to secure or bond layers/components of the composite structure together in assembly (e.g. glue, bond, adhesive for the automotive industry or equivalent); the adhesive/glue may be selected from available commercial products that provide characteristics such as stability, uniformity, aging resistance, etc. According to an exemplary embodiment, alternative methods of securing layers of the composite structure may be employed (e.g. such as mechanical connections, bonding, adhesive, molding, etc. selected for the purpose/application to provide properties suitable for use). See e.g. FIGS. 13A-13D and 16A-16T.

Display/Light/Illumination Panel/Array Layer (L)

According to an exemplary embodiment, the composite structure may comprise a display to provide illumination for the user interface (e.g. directed light through intermediate layers and made visible at the exterior surface of the cover of the composite structure). See e.g. FIGS. 2B-2C, 3A-3T, 8A-8E, 17J-17O, 20A-20H and 23C. See also FIGS. 26A-26B, 27, 28A-28E and 29A-29B (operation of user interface).

According to an exemplary embodiment, the display may comprise a commercially available product such an LED/OLED panel (e.g. flexible panel/array sheet with light emitting device/diode elements). According to an exemplary embodiment, the display may comprise a lighting/display layer for the composite structure configured to provide certain properties or combinations of properties intended to fulfill design intent and/or requirements (including intensity, durability, environmental conditions, flexibility, cost efficiency, flexibility, resolution, color, stability, etc.). See e.g. FIGS. 2A-2C and 20A-20H. According to an exemplary embodiment, a full-color display may be provided (e.g. red/green/blue array); other optical/illumination effects may be incorporated into the composite structure to facilitate intended performance of the display for the user interface (e.g. filter, alignment, diffusion, shielding, etc.).

According to an exemplary embodiment, the lighting/display layer may be configured to provide the visual/decorative appearance of the composite structure of the vehicle interior component (e.g. provided in a color/tone and etc.); the display may be selected and operated to provide illumination at a suitable level for operation of the user interface; the lighting/display layer may be selected or constructed to transmit light as required for useful operation of the composite structure (e.g. through interposed layers of material with various levels of translucence). See e.g. FIGS. 2A-2C, 17J-17O and 20A-20H.

According to an exemplary embodiment, the composite structure of the vehicle interior component with lighting/display may comprise multiple physical/structural and/or functional layers in a variety of various combinations. See FIGS. 12A-12E, 13A-13D, 16A-16T, 17J-17O, 18A-18D, 19A-19D, 20A-20H and 22A-22E.

According to an exemplary embodiment, the surface of the lighting/display layer or lighting/display may comprise or be constructed/formed/treated to provide any of a variety of effects to facilitate any of a wide variety of visual and/or physical and/or virtual interactions with and through the composite structure of the vehicle interior component.

According to an exemplary embodiment, the display may comprise a commercially available product such as a display panel, lighting array, flexible display panel, flexible array, etc. of any suitable type or form available (e.g. specified for use in an automotive environment); according to an exemplary embodiment the display may be a flexible array or panel with light-emitting devices/diodes (LED) (such as surface mount LED elements of 1.3 to 1.9 mm or in other spacing/resolution) arranged in a suitable pattern and capable of providing sufficient illumination through intervening layers of the composite structure. See e.g. FIGS. 20A-20H.

According to an exemplary embodiment, the display L of the composite structure 10 presenting the user interface with display elements 20 may comprise a commercially available configuration (e.g. panel, array, etc.) that may be connected to a controller/control system for operation/functionality and interaction with vehicle systems and other systems (e.g. data/network connectivity). See e.g. FIGS. 2A-2B, 20A-20H, 23B, 24 and 27.

According to an exemplary embodiment shown schematically in FIGS. 16G-16H and 22A-22E, the display may be provided as a pre-assembled module with the sensor (and if required an intermediate/functional layer).

According to an exemplary embodiment, the display may comprise at least one of (a) an array; (b) a grid; (c) a panel; (d) a display screen; (e) a flexible panel; (f) a lighting array; (g) a lighting device array; (h) a light-emitting device array; (i) a LED/OLED array; (j) a flexible LED/OLED array; (k) a flexible sheet. See e.g. FIGS. 20A-20H.

Sensor/Detector Array/Panel Layer (C)

As shown schematically according to an exemplary embodiment in FIGS. 21A-21F, a sensor shown as a sensor/detector layer C may be provided according to an exemplary embodiment. See also FIGS. 2B, 16A-16T, 17A-17O and 22A-22E. According to an exemplary embodiment, the sensor/detector layer may be configured to provide certain properties or combinations of properties intended to fulfill design intent and/or requirements including to facilitate the user interface (e.g. with calibration and sensitivity adjustments at the controller/control system) for the composite structure. See FIGS. 21A-21F, 23A, 24 and 27.

According to an exemplary embodiment, the sensor shown as sensor/detector layer C will be configured for form and fit and function of the composite structure of the vehicle interior component. For example, the layer C may comprise or be provided as a flexible sheet or panel commercially available for use in a composite structure and/or specified for use in an automotive environment.

According to an exemplary embodiment, the sensor/detector may comprise or be constructed of a variety of other types of materials and in a variety of other thicknesses configured to provide the form and fit and function (including sensitivity, etc.) for the composite structure of the vehicle interior component. According to an exemplary embodiment, the sensor/detector may comprise or be constructed separately or as a composite of multiple materials and/or of treated materials (e.g. coated, painted, backed, treated, multi-layer etc.) for use in a vehicle interior component. According to an exemplary embodiment, the sensor/detector may be constructed/formed to integrate functionally with other layers of the composite structure (e.g. with layers such as positioning/spacer layer, diffuser layer, heating layer, cooling layer, etc.).

The sensor/detector layer or sensor/detector provides the positional/tactile physical user interface (e.g. for the human machine interface (HMI)) and facilitates the interaction by input between the vehicle occupant and the vehicle through the composite structure of the vehicle interior component (e.g. as sensor/detector for other layers of the composite structure of the vehicle interior component). See FIGS. 17A-17O and 27. See also FIGS. 26A-26B, 28A-28E and 29A-29B.

According to an exemplary embodiment, the sensor/detector or sensor/detector layer may comprise or be constructed/formed in a generally uniform (e.g. monolithic) form or to provide multiple segments (e.g. with varying characteristics such as varying uniformity, translucence, inserts such as of other types/materials, etc.).

According to an exemplary embodiment, as shown schematically in FIGS. 16A-16T and 17A-17O, the sensor/detector layer may comprise a sensor/detector or skin of a form and material construction that may facilitate/provide a haptic effect (e.g. including for interaction with the sensor array/matrix) and translucent effect (including for function/interaction with the light array) to facilitate operation of the user interface for the composite structure of the vehicle interior component. According to an exemplary embodiment, the sensor (e.g. sensor/detector layer or sensor/detector component/system) may comprise or be constructed/formed/treated to provide any of a variety of effects to facilitate any of a wide variety of visual and/or physical and/or virtual interactions with and through the composite structure of the vehicle interior component. See FIGS. 17A-17O and 21A-21F. According to an exemplary embodiment, the sensor may be configured to detect input from the vehicle occupant at or adjacent to the exterior surface of the cover; as shown schematically, the sensor C may comprise a mesh/grid of a commercially available configuration with elements shown as conductors CW configured into an array that can be connected to a controller/control system. See e.g. FIGS. 21A-21F, 23A, 24 and 27. According to an exemplary embodiment, the sensor C of the composite structure 10 presenting the user interface with display elements 20 may comprise a commercially available configuration (e.g. panel, array, etc.) that may be connected to a controller/control system for operation/functionality and interaction with vehicle systems and other systems (e.g. data/network connectivity). See e.g. FIGS. 2A-2B, 21A-21F, 23A, 24 and 27.

According to an exemplary embodiment, the sensor may comprise a sensor array/grid such as a projected capacitive touch sensor foil. See FIGS. 21A-21F. As indicated, the sensitivity of the sensor may be adjusted (e.g. detection of user input such as by finger touch/proximity in a range from 1 to 6 mm, for example). According to an exemplary embodiment, the sensor may comprise or be constructed from any suitable technology calibrated to function with the composite structure (including other layers/materials), such as capacitive touch sensor, projected capacitive touch foil/array, resistive grid/array, surface acoustic sensor, pressure transducer/sensor array, infrared grid, matrix, etc. See FIGS. 17A-17O and 27.

According to an exemplary embodiment shown schematically in FIGS. 16G-16H and 22A-22E, the sensor may be provided as a pre-assembled module with the display (and if required an intermediate/functional layer).

According to an exemplary embodiment as shown schematically in FIGS. 23A-23B, 24 and 27 (block/flow diagrams of operation of the controller/user interface), the vehicle occupant may interact and operate the user interface through the sensor (and display); suitable contact and movement from the vehicle occupant would be calibrated to correspond to commands through a control panel provided by the user interface (e.g. conventional movements, touching, tapping, whipping, hovering, etc.). According to an exemplary embodiment, a menu featuring system/controls may be provided at the user interface to facilitate and direct a vehicle occupant/user to activate and interact through the user interface system. See e.g. FIGS. 25A-25D.

As shown schematically, the sensor may be calibrated to detect touch and movement (e.g. from a hand/finger) of a vehicle occupant to general input. See also FIGS. 26A-26B, 27, 28A-28E and 29A-29B (flow diagrams of operation of the user interface).

According to an exemplary embodiment, the sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel. See FIGS. 17A-17O and 21A-21F.

Functional Layer (N/HS)

Figure 16A:
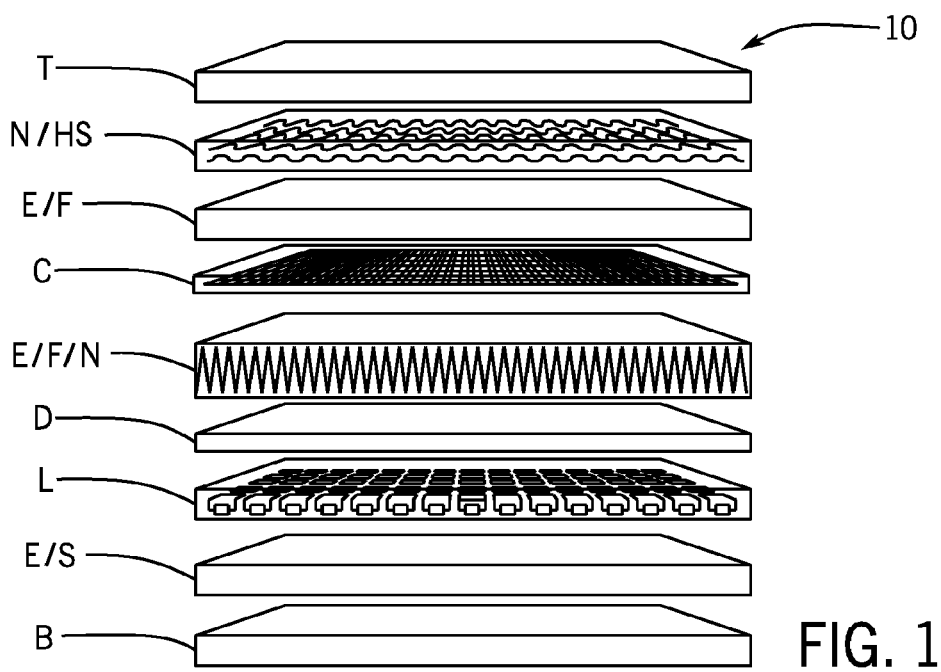
FIGS. 16A and 16E are schematic exploded cross-section views of a composite structure with cover according to an exemplary embodiment.
Figure 16B:
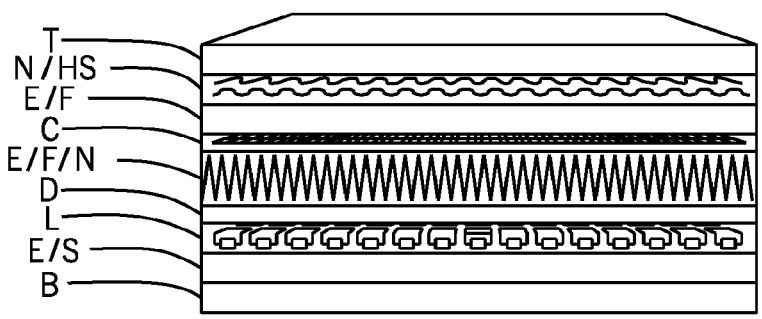
FIGS. 16B to 16D and 16F to 16T are schematic cross-section views of a composite structure with cover according to an exemplary embodiment.
Figure 16C:
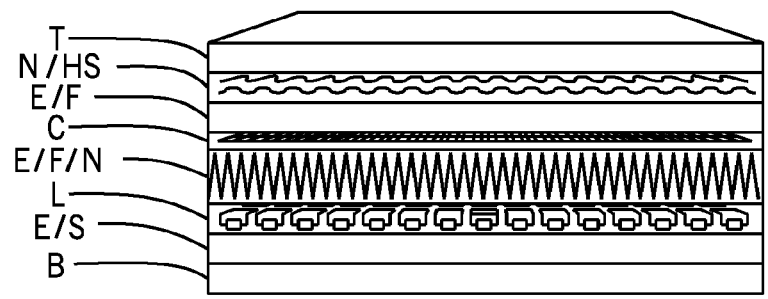
Figure 16D:
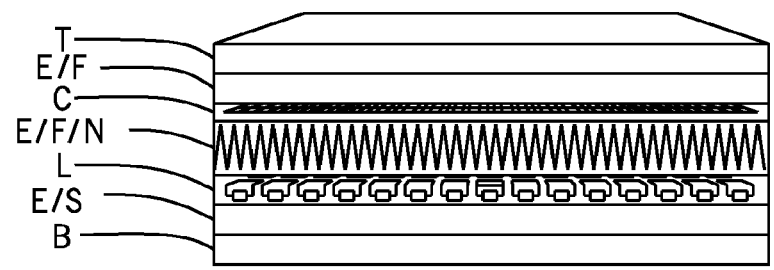
Figure 16E:
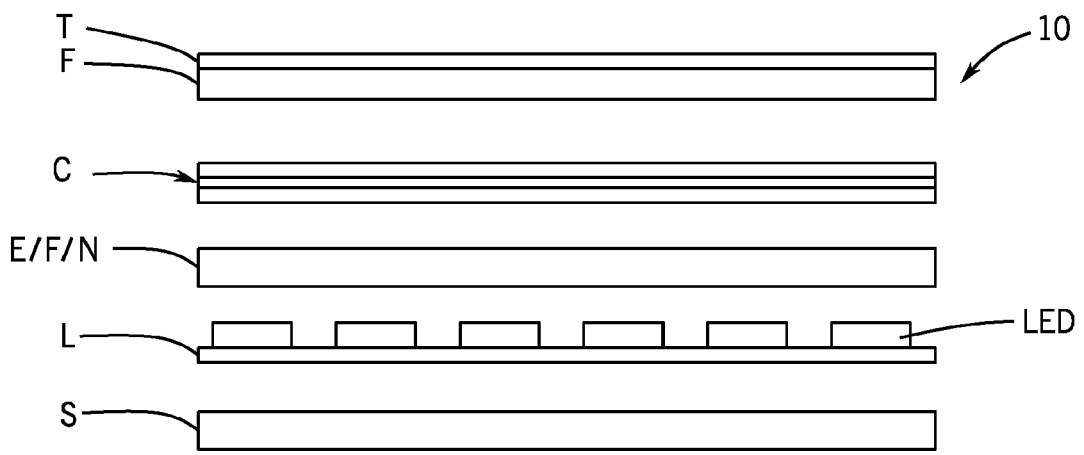
Figure 16F:
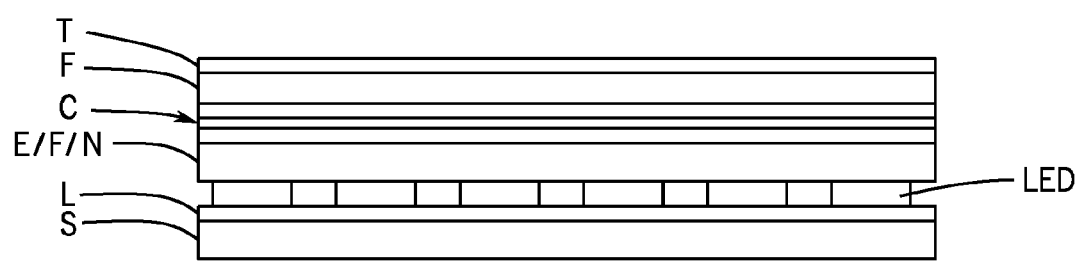
Figure 16G:
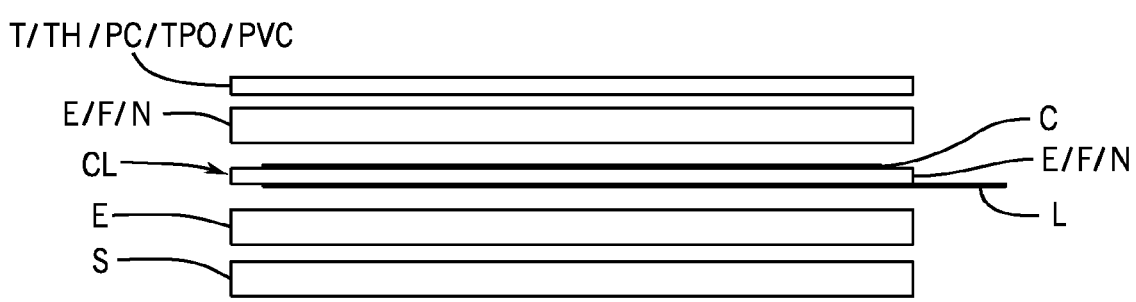
Figure 16H:
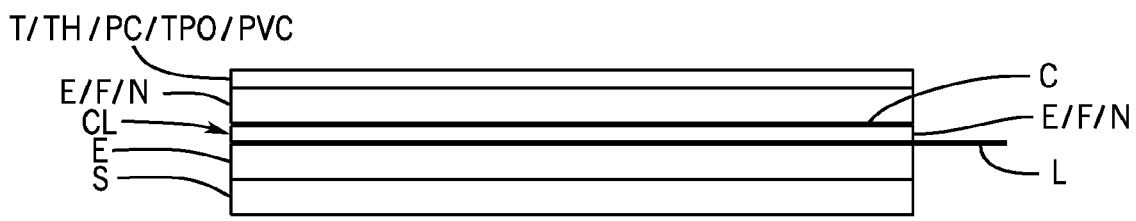
Figure 16I:
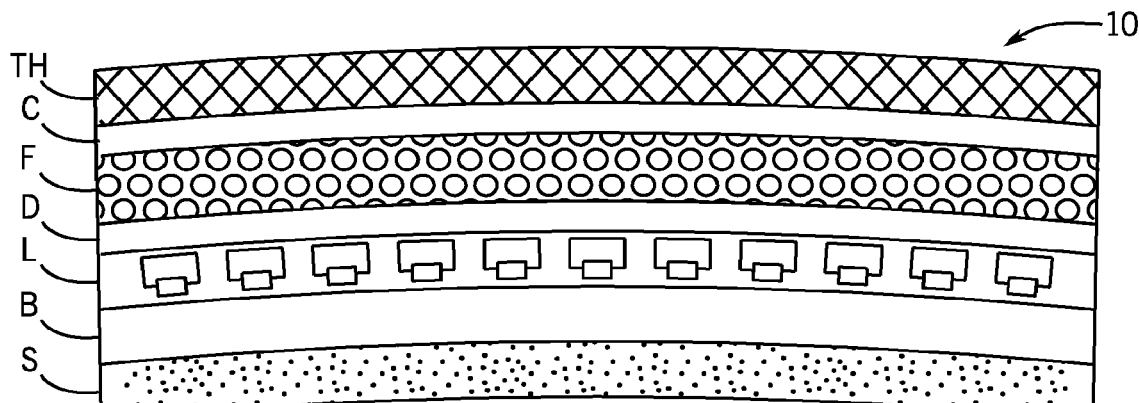
Figure 16J:
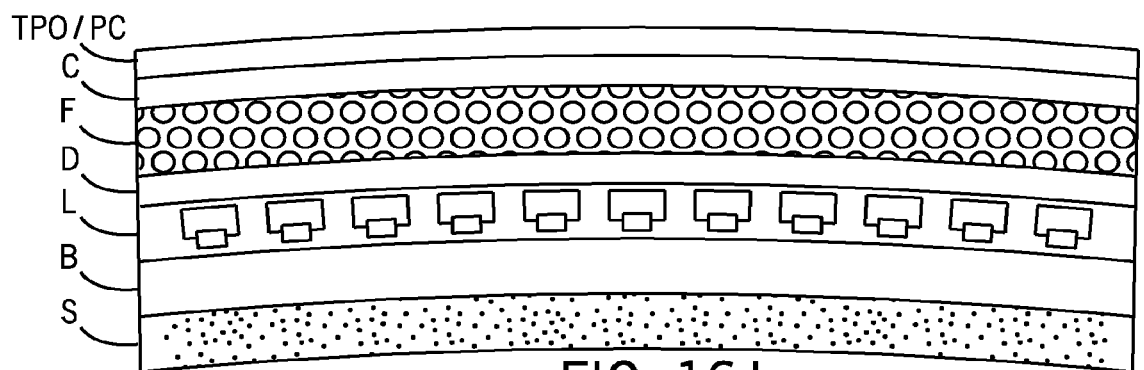
Figure 16K:
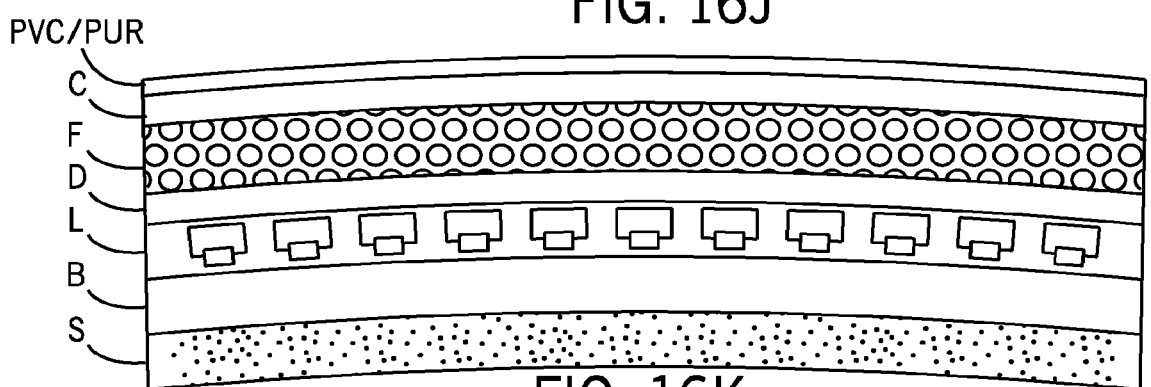
Figure 16L:
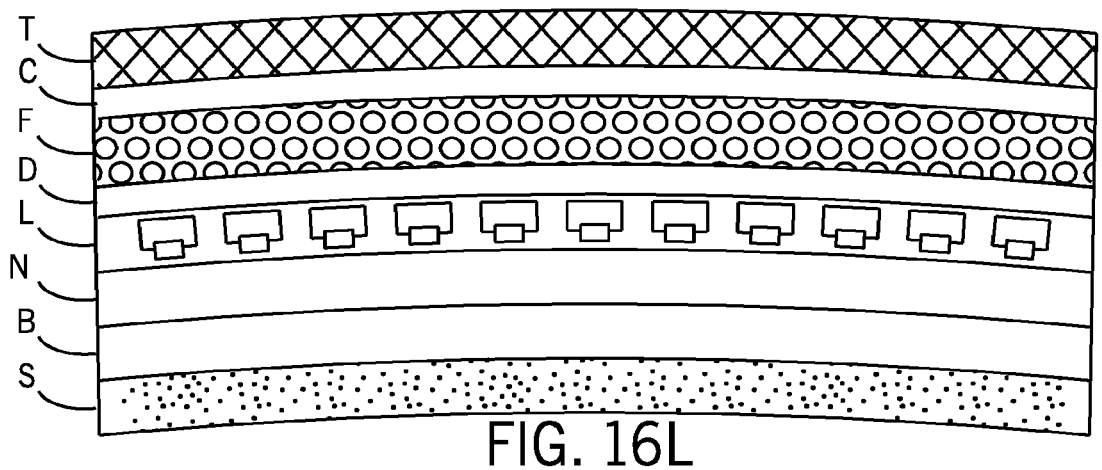
Figure 16M:
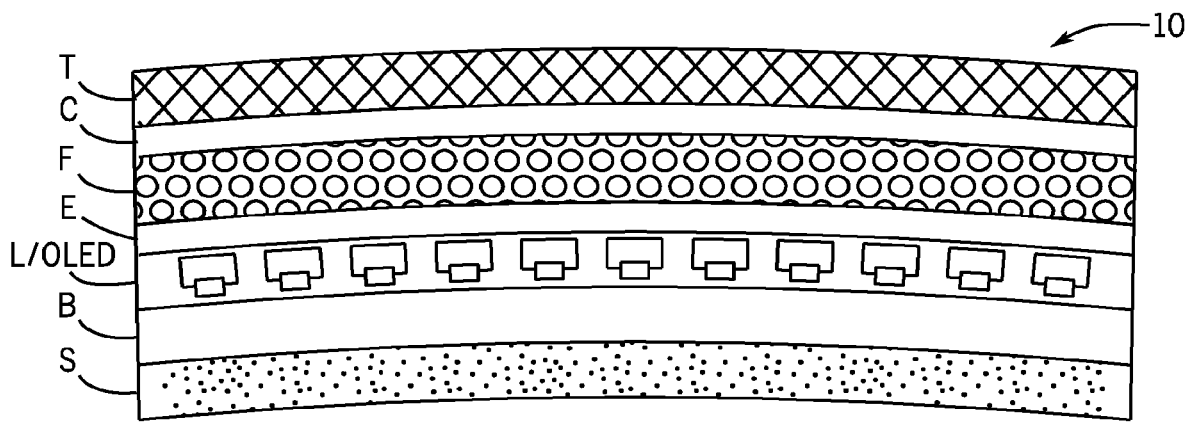
Figure 16N:
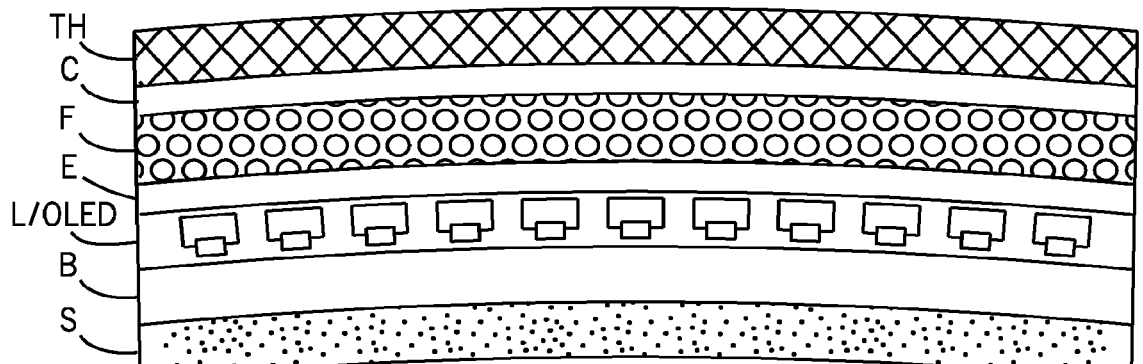
Figure 16O:
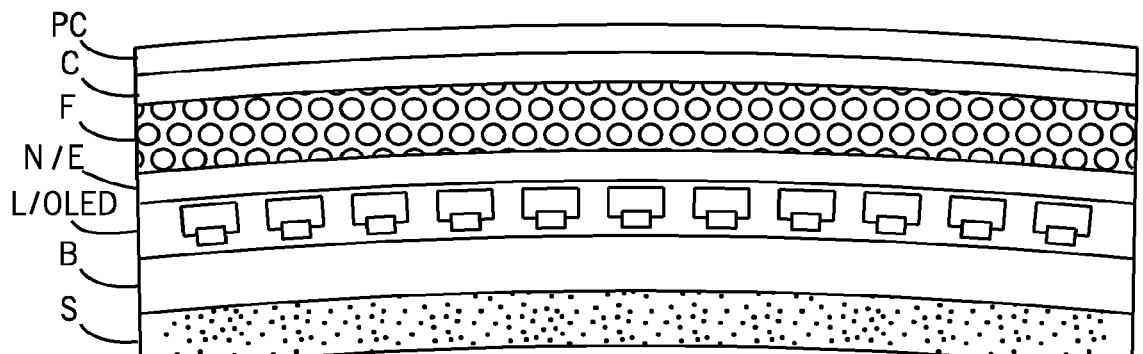
Figure 16P:
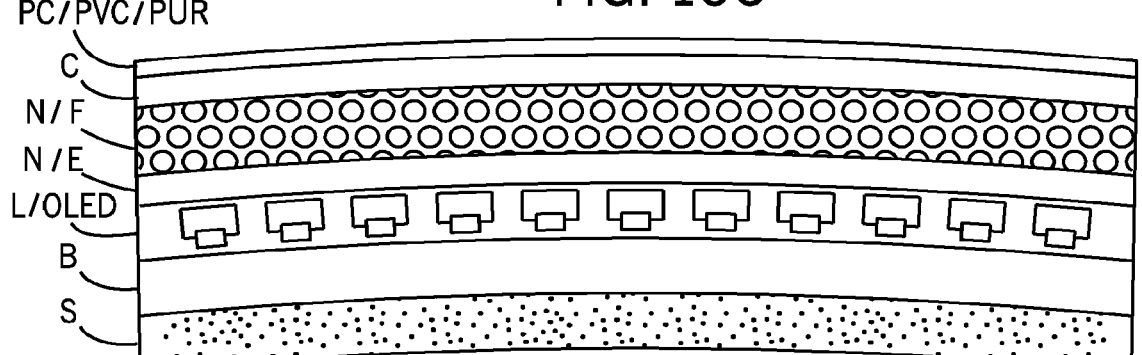
Figure 16Q:
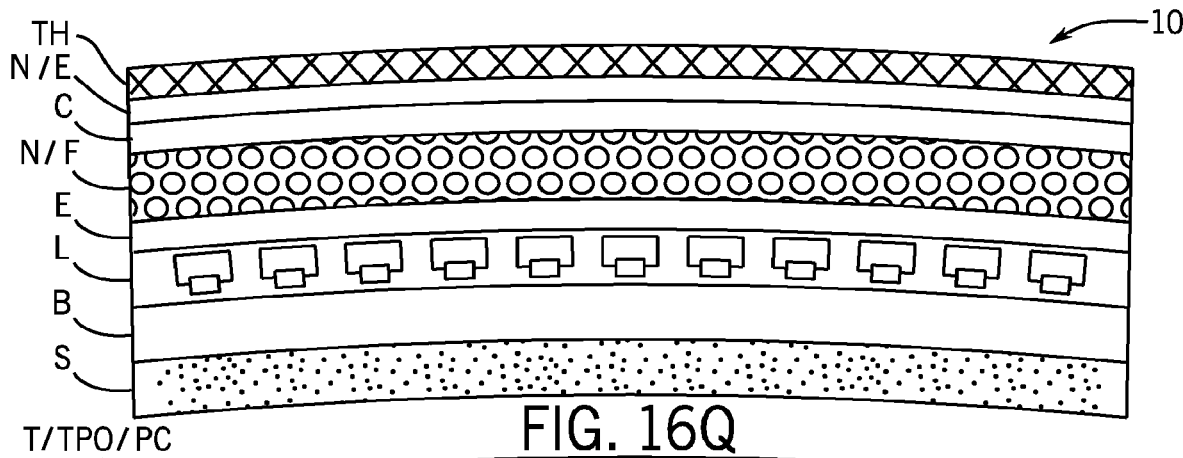
Figure 16R:
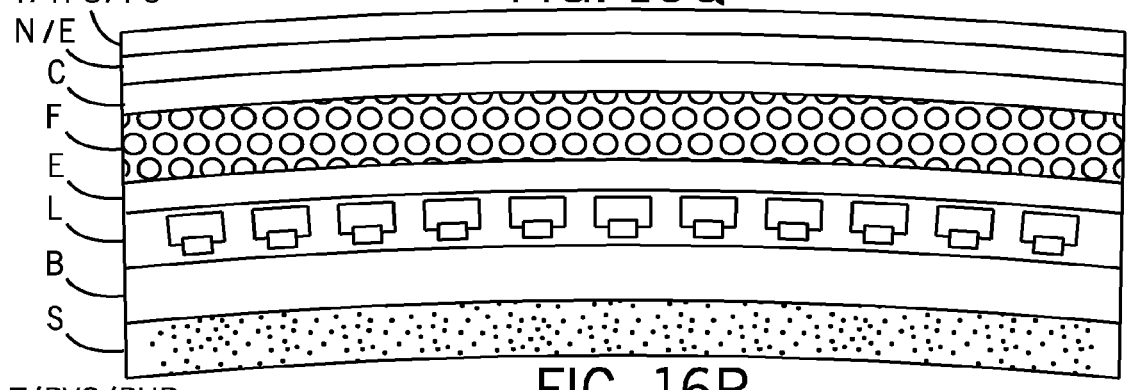
Figure 16S:
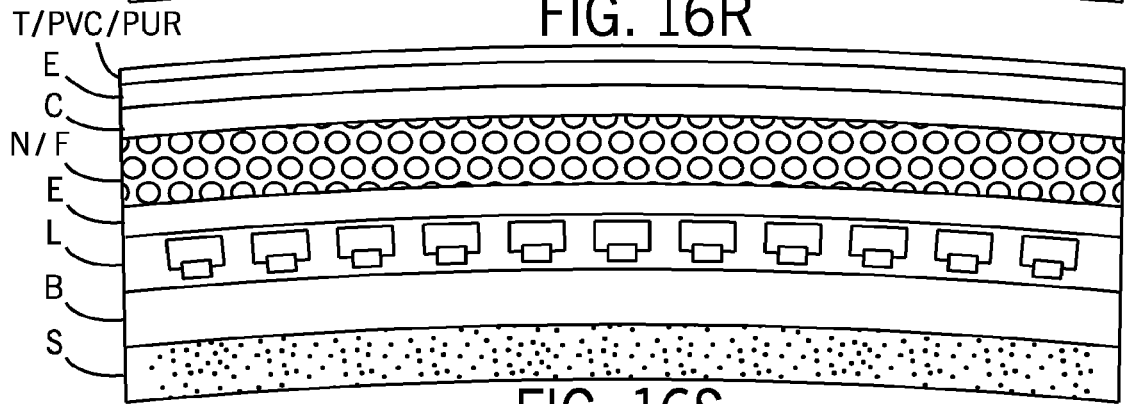
Figure 16T:
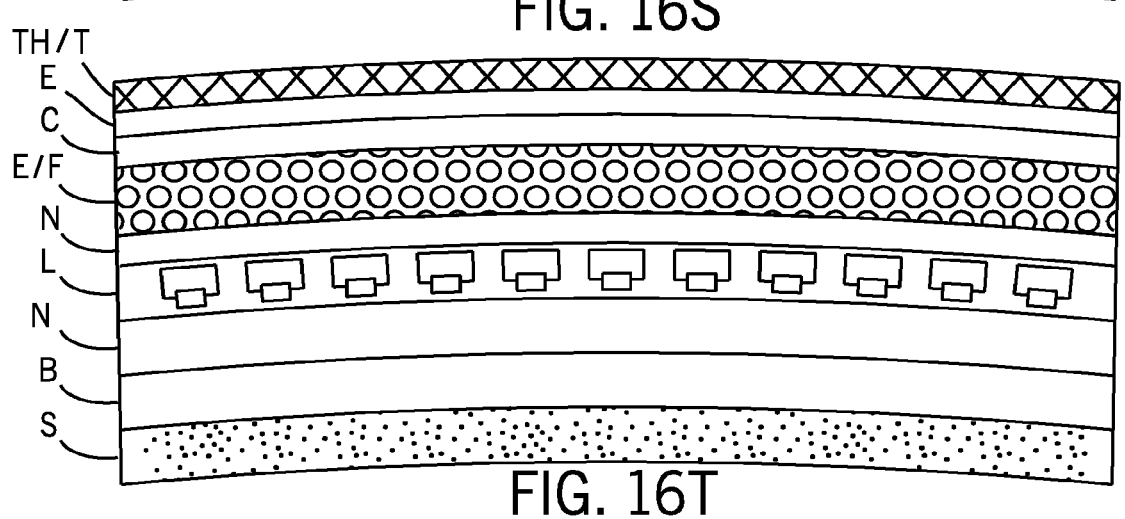

A functional layer may be provided according to an exemplary embodiment as shown in FIGS. 2B and 16A-16T. According to an exemplary embodiment, the functional layer N may be configured to provide certain properties or combinations of functions/properties intended to fulfill design intent and/or requirements including but not limited to thermal management, structural form, spacing/positioning, etc.

According to an exemplary embodiment, the functional layer may be configured for form and fit and function of the composite structure of the vehicle interior component. According to an exemplary embodiment, the functional layer may comprise a developed/designed or an integrated/purchased component (for example) or be constructed of a variety of other types of materials and in a variety of other thicknesses configured to provide the form and fit and function for the composite structure of the vehicle interior component. According to an exemplary embodiment, the functional layer may comprise or be constructed separately or as a composite of multiple materials and/or of treated materials (e.g. coated, painted, backed, treated, multi-layer etc.) for use in a vehicle interior. According to an exemplary embodiment, the functional layer may comprise or be constructed/formed to incorporate one or more other functional layers of the composite (e.g. positioning/spacer layer, diffuser layer, heating layer, cooling layer, etc.)

According to an exemplary embodiment, the functional layer or functional layers may provide the composite structure with functions to support the construction of a visual/tactile physical user interface (e.g. for the human machine interface (HMI)) and may facilitate the interaction between the vehicle occupant and the vehicle through the composite structure of the vehicle interior component (e.g. as functional layer for other layers of the composite structure of the vehicle interior component). See also FIGS. 12A-12H, 13A-13D, 16A-16T and 22A-22E.

According to an exemplary embodiment, the functional layer or functional layer may comprise or be constructed/formed/treated to provide one or more of a variety of features and/or properties such as feel (tactile sensation/feedback, haptic sensation/functionality, firmness, softness, etc.), resilience (e.g. to wear, abrasion, touching, etc.), durability (e.g. to environmental conditions such as heat/cold and humidity, repellence (e.g. to spills/liquids, dirt, etc.), flexibility (e.g. stiffness, etc.), translucence, convenience (e.g. easy to maintain, ease to clean, etc.), recyclability (e.g. material selection for reuse at end of life), uniformity (e.g. visual/physical consistency with other interior components of the vehicle, etc.), thermodynamic performance (e.g. heating and/or cooling), interconnectivity (e.g. integrated with electronic/electrical/data interfaces for other devices and components such as charging and data connection), etc. See e.g. FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 25A-25D and 27. See also FIGS. 13A-13D, 16A-16T and 24.

According to an exemplary embodiment, as shown schematically in the FIGURES, the functional layer may comprise a functional structure/component, grid/array, skin/sheet, form, material construction, etc. to perform an intended function; the functional layer may be configured to provide a haptic effect (e.g. including for interaction with the sensor array) and translucent effect (including for function/interaction with the light array) to facilitate operation of the user interface for the composite structure of the vehicle interior component (e.g. integrating a system/mechanism such as an actuator, transducer, panel, speaker, audio component, electronics/electrical circuit/device, etc.). See FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C, 24, 25A-25D and 27.

According to an exemplary embodiment, the functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing the Peltier effect; (t) diffusion of illumination from the display; (u) monitoring; (v) recording; (w) alerting; (x) messaging. The functional layer may be at least partially integrated with at least one of (a) the cover; (b) the positioning layer; (c) a substrate of the composite structure.

According to an exemplary embodiment the functional layer may comprise and/or perform any of a wide range of functions with any of a variety of selected materials/structures and/or integrated composition/structures.

Exemplary Embodiments

Referring to FIGS. 1A-1B and 2A, a vehicle V is shown including an interior I with a floor console, overhead systems/headliner, an instrument panel/cockpit, doors and seats. According to an exemplary embodiment, interior components/trim components of vehicle V such as consoles (e.g. floor, overhead, etc.), panels (e.g. instrument, door, overhead, side, wall, etc.), structures (frames, pillars, etc.), systems (cockpit, instrument, entertainment, display, overhead, visor, etc.), other surfaces/trim, seats, etc. may include composite structure 10 with display element 20 (e.g. shown as visible covers/surfaces or panels/sections in various configurations and locations for the vehicle interior). See FIGS. 1B and 2A.

As shown schematically according to an exemplary embodiment in FIGS. 2A-2C, a vehicle interior component with a composite structure with cover 10 with display element 20 (e.g. with exterior surface/cover) for an interior/trim component may provide a user interface that may comprise an input/output system (e.g. with sensor/detector of movement and/or touch sensitive layer to function as an input device in a layer arrangement/construction with a display for electronic visual data/information such as from vehicle/other information processing systems). As shown schematically in FIG. 2B, according to an exemplary embodiment the composite structure 10 with display element 20 for a vehicle interior component such as a floor console FC may comprise a cover shown as translucent cover surface T (e.g. fabric, leather, etc.), a functional positioning/spacer layer E (e.g. a foam material), a foam layer F (e.g. a compliant/resilient foam material), a sensor C (e.g. shown as a sensor array/foil), a display L (e.g. shown as a lighting array/LED array); as shown according to an exemplary embodiment in FIG. 2C, a door assembly/panel DP may comprise a composite structure 10 with display element 20 constructed to provide a user interface. See also FIGS. 3A-3T. According to an exemplary embodiment, the composite structure for the vehicle interior component provides a user interface at which a user such as a vehicle occupant may interact by input such as control commands with the vehicle systems and other systems/networks (e.g. information processing system) through detected (e.g. simple touch or multi-touch or hover/movement or other) gestures including by touching the exterior surface of the composite structure (e.g. exterior surface/cover). See e.g. FIGS. 3A-3T, 4A-4F, 5A-5F, 6A-6F, 7A-7F, 8A-8E, 9A-9E, 10A-10F, 11A-11E, 14A-14E and 15A-15C. See also FIGS. 16A-16T, 17A-17O, 24 and 27.

Figure 3A:
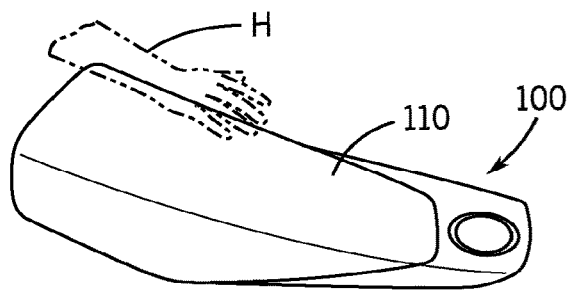
FIGS. 3A to 3T are schematic perspective views of a vehicle interior component shown as a console with a composite structure providing a user interface according to an exemplary embodiment.
Figure 3F:
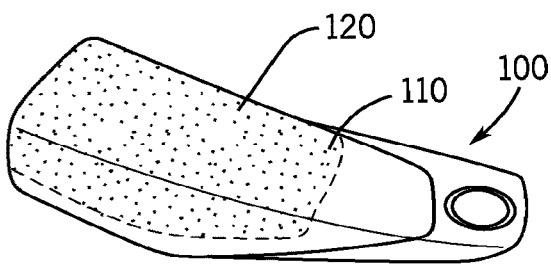
Figure 3B:
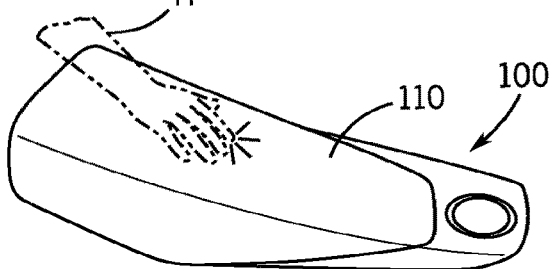
Figure 3G:
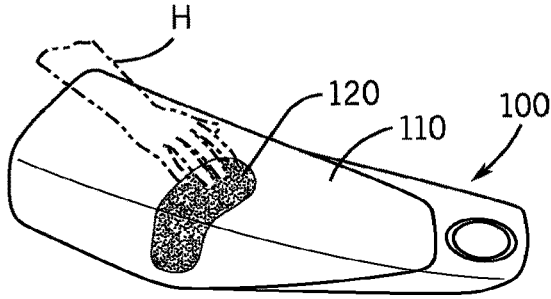
Figure 3C:
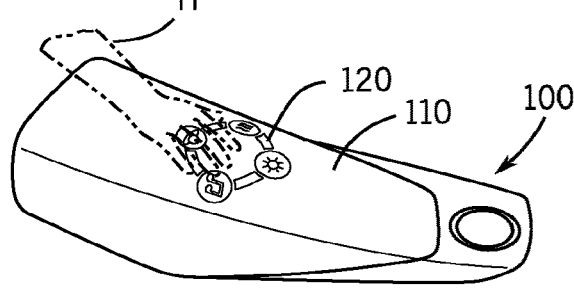
Figure 3H:
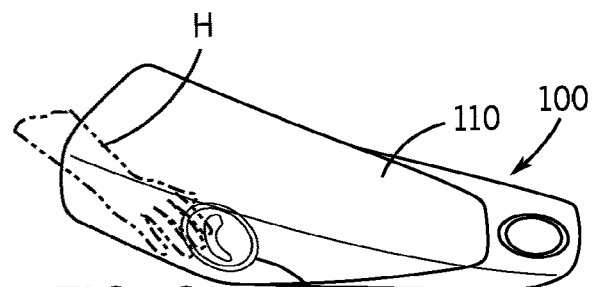
Figure 3D:
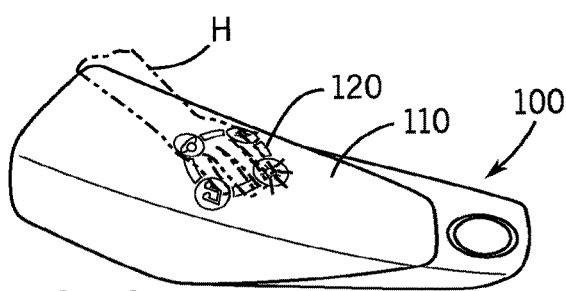
Figure 3I:
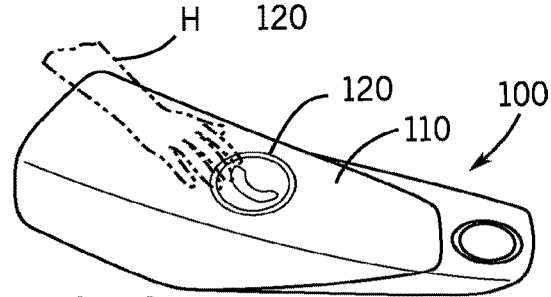
Figure 3E:
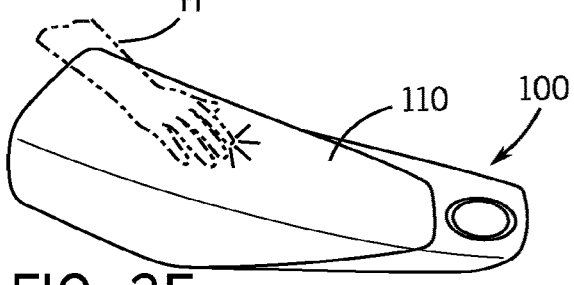
Figure 3J:
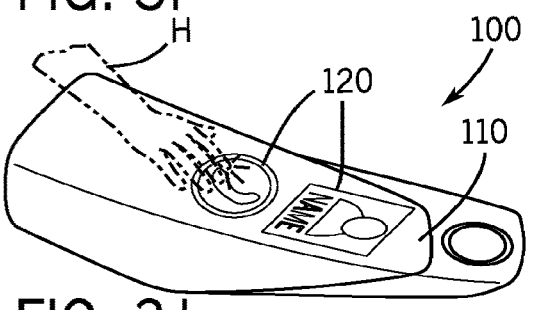
Figure 3K:
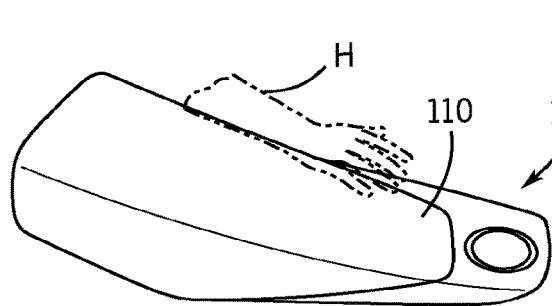
Figure 3P:
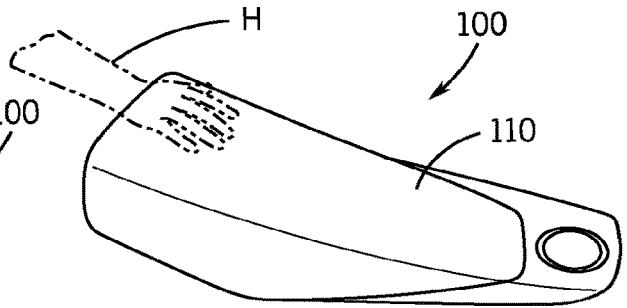
Figure 3L:
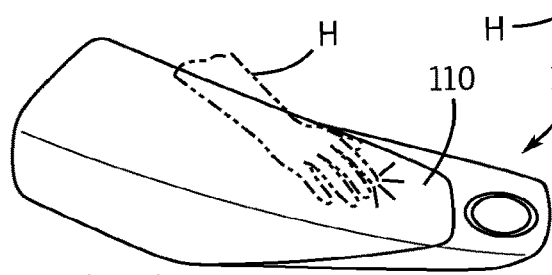
Figure 3Q:
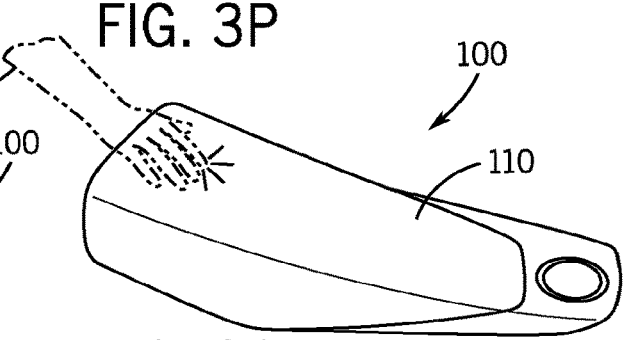
Figure 3M:
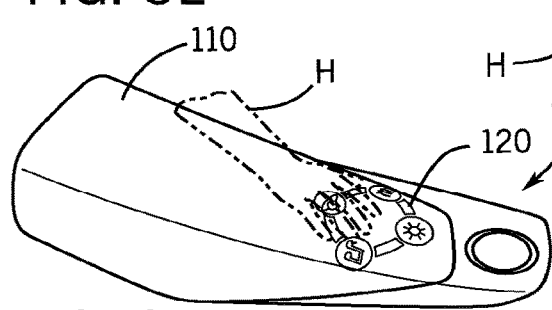
Figure 3R:
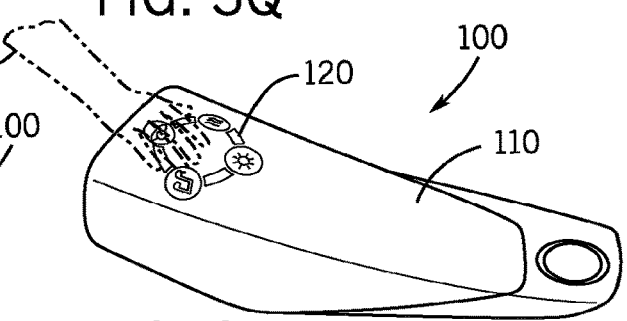
Figure 3N:
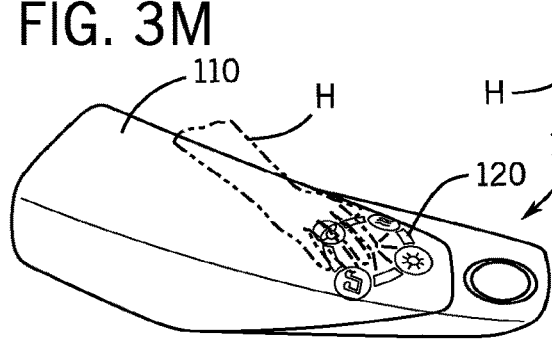
Figure 3S:
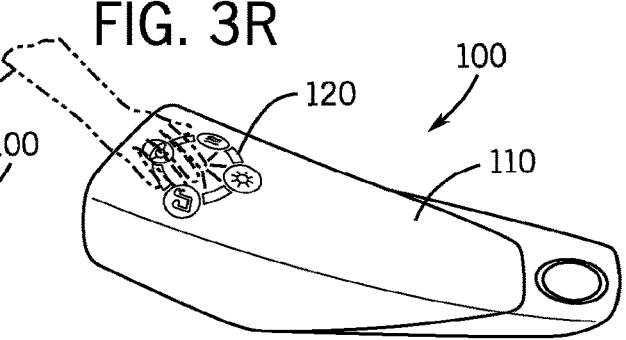
Figure 3O:
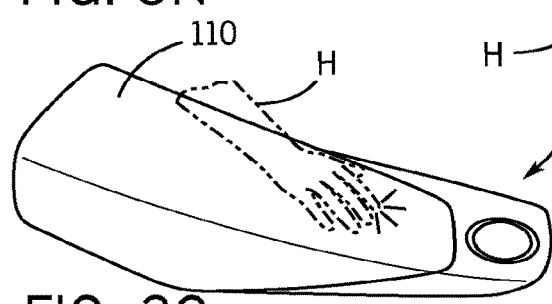
Figure 3T:
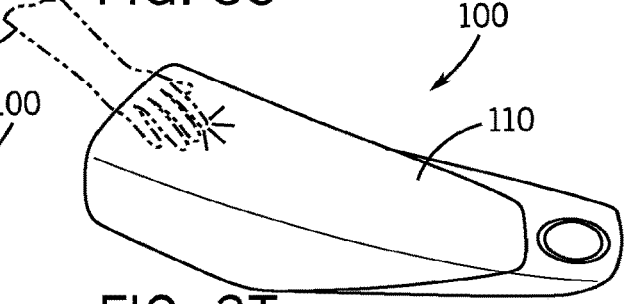
Figure 4A:
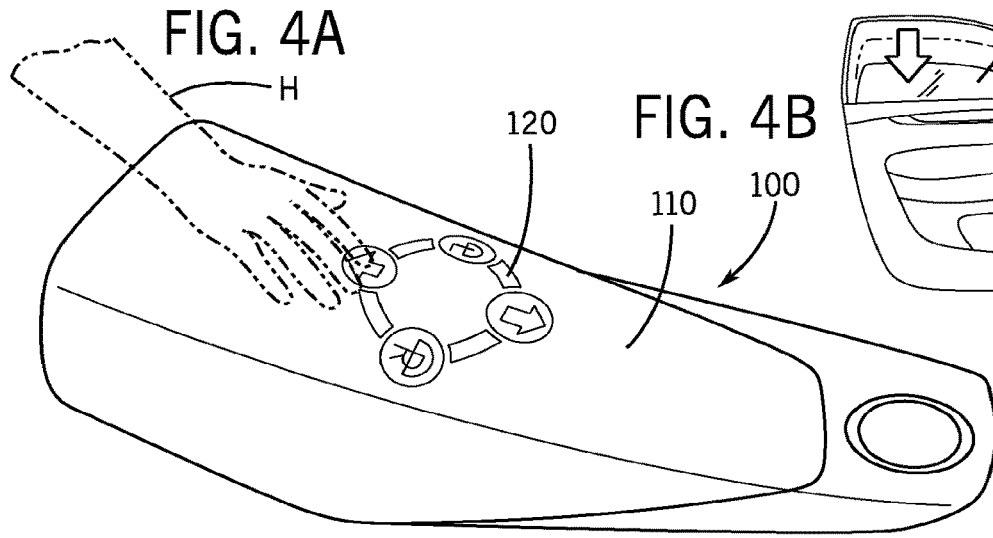
FIGS. 4A and 4C are schematic perspective views of a vehicle interior component shown as a console with the composite structure presenting a user interface system configured as a control panel for a window of a vehicle door according to an exemplary embodiment.
Figure 4B:
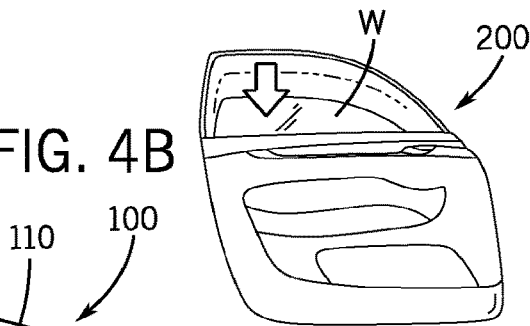
FIGS. 4B and 4D are schematic side views of a door with window operated by the control panel of the user interface system according to an exemplary embodiment.
Figure 4C:
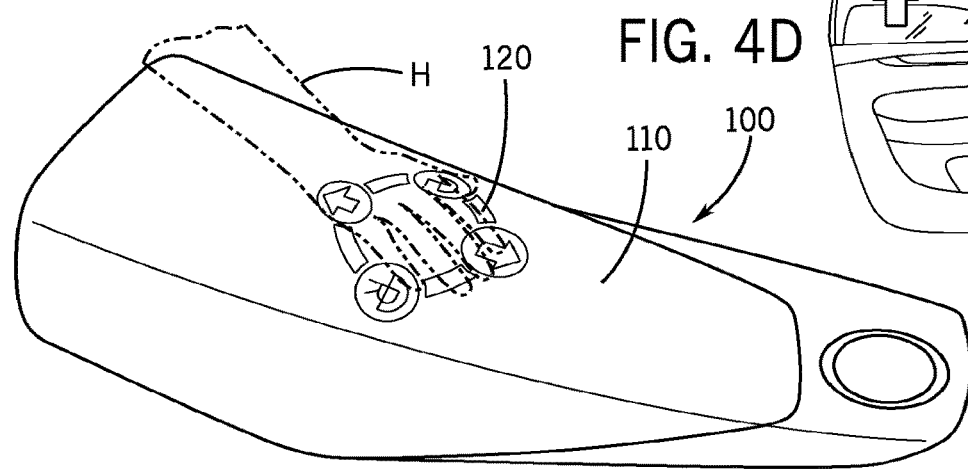
Figure 4D:
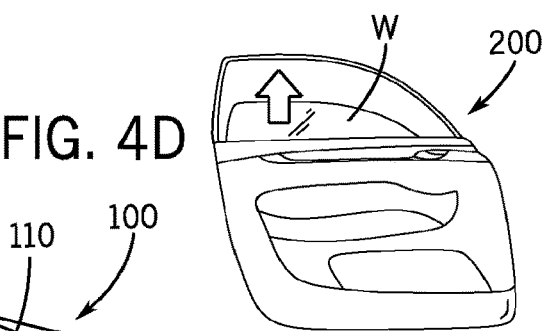
Figure 4E:
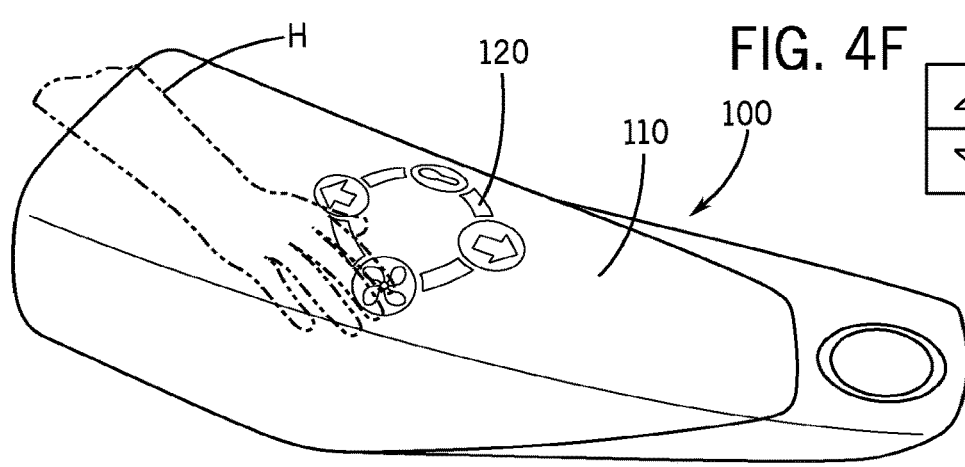
FIG. 4E is a schematic perspective view of a vehicle interior component shown as a console with the composite structure presenting a user interface system configured as a control panel for a heating, ventilating, and air conditioning system of the vehicle according to an exemplary embodiment.
Figure 4F:
FIG. 4F is a schematic front view of a display element for the heating, ventilating, and air conditioning system of the vehicle according to an exemplary embodiment.
Figure 5A:
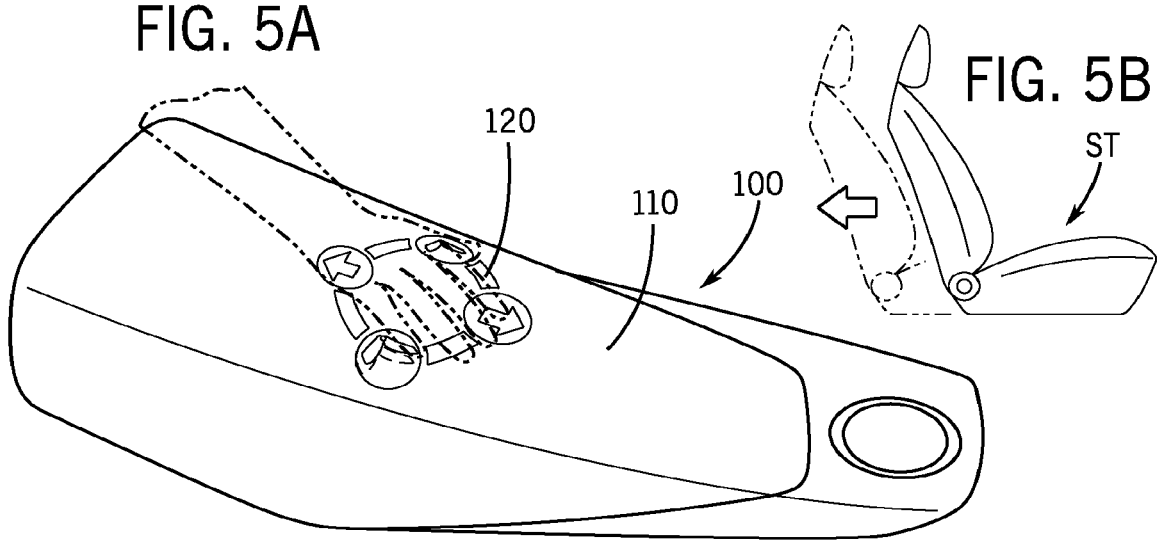
FIGS. 5A, 5C and 5E are schematic perspective views of a vehicle interior component shown as a console with the composite structure presenting a user interface system configured as a control panel to adjust a seat in the vehicle interior to various positions according to an exemplary embodiment.
Figure 5B:
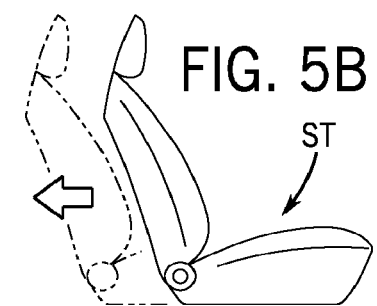
FIGS. 5B, 5D and 5F are schematic side views of the seat of the vehicle interior in various positions according to an exemplary embodiment.
Figure 5C:
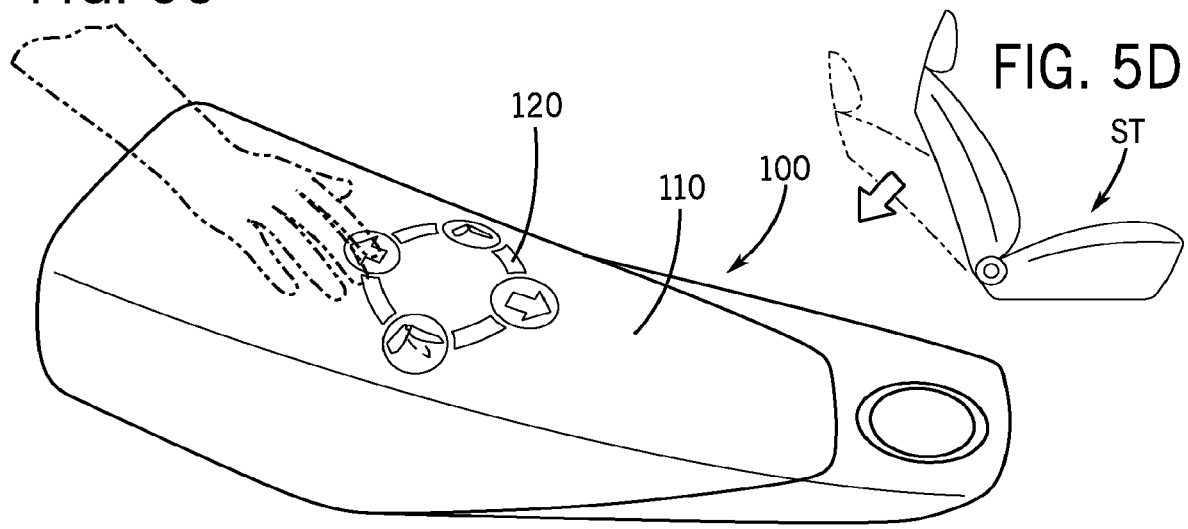
Figure 5D:
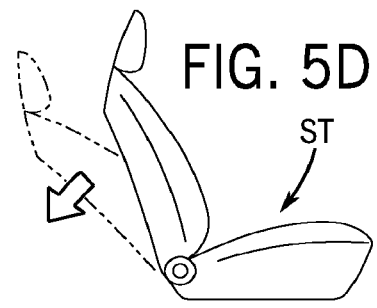
Figure 5E:
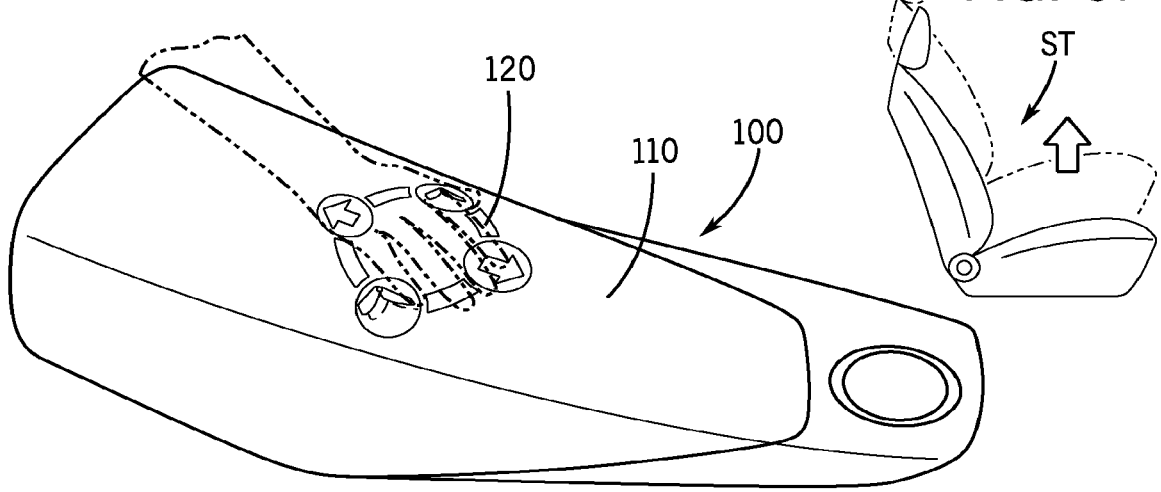
Figure 5F:
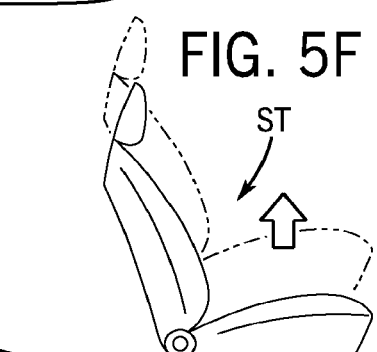

As shown schematically in FIGS. 3A-3T, a console shown as a center console 100 provides a composite structure with cover 110 (e.g. exterior surface on composite structure comprising layers) to provide a user interface with a display comprising display elements that may be positionable/repositionable and configured to interact with user input; according to an exemplary embodiment, the composite structure with cover 110 may comprise a sensor such as a touch sensitive layer (e.g. sensor grid/foil for composite structure). See also FIGS. 8A-8E, 9A-9F, 10A-10E and 15A-15C (implementation for a vehicle interior component such as a panel/door panel).

As shown schematically in FIGS. 3A-3T according to an exemplary embodiment, the vehicle occupant (e.g. the finger of hand H) engages the cover of the composite structure 110 to activate a user interface providing a display shown as an electronic visual display 120. See e.g. FIGS. 26A-26B, 27, 28A-28E and 29A-29B. According to an exemplary embodiment, user interface shown as comprising a display such as an electronic visual display 120 may display a menu or control panel providing various/multiple buttons for operating controlling various/multiple vehicle systems (e.g. features of a vehicle such as opening or closing a window, adjusting the setting of a heating, ventilating, and air conditioning system (HVAC), adjusting the speed of cruise control, operating navigation system, etc.) or for interacting with other systems/networks (e.g. data sources, entertainment, mobile devices, etc.). See also FIGS. 14A-14E, 15C, 25A-25B and 27. As shown schematically in FIGS. 3D and 3E, the vehicle occupant (e.g. the finger of hand H) engages the surface of the cover of the composite structure 110 to deactivate electronic visual display 120. See e.g. FIGS. 26A-26B, 27, 28A-28E and 29A-29B.

As shown schematically according to an exemplary embodiment in FIGS. 3A-3T, a wide variety of visual effects may be presented by the composite structure by activation of the display and illumination through the composite structure to cover/exterior surface 110. As shown in FIGS. 3H through 3J, the user interface from the composite structure may present a display element 120 shown as icon (e.g. for mobile telephone) that may be repositioned (e.g. by drag/drop action) on the cover/exterior surface by a user; as shown in FIG. 3J, data/information from the mobile device/system may be used to interact/interoperate the system within the vehicle (e.g. to conduct a telephone call, use network data communications, connect with data on a mobile device, etc.). As shown schematically in FIGS. 3K-3O and 3P-3T according to an exemplary embodiment, the user interface may be positioned (and repositioned) selectively by a vehicle occupant by contacting the exterior surface/cover of the composite structure at a position so that the user interface display (e.g. display elements such as a menu, icons, symbols, text, graphics, text/image display, etc.) appear at the position (e.g. toward the front of the structure as in FIGS. 3P-3T or toward the back of the structure as in FIGS. 3K-3O); the user may activate the user interface (e.g. switch from sleep/inactive mode to active mode) as indicated in FIGS. 3K and 3P; the user may deactivate the user interface (e.g. switch from active mode to sleep/inactive mode) as indicated in FIGS. 3O and 3T. See also FIGS. 17A-17O, 26A-26B, 27, 28A-28E and 29A-29B.

As shown schematically in the FIGURES, the user interface provided by the composite structure may be configured for interaction with any of a wide variety of vehicle systems and other systems/networks and data (e.g. by presenting a control panel, menu system, buttons, icons, etc.). See e.g. FIGS. 24 and 27. As shown schematically in FIGS. 4A and 4B, the vehicle occupant (e.g. the finger of hand H) may press a button on display of user interface 120 to control a window W of a door 200 to move towards an open position. As shown schematically in FIGS. 4C and 4D, the vehicle occupant (e.g. the finger of hand H) may press a button on display of user interface 120 to control window W of door 200 to move towards a closed position. As shown schematically in FIGS. 4E and 4F, the vehicle occupant (e.g. the finger of hand H) may press a button on display of user interface 120 to control a heating, ventilating, and air conditioning system of the vehicle. As shown schematically in FIGS. 5A and 5B, the vehicle occupant (e.g. the finger of hand H) may press a button on display of user interface 120 to adjust the fore-and-aft position of a seat ST. As shown schematically in FIGS. 5C and 5D, the vehicle occupant (e.g. the finger of hand H) may press a button on display of user interface 120 to adjust the angle of the backrest of seat ST. As shown schematically in FIGS. 5E and 5F, the vehicle occupant (e.g. the finger of hand H) may press a button on display of user interface 120 to adjust the height of seat ST.

Figure 6A:
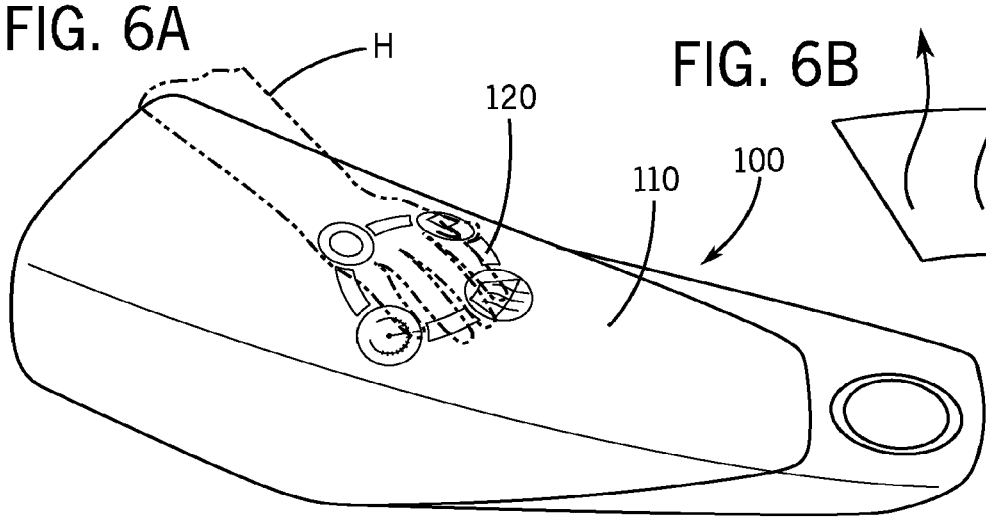
FIGS. 6A, 6C and 6E are schematic perspective views of a vehicle interior component shown as a console with the composite structure presenting a user interface system configured as a control panel for interaction with vehicle systems according to an exemplary embodiment.
Figure 6B:
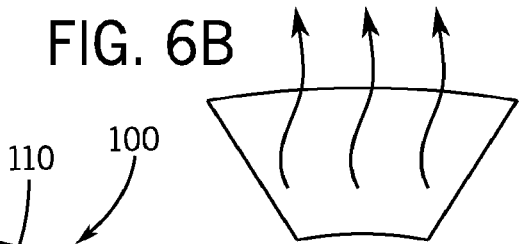
FIGS. 6B, 6D and 6F are schematic front views of display elements for vehicle systems according to an exemplary embodiment.
Figure 6C:
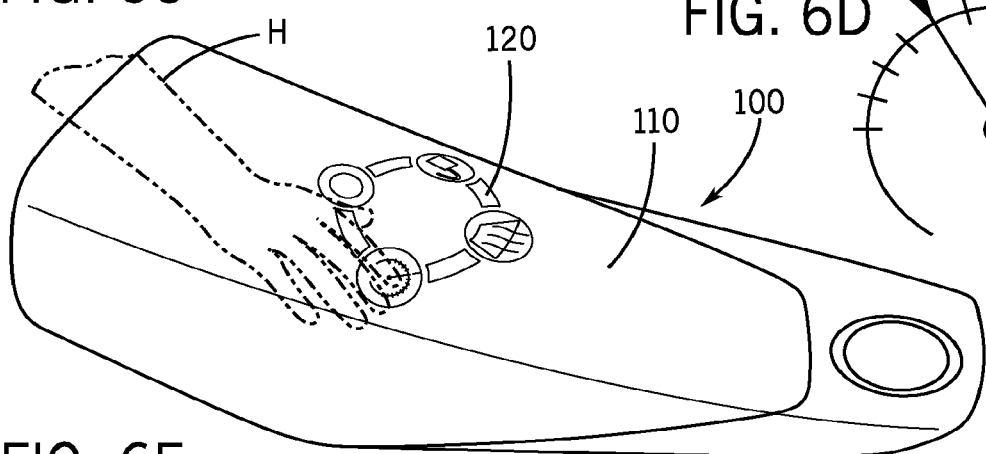
Figure 6D:
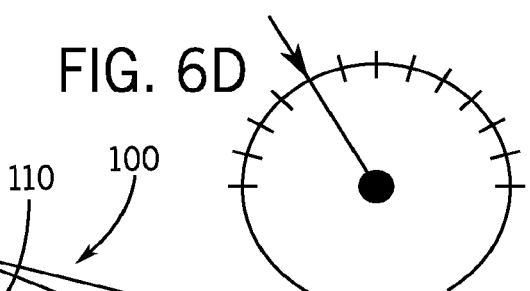
Figure 6E:
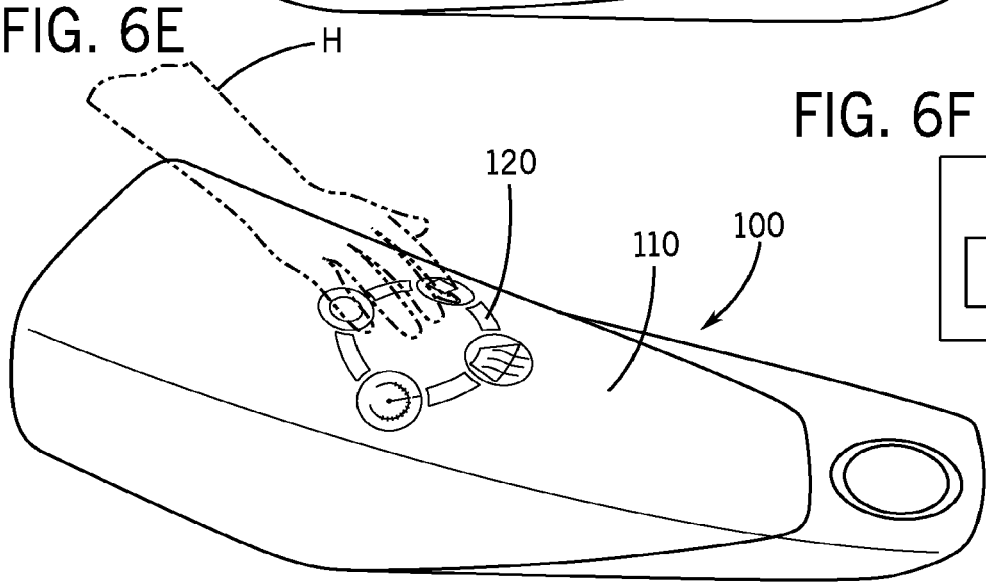
Figure 6F:
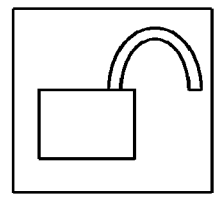

As shown schematically in FIGS. 6A and 6B, the vehicle occupant (e.g. the finger of hand H) may press a button on display of user interface 120 to turn on and off thermal management system such as a front window defroster for the vehicle. As shown schematically in FIGS. 6C and 6D, the vehicle occupant (e.g. the finger of hand H) may press a button on display of user interface 120 to operate an automatic speed control system (e.g. cruise control system, etc.) for the vehicle. As shown schematically in FIGS. 6E and 6F, the vehicle occupant (e.g. the finger of hand H) may press a button on display of user interface 120 to lock and unlock doors of the vehicle.

Figure 7A:
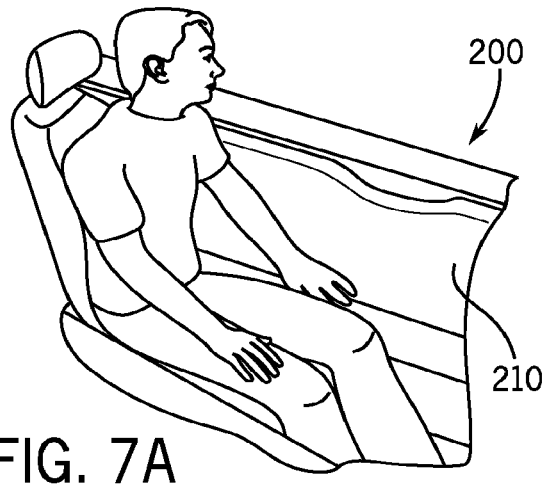
FIGS. 7A to 7F are schematic perspective views of a vehicle interior component shown as a door panel with the composite structure presenting a user interface providing control/interaction and output of lighting effects/levels for the vehicle interior according to an exemplary embodiment.
Figure 7B:
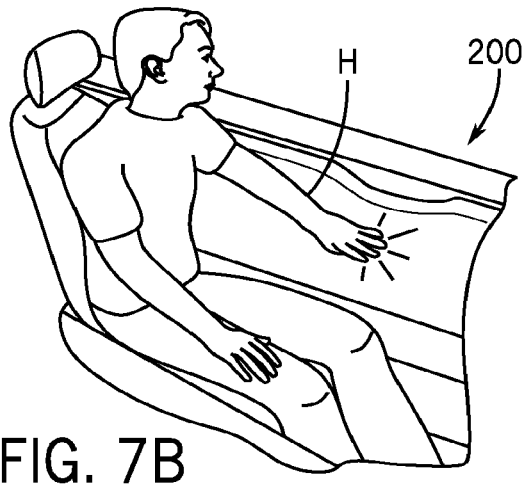
Figure 7C:
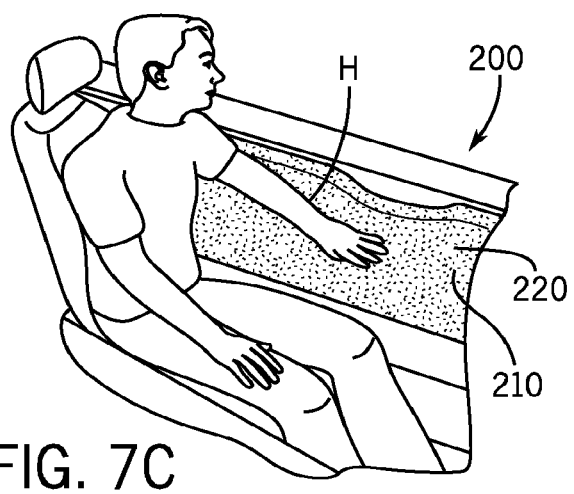
Figure 7D:
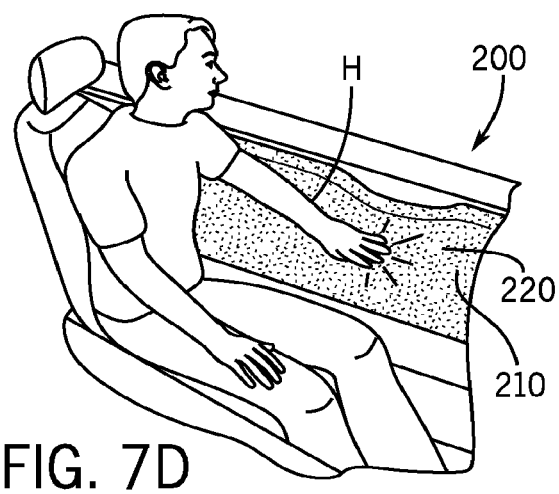
Figure 7E:
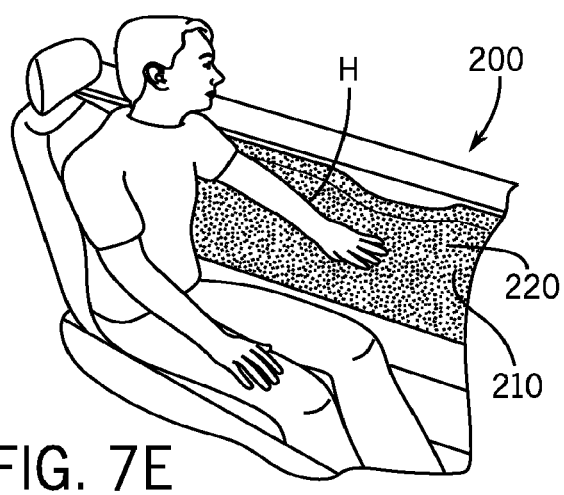
Figure 7F:
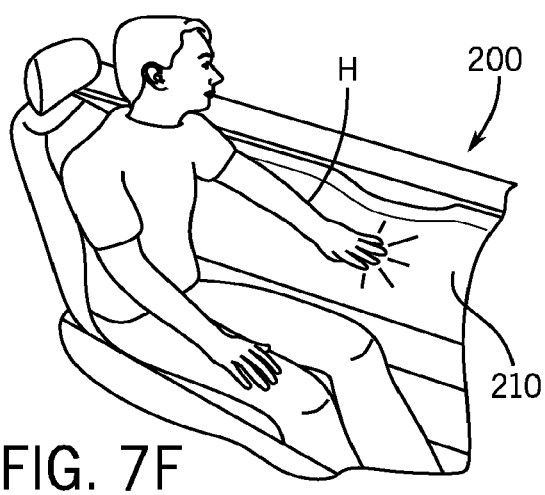
Figure 9A:
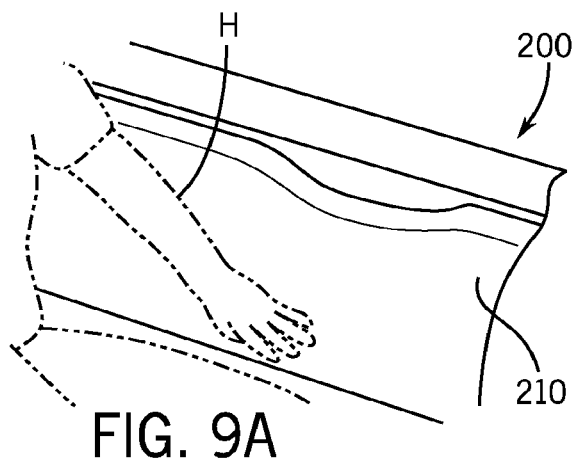
FIGS. 9A to 9E are schematic perspective views of a vehicle interior component shown as a door panel with the composite structure presenting a user interface providing for activation and use and deactivation of a display element shown as a control menu for the vehicle interior according to an exemplary embodiment.
Figure 9B:
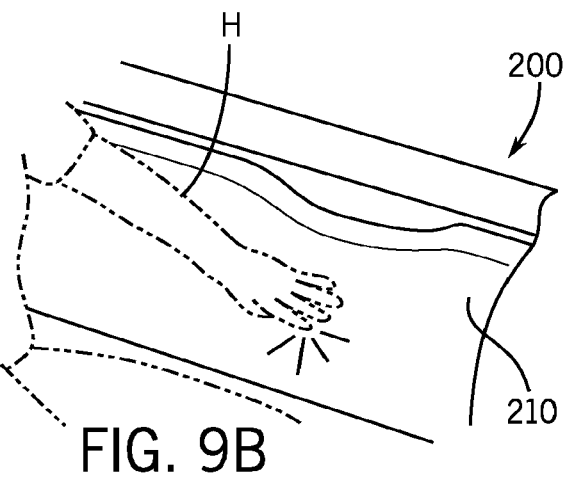
Figure 9C:
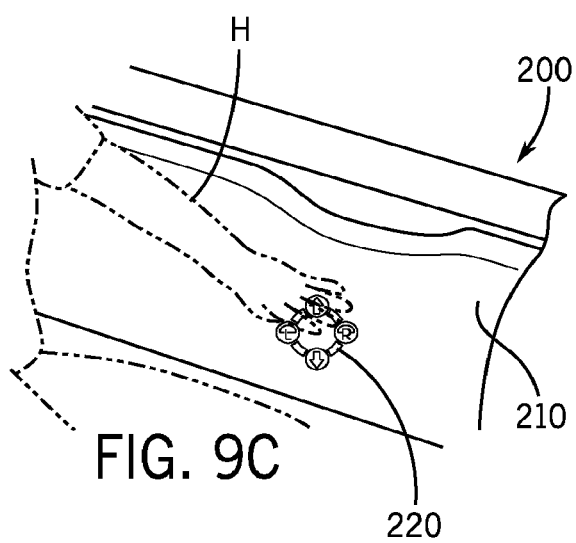
Figure 9D:
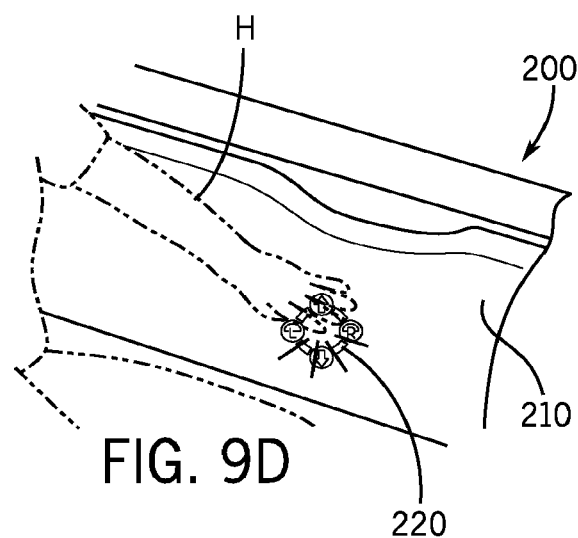
Figure 9E:
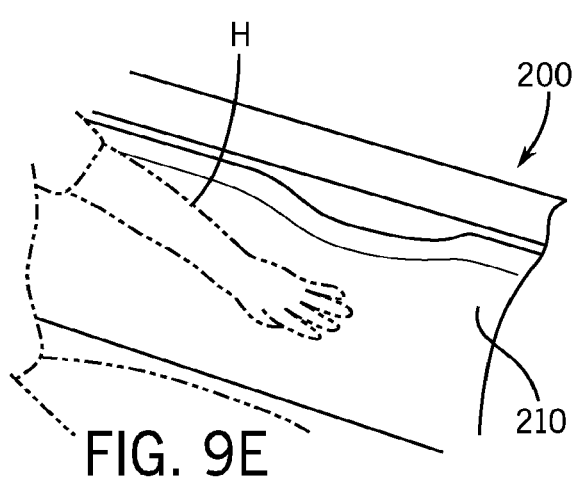

As shown schematically in FIG. 7A, door 200 may provide a composite structure with cover of component structure 210; cover of component structure 210 may present a user interface; the user interface may comprise a contact/touch sensitive interface according to an exemplary embodiment. As shown schematically in FIG. 7B, vehicle occupant (e.g. using hand H) taps cover of component structure 210 to activate the display of user interface within cover of component structure 210. As shown schematically in FIG. 7C, cover of component structure 210 is dimly lit; cover of component structure 210 may provide lighting for the vehicle interior according to an exemplary embodiment. As shown schematically in FIGS. 7D and 7E, vehicle occupant (e.g. using hand H) taps cover of component structure 210 to intensify the lighting for the vehicle interior. As shown schematically in FIG. 7F, vehicle occupant (e.g. using hand H) taps cover of component structure 210 to switch off the lighting on door 200. As shown schematically in FIGS. 8A, 8C and 8D, the composite structure with cover on door 200 may be partially illuminated/lit; the cover of door 200 may be partially illuminated to display various messages (e.g. the temperature setting of the heating, ventilating, and air conditioning system (HVAC), the weather, etc.) See FIG. 8E. As shown schematically in FIG. 8A, the composite structure with cover on door 200 displays a text message. As shown schematically in FIG. 8C, the composite structure with cover on door 200 displays the temperature setting of the heating, ventilating, and air conditioning system (HVAC). As shown schematically in FIG. 8D, the composite structure with cover on door 200 displays the weather information. According to an exemplary embodiment, the display of user interface of door 200 may provide display corresponding to the display of a mobile device. As shown schematically in FIG. 8B, the cover of the composite structure may be illuminated with various intensities according to an exemplary embodiment (e.g. according to purpose, function, ambient conditions, etc.).

As shown schematically in FIGS. 9A to 9E, door 200 may provide a composite structure with cover; composite structure 210 may comprise a sensor such as a touch sensitive layer/panel according to an exemplary embodiment. As shown schematically in FIGS. 9A to 9C, the vehicle occupant (e.g. by finger of hand H) may touch/tap/press on cover of component structure 210 to activate the display of the user interface shown as display of user interface 220 presented at cover of component structure 210. See also FIGS. 26A-26B, 27, 28A-28E and 29A-29B. According to an exemplary embodiment, display of user interface 220 may display multiple buttons/icons for controlling various features of the vehicle (e.g. opening or closing a window, adjusting the setting of a heating, ventilating, and air conditioning system (HVAC), adjusting the speed of cruise control, operating navigation system, etc.). As shown schematically in FIGS. 9D and 9E, the vehicle occupant (e.g. the finger of hand H) may tap cover of component structure 210 to deactivate display of user interface 220. See also FIGS. 26A-26B, 27, 28A-28E and 29A-29B.

As shown schematically in the FIGURES, the user interface of the composite structure may provide a control panel providing control elements such as buttons, icons, etc. for a vehicle occupant to interact with vehicle systems and other systems. See e.g. FIGS. 14A-14E, 15C, 26A-26B, 27, 28A-28E and 29A-29B. As shown schematically in FIGS. 10A and 10B, the vehicle occupant (e.g. the finger of hand H)

may press a button on display of user interface 220 to control window W of door 200 to move towards the open position. As shown schematically in FIGS. 10C and 10D, the vehicle occupant (e.g. the finger of hand H) may press a button on display of user interface 220 to control window W of door 200 to move towards the closed position. As shown schematically in FIGS. 10E and 10F, the vehicle occupant (e.g. the finger of hand H) may press a button on display of user interface 220 to adjust the position of a side view mirror. According to an exemplary embodiment, the visual display may be configured to appear at the location where the finger taps the cover. See e.g. FIGS. 3A-3T and 14A-14E.

Figure 11A:
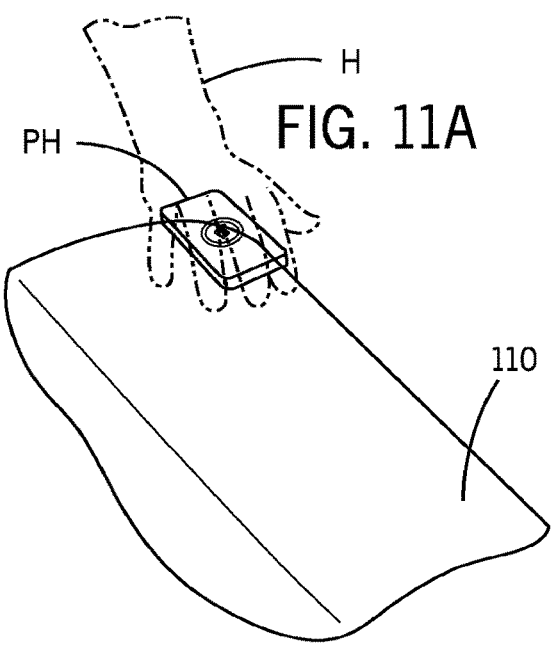
FIGS. 11A to 11E are schematic perspective views a vehicle interior component shown as a console with the composite structure presenting a user interface system configured to charge/interconnect with a mobile device shown as a smart phone according to an exemplary embodiment.
Figure 11B:
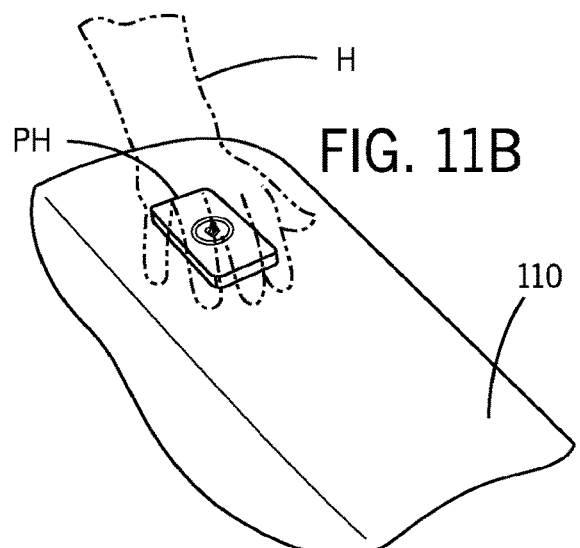
Figure 11C:
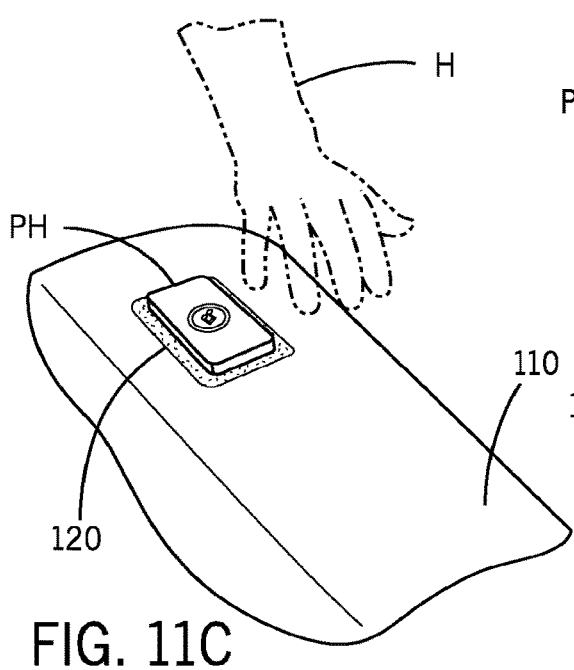
Figure 11D:
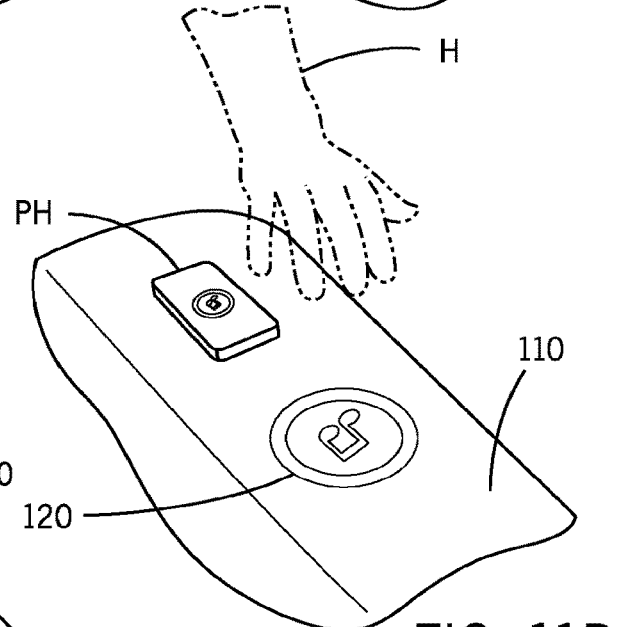
Figure 11F:
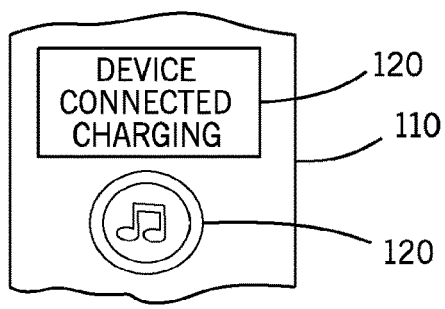
FIG. 11F is a schematic front view of display elements providing information at the user interface of the composite structure of the vehicle interior component according to an exemplary embodiment.
Figure 11E:
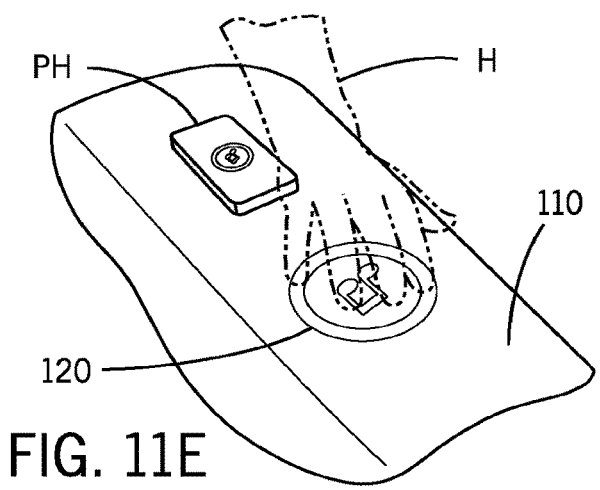

According to an exemplary embodiment as shown in the FIGURES, the user interface may be configured to facilitate use and operation of vehicle systems and other devices/system within a vehicle (e.g. smart phone, tablet, etc.). See e.g. FIGS. 3A-3T, 11A-11F, 24, 26A-26B, 27, 28A-28E and 29A-29B. As shown schematically in FIGS. 11A and 11B, a vehicle occupant/user may place a mobile device (e.g. smart phone, tablet, etc.) shown as a phone PH on center console 100 providing the user interface from the composite structure with cover 110. As shown schematically in FIG. 11C, a vehicle occupant at composite structure for cover 110 (e.g. surface for composite structure) activates user interface 120 to illuminate around phone PH. As shown schematically in FIG. 11D, display of user interface 120 may be configured to display the music interface of phone PH. As indicated schematically in FIG. 11E, vehicle occupant (e.g. using hand H) may slide on cover of composite structure 110 to adjust the volume setting for the music interface; operation may be facilitated by presentation of a control panel/information as indicated in FIG. 11F. See also FIGS. 14A-14E, 15C, 24, 26A-26B, 27, 28A-28E and 29A-29B (menu/flow diagrams of operation of systems at user interface).

As shown schematically in FIGS. 12A and 12B, the composite structure with cover may comprise an arrangement of layers/construction to facilitate implementation of a user interface for the vehicle interior component; for example, a composite structure may comprise a cover/layer T, a layer HS, a layer E, a layer C, a layer F, a layer D, a layer L, an layer B, and a layer S arranged to provide a combined function and fit and form for an application (e.g. vehicle interior). See also FIGS. 2B, 16A-16T and 18A-18E (other arrangements of layers/components of composite structure). According to an exemplary embodiment, layer F is a foam layer; the foam layer may provide comfort for vehicle occupants according to an exemplary embodiment. According to an exemplary embodiment, layer L is a display such as an electronic visual display/lighting element shown as a LED display; layer D may be configured to diffuse the light from the LED display; according to an exemplary embodiment, the size and/or quantity of the LED element may be adapted for various applications. According to an exemplary embodiment, layer S is a substrate or carrier for the cover; according to an exemplary embodiment, a layer B may be configured to bond the LED display to the carrier or substrate (e.g. a glue or bond layer). See generally FIGS. 12A-12E and 16A-16T.

According to an exemplary embodiment, the composite structure with cover may provide a functional layer configured to provide haptic or other user feedback (e.g. audible, tactile, etc.). See FIGS. 16A-16C (showing a functional layer N/HS). According to an exemplary embodiment, the functional layer may comprise other functional systems/components or layers operated by a control system. See also FIGS. 12B and 16A-16E (composite structure with layers including sensor C and display L and functional layer N/HS and control system). According to an exemplary embodiment, sensor C is shown as a touch sensitive layer in the form of a capacitive touch panel (i.e. an input device for an information processing system). According to an exemplary embodiment, the composite structure may also provide a layer for heating the surface of the composite structure (e.g. layer HS shown in FIGS. 12A-12C). According to an exemplary embodiment, layer HS may provide a functional/composite layer with heating coils/resistors configured to heat the cover and/or the vicinity of the cover; layer HS is optional according to an exemplary embodiment. See FIG. 12A. According to an exemplary embodiment, the composite structure may also provide a soft layer (e.g. a foam layer F) for providing comfort for the user. See FIGS. 12A to 12C and 16A to 16C. According to an exemplary embodiment, the exterior/cover surface layer may comprise a cover/textile layer T (e.g. fabric, fiber, etc. or leather/other similar material construction) configured to be transparent or translucent (e.g. a material/sheet or film that is partially transparent/partially opaque, translucent to visible light, etc. to facilitate transmission of visible light from the display (e.g. light-transmissive material)). See e.g. FIGS. 3A-3T, 17A-17O and 23C. As indicated schematically in FIGS. 12A-12C and 16A-16C, the composite structure may be configured to provide a user interface from display L and sensor C at the exterior surface of cover T. As shown schematically in FIGS. 12D and 16D, the user interface may comprise an electronic visual display shown as a LED display panel; as shown schematically in FIG. 16E, the user interface may comprise a sensor shown as sensor array/grid C. According to an exemplary embodiment, layer E a positioning/spacer layer and may be configured to reduce or shield electrical interference (e.g. reduce interference between electronic systems/networks if necessary or useful); layer E may be optional according to an exemplary embodiment.

As shown schematically according to an exemplary embodiment in FIGS. 12B and 16B, the composite structure with user interface system includes a control system; the control system (i.e. an information processing system) is connected to the LED display (layer L), the capacitive touch panel (layer C), and composite layer with heating coils/resistors (layer HS). See FIGS. 16A-16T (composite structure with layers including for sensor C and for display L and with functional layer N/HS and control system).

As indicated schematically according to an exemplary embodiment in FIGS. 1B and 2A-2C, the composite structure providing the user interface may be formed/conformed to fit on and over any of a wide variety of vehicle interior components having any of a wide variety of forms and shapes/contour. See also FIGS. 18A-18D (showing schematically a flexible construction of the composite structure to be contoured/conformed to the form of a base or interior component).

Operation of the User Interface/Composite Structure

According to an exemplary embodiment, operation of vehicle interior component providing a composite structure with a user interface for vehicle systems and other systems/devices and data/network connectivity is shown schematically in FIGS. 24, 26A-26B, 27, 28A-28E and 29A-29B (block and flow diagrams outlining the function and operation at the user interface according to an exemplary embodiment). According to an exemplary embodiment the composite structure may comprise (a) a cover providing an exterior surface; (b) a sensor; (c) a display; the sensor may be configured to detect input from the vehicle occupant at the cover; the display may be configured to provide illumination (such as a display element, menu, image, text, etc.) visible through the translucent cover. See FIGS. 12A-12E, 13A-13D, 16A-16T, 17A-17O and 18A-18D (e.g. showing various composite structure/layer arrangements according to an exemplary embodiment).

According to an exemplary embodiment, a system/method of operating the user interface may comprise the steps of (a) pressing the cover so input can be detected by the sensor; and (b) contacting the cover where input can be detected by the sensor. See FIGS. 17A-17O. See also FIGS. 26A-26B, 27, 28A-28E and 29A-29B. According to an exemplary embodiment as indicated schematically in FIGS. 24 and 27, activation/deactivation and use/operation of the user interface presented by the composite structure of the vehicle interior component for interaction with vehicle systems may be performed by a vehicle occupant according to a system/method with detection of pressure, contact, movement, etc. (see generally FIGS. 3A-3T, 14A-14E, 15C and 25A-25D); according to an exemplary embodiment, pressing the cover/surface may comprise compressing/deforming the composite structure to actuate the user interface (see FIGS. 17J-17K with activation/positioning of illumination at surface of user interface); contacting the cover may operate and/or position a control provided at the user interface (see FIGS. 17L-17M with positioning and dragging/repositioning of illumination at surface of user interface); hovering/movement at the cover surface may operate or position a control provided at user interface (see FIGS. 17N-17O with relocation of illumination at surface of user interface). See generally FIGS. 17A-17O.

Operation of the user interface presented by the composite structure according to an exemplary embodiment is shown in FIGS. 1B, 2A-2C, 3A-3T, 4A-4F, 5A-5F, 6A-6F, 7A-7F, 8A-8E, 9A-9E, 10A-10F, 11A-11E, 14A-14E, 15A-15C. See also FIGS. 24 and 27. As indicated schematically according to an exemplary embodiment, the user interface may be configured for a variety of types of interaction with vehicle systems/other systems including visual display of information/images, audio information/recording, video information/recording, touch/feel/haptic interaction, mobile device connectivity, vehicle system connectivity/control, network/data connectivity (including to external networks such as the internet), ambient/vehicle environment modification and control (e.g. lighting/color, decorative effects, thermal management, etc.), etc. See e.g. FIGS. 1B, 2A-2C, 3A-3T, 4A-4F, 5A-5F, 6A-6F, 7A-7F, 8A-8E, 9A-9E, 10A-10F, 11A-11E, 12C, 14A-14E, 15A-15C, 16A-16T, 17A-17O, 25A-25D and 27. See also FIGS. 23A-23B, 24, 26A-26B, 28A-28E and 29A-29B.

Operation of the user interface presented by the composite structure according to an exemplary embodiment with a menu system as shown in FIGS. 25A-25D is outlined in flow diagrams incorporated into the specification. See FIGS. 26A-26B, 27, 28A-28E and 29A-29B. As indicated schematically according to an exemplary embodiment in FIGS. 26A-26B and 29A-29B, the user interface may comprise a set of interaction options/functions presented at a display element shown as menu system such as interaction heating (e.g. heating/cooling/ventilation system operation and indicators/monitoring for the vehicle interior), interaction lighting (e.g. decorative/ambient and functional/other lighting for the interior), interaction audio (e.g. entertainment system connectivity to present music, etc.), interaction visible environment (e.g. video/display system to present information regarding the environment of the vehicle operation such as camera images/video recorded in real-time, data images/video from storage/streaming from network, map and road/street information such as for navigation or reference, landscape/other ambient imagery, etc.). See also FIGS. 24, 27 and 28A-28E (interaction with menu system).

As indicated generally and schematically in FIGS. 1B, 2A, 24 and 27, according to an exemplary embodiment the user interface presented by display/control elements 20 of the composite structure 10 of the vehicle interior component may constructed (e.g. from layers/materials and components) and may be adapted to facilitate a wide variety of types of interaction with any of a wide variety of vehicle systems and other systems and networks/data. See also FIGS. 2B, 12A-12E, 13A-13D, 16A-16T, 17A-17O, 18A-18D and 19A-19D.

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

What is claimed is:

1. A vehicle interior component configured to provide a user interface for a vehicle occupant in a vehicle comprising vehicle systems comprising:
   a composite structure configured to provide the user interface comprising:
   (a) a cover providing an exterior surface;
   (b) a sensor;
   (c) a display;
   (d) a functional layer;
   (e) a positioning layer separate from the functional layer;
   wherein the cover comprises a layer configured to facilitate transmission of light;
   wherein the sensor is configured to detect input from the vehicle occupant at or adjacent to the exterior surface of the cover;
   wherein the display is configured to provide illumination at least partially visible through the exterior surface of the cover;
   wherein the positioning layer is configured to provide separation between the cover and the display;
   wherein the positioning layer comprises at least one of (a) a spacer; (b) a flexible spacer; (c) a foam material; (d) polyurethane; (e) a spacer material;
   wherein the user interface is configured to facilitate interaction with the vehicle occupant;
   so that operation of the user interface for the vehicle occupant comprises (a) output from illumination from the display through the positioning layer and through the layer of the cover configured to facilitate transmission of light to the exterior surface of the cover and (b) input detected by the sensor at or adjacent to the exterior surface of the cover.

2. The component of claim 1 wherein the composite structure comprises: (a) the cover; (b) the functional layer; (c) the sensor; (d) the positioning layer; (e) the display; (f) a substrate.

3. The component of claim 2 wherein the functional layer comprises a diffuser and the positioning layer comprises a foam material.

4. The component of claim 1 wherein the cover comprises at least one of (a) textile; (b) fabric; (c) fiber mesh; (d) leather; (e) grain surface; (f) synthetic fibers; (g) natural fibers; (h) artificial leather; (i) polyester; (j) synthetic material; (k) fabric sheet; (l) upholstered material; (m) a fleece material; (n) a woven material; (o) a non-woven material; (p) a sheet material; (q) a perforated material; (r) a composite of multiple fiber materials; (s) a translucent material; (t) a resilient material; (u) a leather material configured to facilitate the transmission of light; (v) a material that is partially transparent and partially opaque; (w) a layer configured to facilitate transmission of visible light; (x) a surface material perforated to improve the visibility of light from the display.

5. The component of claim 1 wherein the cover comprises a light-transmissive cover comprising at least one of (a) film; (b) resin; (c) polycarbonate; (d) polyurethane; (e) polyvinyl material; (f) TPO; (g) a poly material; (h) a poly film; (i) a composite of multiple plastic materials; (j) a composite of multiple materials; (k) a composite of fiber material; (l) natural material; (m) metal; (n) a perforated material; (o) a translucent layer.

6. The component of claim 1 wherein the functional layer is configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing Peltier effect; (t) diffusion of illumination from the display; (u) monitoring; (v) recording; (w) alerting; (x) messaging; (y) light guiding; (z) flexibility.

7. The component of claim 1 wherein the positioning layer is configured to retain positioning within the composite structure for operation of the sensor from input from the vehicle occupant.

8. The component of claim 1 wherein the user interface is configured so that input from the vehicle occupant at the exterior surface of the cover is detected by the sensor.

9. The component of claim 1 wherein the user interface is configured so that output from the display is presented at least partially through the exterior surface of the cover.

10. The component of claim 1 wherein the composite structure is configured in a contoured shape.

11. The component of claim 1 wherein the composite structure comprises a substrate.

12. The component of claim 1 comprising at least one of (a) a trim component; (b) a panel; (c) a door panel; (d) an instrument panel; (e) a surface; (f) a console; (g) a base.

13. The component of claim 1 further comprising a control system configured to connect to vehicle systems; wherein the control system is configured to facilitate operation by the vehicle occupant for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant.

14. The component of claim 1 wherein the user interface is configured for interaction with a vehicle occupant by at least one of (a) touch at the exterior surface of the cover detected by the sensor or (b) gesture adjacent to the exterior surface of the cover detected by the sensor.

15. The component of claim 1 wherein the sensor comprises at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel.

16. The component of claim 1 wherein the display comprises at least one of (a) an array; (b) a grid; (c) a panel; (d) a display screen; (e) a flexible panel; (f) a lighting array; (g) a lighting device array; (h) a light-emitting device array; (i) an LED array; (j) a flexible LED array; (k) an OLED array; (l) a flexible LED matrix; (m) a flexible sheet.

17. The component of claim 1 wherein the composite structure comprises a composite surface; and wherein the cover comprises an at least partially translucent cover; wherein illumination from the display at the exterior surface of the composite structure comprises visible light transmitted through the functional layer and through the at least partially translucent cover.

18. A trim component for a vehicle interior configured to provide a user interface for a vehicle occupant in a vehicle comprising vehicle systems comprising:
   a composite structure configured to provide the user interface comprising:
   (a) a cover providing an exterior surface;
   (b) a sensor;
   (c) a display; and (d) a functional layer;

wherein the cover comprises a light-transmissive layer;

wherein the sensor is configured to detect input from the vehicle occupant at or adjacent to the exterior surface of the cover;

wherein the display comprises a panel configured to provide illumination at least partially visible through the functional layer and the exterior surface of the cover;

wherein the functional layer is configured to provide separation between the cover and the display;

wherein the sensor is configured to detect input from the vehicle occupant at or adjacent to the exterior surface of the cover from at least one of (a) touch; (b) pressure; (c) proximity; (d) movement; (e) gesture; (f) positioning;

wherein the user interface is configured to facilitate interaction with the vehicle occupant;

so that operation of the user interface for the vehicle occupant comprises (a) output from illumination from the display through the functional layer and through the light-transmissive layer of the cover to the exterior surface of the cover and (b) input detected by the sensor at or adjacent to the exterior surface of the cover.

19. The component of claim 18 wherein the functional layer comprises a first functional layer and a second functional layer; wherein the first functional layer comprises a functional layer configured for diffusion of illumination from the display and the second functional layer comprises a positioning layer.

20. The component of claim 19 wherein the positioning layer comprises at least one of (a) a spacer; (b) a flexible spacer; (c) a spacer fabric; (d) a fabric material; (e) a foam material; (f) a plastic material; (g) a woven material; (h) a fiber material; (i) fabric; (j) polyurethane; (k) a spacer material.

21. The component of claim 18 wherein the composite structure comprises: (a) the cover; (b) the functional layer; (c) the sensor; (d) a positioning layer; (e) the display; (f) a substrate; wherein the functional layer comprises a diffuser and the positioning layer comprises at least one of (a) a foam material or (b) a spacer fabric.

22. The component of claim 18 wherein the composite structure further comprises a foam layer under the cover.

23. The component of claim 18 wherein the user interface comprises a display element from illumination from the display that is configured to be selectively positioned on the exterior surface of the cover; and wherein the display element of the user interface comprises at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image; (m) an image element selectively positionable on the exterior surface of the cover by interaction with the vehicle occupant.

24. The component of claim 18 wherein the display element of the user interface is configured to be positioned on the exterior surface of the cover (a) contacting of the exterior surface of the cover at a position where the display element is to be displayed when the display element is not displayed; (b) contacting the exterior surface of the cover where the display element is displayed and dragging the display element along the exterior surface of the cover to a position where the display element is to be displayed.

25. The component of claim 18 wherein the user interface is configured (a) to be activated for operation by compressing the cover toward the sensor; (b) to be operated by contacting the exterior surface within a distance where input can be detected by the sensor; or (c) to be operated by movement directed by the vehicle occupant above the exterior surface of the cover within a distance where input can be detected by the sensor.

26. The component of claim 18 wherein the cover comprises at least one of: (a) textile; (b) fabric; (c) fiber mesh; (d) leather; (e) grain surface; (f) synthetic fibers; (g) natural fibers; (h) artificial leather; (i) polyester; (j) synthetic material; (k) fabric sheet; (l) upholstered material; (m) a fleece material; (n) a woven material; (o) a non-woven material; (p) a sheet material; (q) a perforated material; (r) a composite of multiple fiber materials; (s) a translucent material; (t) a resilient material; (u) a leather material configured to facilitate the transmission of light; (v) a material that is partially transparent and partially opaque; (w) a layer configured to facilitate transmission of visible light; (x) a surface material perforated to improve the visibility of light from the display; (y) film; (z) resin; (aa) polycarbonate; (bb) polyurethane; (cc) polyvinyl material; (dd) TPO; (ee) a poly material; (ff) a poly film; (gg) a composite of multiple plastic materials; (hh) a translucent layer; (ii) a composite of multiple materials; (jj) a composite of fiber material; (kk) natural material; (ll) metal; (mm) a perforated material.

27. A method of operating a trim component for a vehicle interior comprising a composite structure comprising a cover with an exterior surface and at least one functional layer and providing a sensor and a display configured to provide a user interface for a vehicle occupant in a vehicle with vehicle systems comprising the steps of:

(a) pressing the cover toward the sensor to a distance where input can be detected by the sensor; and (b) contacting the exterior surface within a distance where input can be detected by the sensor;

wherein the cover comprises a light-transmissive layer configured to facilitate transmission of light;

wherein the sensor is configured to detect input from the vehicle occupant at or adjacent to the exterior surface of the cover from at least one of (a) touch; (b) pressure; (c) proximity; (d) movement; (e) gesture; (f) positioning;

wherein the display is configured to provide illumination at least partially visible through the exterior surface of the cover;

wherein the user interface is configured to facilitate interaction with the vehicle occupant;

wherein operation of the user interface for the vehicle occupant comprises (a) output from illumination from the display through the at least one functional layer and through the cover comprising the light-transmissive layer to the exterior surface of the cover and (b) input detected by the sensor at or adjacent to the exterior surface of the cover;

wherein the at least one functional layer comprises a first functional layer configured for diffusion of illumination from the display and a second functional layer separate from the first functional layer configured as a positioning layer;

wherein the second functional layer comprises a foam material configured to provide separation between the cover and the display;

wherein the second functional layer comprises a light-transmissive layer configured to facilitate transmission of illumination from the display to the exterior surface of the cover;

wherein the composite structure comprises (a) the cover comprising the light-transmissive layer; (b) the first functional layer configured for diffusion of illumination from the display; (c) the sensor; (d) the second functional layer comprising the positioning layer configured to provide separation between the cover and the display and to facilitate transmission of illumination from the display to the exterior surface of the cover; (e) the display configured to provide illumination at least partially visible through the exterior surface of the cover; (f) a substrate.

28. The method of claim 27 wherein the step of pressing the cover toward the sensor comprises compressing the cover toward the sensor to a first threshold distance where input can be detected by the sensor to actuate the user interface; and wherein the step of contacting the exterior surface comprises contact within a second threshold distance where input can be detected by the sensor to operate and/or to position the user interface.

29. The method of claim 28 wherein the step of contacting the exterior surface within the second threshold distance does not require deformation of the composite structure.

30. The method of claim 28 wherein the step of pressing the cover toward the sensor comprises deforming the composite structure at least partially.

31. The method of claim 27 further comprising the step of (c) movement at or adjacent the exterior surface detected as input by the sensor.

32. The method of claim 27 wherein the display is configured to display at least one of (a) data; (b) information; (c) vehicle system information; (d) an input panel; (e) a menu system; (f) an output panel; (g) an image; (h) lighting.

33. The method of claim 27 wherein the positioning layer comprises at least one of: (a) a spacer; (b) a flexible spacer; (c) a spacer fabric; (d) a fabric material; (e) a foam material; (f) a plastic material; (g) a woven material; (h) a fiber material; (i) fabric; (j) polyurethane; or (k) a spacer material.

34. The method of claim 27 wherein the cover comprises at least one of (a) textile; (b) fabric; (c) fiber mesh; (d) leather; (e) grain surface; (f) synthetic fibers; (g) natural fibers; (h) artificial leather; (i) polyester; (j) synthetic material; (k) fabric sheet; (l) upholstered material; (m) a fleece material; (n) a woven material; (o) a non-woven material; (p) a sheet material; (q) a perforated material; (r) a composite of multiple fiber materials; (s) a translucent material; (t) a resilient material; (u) a leather material configured to facilitate the transmission of light; (v) a material that is partially transparent and partially opaque; (w) a layer configured to facilitate transmission of visible light; (x) a surface material perforated to improve the visibility of light from the display; (y) film; (z) resin; (aa) polycarbonate; (bb) polyurethane; (cc) polyvinyl material; (dd) TPO; (ee) a poly material; (ff) a poly film; (gg) a composite of multiple plastic materials; (hh) a translucent layer; (ii) a composite of multiple materials; (jj) a composite of fiber material; (kk) natural material; (ll) metal; (mm) a perforated material.

* * * * *